(12) United States Patent
Yamazaki et al.

(10) Patent No.: US 8,558,236 B2
(45) Date of Patent: Oct. 15, 2013

(54) SEMICONDUCTOR DEVICE

(75) Inventors: Shunpei Yamazaki, Setagaya (JP); Hidekazu Miyairi, Isehara (JP); Yasuhiro Jinbo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/196,926

(22) Filed: Aug. 3, 2011

(65) Prior Publication Data

US 2011/0284856 A1 Nov. 24, 2011

Related U.S. Application Data

(62) Division of application No. 12/325,439, filed on Dec. 1, 2008, now Pat. No. 7,994,502.

(30) Foreign Application Priority Data

Dec. 3, 2007 (JP) ................................. 2007-312933
Dec. 28, 2007 (JP) ................................. 2007-339412

(51) Int. Cl.
*H01L 29/786* (2006.01)

(52) U.S. Cl.
USPC ........................................................ 257/59

(58) Field of Classification Search
USPC ................... 257/52, 57, 59, 72, 66, E29.003, 257/E33.003, E33.004, E29.291, E29.294; 438/59, 149–160; 349/43, 46, 129, 349/141, 143, 160
See application file for complete search history.

(56) References Cited

U.S. PATENT DOCUMENTS

| 4,409,134 A | 10/1983 | Yamazaki |
| 5,101,242 A | 3/1992 | Ikeda et al. |
| 5,221,631 A | 6/1993 | Ikeda et al. |
| 5,313,075 A | 5/1994 | Zhang et al. |

(Continued)

FOREIGN PATENT DOCUMENTS

| CN | 101078843 | 11/2007 |
| CN | 101145561 | 3/2008 |

(Continued)

OTHER PUBLICATIONS

Chinese Office Action (Application No. 200810183704.1) Dated Nov. 15, 2011.

*Primary Examiner* — Marcos D. Pizarro
*Assistant Examiner* — Sue Tang
(74) *Attorney, Agent, or Firm* — Eric J. Robinson; Robinson Intellectual Property Law Office, P.C.

(57) ABSTRACT

An object is to reduce off-current of a thin film transistor. Another object is to improve electric characteristics of a thin film transistor. Further, it is still another object to improve image quality of a display device using the thin film transistor. An aspect of the present invention is a thin film transistor including a semiconductor film formed over a gate electrode and in an inner region of the gate electrode which does not reach an end portion of the gate electrode, with a gate insulating film interposed therebetween, a film covering at least a side surface of the semiconductor film, and a pair of wirings over the film covering the side surface of the semiconductor film; in which an impurity element serving as a donor is added to the semiconductor film.

30 Claims, 41 Drawing Sheets

(56) References Cited

U.S. PATENT DOCUMENTS

| | | |
|---|---|---|
| 5,453,858 A | 9/1995 | Yamazaki |
| 5,514,879 A | 5/1996 | Yamazaki |
| 5,614,732 A | 3/1997 | Yamazaki |
| 5,644,152 A | 7/1997 | Rostoker et al. |
| 5,701,167 A | 12/1997 | Yamazaki |
| 5,849,601 A | 12/1998 | Yamazaki |
| 5,859,445 A | 1/1999 | Yamazaki |
| 5,909,615 A | 6/1999 | Kuo |
| 6,011,277 A | 1/2000 | Yamazaki |
| 6,023,075 A | 2/2000 | Yamazaki |
| 6,252,249 B1 | 6/2001 | Yamazaki |
| 6,281,520 B1 | 8/2001 | Yamazaki |
| 6,306,213 B1 | 10/2001 | Yamazaki |
| 6,737,676 B2 | 5/2004 | Yamazaki |
| 7,067,844 B2 | 6/2006 | Yamazaki |
| 7,098,479 B1 | 8/2006 | Yamazaki |
| 7,115,902 B1 | 10/2006 | Yamazaki |
| 7,145,176 B2 | 12/2006 | Kawasaki et al. |
| 7,205,171 B2 | 4/2007 | Luo et al. |
| 7,368,335 B2 | 5/2008 | Asami et al. |
| 7,375,372 B2 | 5/2008 | Luo et al. |
| 7,423,322 B2 | 9/2008 | Seo et al. |
| 7,576,360 B2 | 8/2009 | Yamazaki |
| 7,629,208 B2 | 12/2009 | Arai et al. |
| 7,636,135 B2 | 12/2009 | Wang et al. |
| 7,952,099 B2 | 5/2011 | Deng et al. |
| 2002/0047825 A1* | 4/2002 | Yamazaki ................. 345/99 |
| 2006/0124930 A1 | 6/2006 | Chen et al. |
| 2008/0061295 A1* | 3/2008 | Wang et al. ................. 257/59 |
| 2008/0142800 A1* | 6/2008 | Arai et al. ................. 257/59 |
| 2011/0223700 A1 | 9/2011 | Deng et al. |

FOREIGN PATENT DOCUMENTS

| | | |
|---|---|---|
| CN | 101145562 | 3/2008 |
| JP | 58-092217 | 6/1983 |
| JP | 60-160170 | 8/1985 |
| JP | 60-160170 A | 8/1985 |
| JP | 62-067872 | 3/1987 |
| JP | 63-258072 | 10/1988 |
| JP | 63-258072 A | 10/1988 |
| JP | 63258072 A * | 10/1988 |
| JP | 02-017647 A | 1/1990 |
| JP | 02-056462 U | 4/1990 |
| JP | 02-218166 | 8/1990 |
| JP | 04-242724 | 8/1992 |
| JP | 05-190857 A | 7/1993 |
| JP | 05-226656 A | 9/1993 |
| JP | 06-077483 A | 3/1994 |
| JP | 06-326312 | 11/1994 |
| JP | 08-055993 A | 2/1996 |
| JP | 10-270701 A | 10/1998 |
| JP | 2839529 | 12/1998 |
| JP | 11-121761 A | 4/1999 |
| JP | 11-177094 A | 7/1999 |
| JP | 2000-232227 A | 8/2000 |
| JP | 2005-049832 | 2/2005 |
| JP | 2005-049832 A | 2/2005 |
| JP | 2008-070876 A | 3/2008 |

* cited by examiner

Transmittance

Transmittance 265a  265b  265a
265

266a  266b  266a
266

267a  267b  267a
267

231

SEMICONDUCTOR DEVICE

BACKGROUND OF THE INVENTION

1. Field of the Invention

The present invention relates to thin film transistors and display devices using the thin film transistors at least for a pixel portion.

2. Description of the Related Art

In recent years, techniques for forming thin film transistors using a semiconductor thin film (with a thickness of about several tens to several hundreds of nanometers) which is formed over a substrate having an insulating surface have attracted attention. Thin film transistors are widely used in electronic devices such as ICs and electro-optical devices, and their development especially as switching elements for display devices has been accelerated.

As a switching element of an image display device, a thin film transistor using an amorphous semiconductor film for a channel formation region, a thin film transistor using a polycrystalline semiconductor film with a crystal grain diameter of 100 nm or more for a channel formation region, or the like is used. As a method for forming a polycrystalline semiconductor film, a technique is known in which a pulsed excimer laser beam is shaped into a linear laser beam with an optical system and an amorphous silicon film is crystallized by being scanned and irradiated with the linear laser beam.

As a switching element of an image display device, a thin film transistor using a microcrystalline semiconductor film with a crystal grain diameter of less than 100 nm for a channel formation region is also used (see Reference 1: Japanese Published Patent Application No. H4-242724 and Reference 2: Japanese Published Patent Application No. 2005-49832).

SUMMARY OF THE INVENTION

A thin film transistor using a polycrystalline semiconductor film for a channel formation region has advantages in that its field effect mobility is two or more orders of magnitude greater than that of a thin film transistor using an amorphous semiconductor film for a channel formation region and a pixel portion of a semiconductor display device and peripheral driver circuits thereof can be formed over the same substrate. However, the thin film transistor using a polycrystalline semiconductor film requires a more complicated process than the thin film transistor including an amorphous semiconductor film because of crystallization of the semiconductor film. Thus, there are problems such as reduction in yield and increase in cost.

Further, an inverted staggered thin film transistor using a microcrystalline semiconductor film has problems in that the crystallinity of an interface region between a gate insulating film and the microcrystalline semiconductor film is low and electric characteristics of the thin film transistor are poor.

In addition, an inverted staggered thin film transistor using a microcrystalline semiconductor film for a channel formation region can improve on-current compared to an inverted staggered thin film transistor using an amorphous semiconductor film for a channel formation region; however, off-current also increases. A display device using thin film transistors having high off-current has a problem in that contrast decreases and power consumption increases.

In view of the above problems, it is an object of the present invention to reduce off-current of a thin film transistor. In addition, it is another object of the present invention to improve electric characteristics of a thin film transistor. Further, it is still another object of the present invention to improve image quality of a display device using the thin film transistor.

An aspect of the present invention is a thin film transistor including a semiconductor film formed over a gate electrode and in an inner region of the gate electrode which does not reach an end portion of the gate electrode, with a gate insulating film interposed therebetween, a film covering at least a side surface of the semiconductor film, and a pair of wirings over the film covering the side surface of the semiconductor film; in which an impurity element serving as a donor is added to the semiconductor film. The film covering the side surface of the semiconductor film is an amorphous semiconductor film or an insulating film. Further, an impurity semiconductor film to which an impurity element imparting one conductivity type is added, which forms source and drain regions may be formed in contact with the film covering the side surface of the semiconductor film.

Another aspect of the present invention is a thin film transistor including a semiconductor film formed over a gate electrode and in an inner region of the gate electrode which does not reach an end portion of the gate electrode, with a gate insulating film interposed therebetween, an amorphous semiconductor film covering an upper surface and a side surface of the semiconductor film, and an impurity semiconductor film to which an impurity element imparting one conductivity type is added and which forms source and drain regions over the amorphous semiconductor film; in which an impurity element serving as a donor is added to the semiconductor film. Note that an end portion of the semiconductor film on the source and drain regions sides may overlap with the amorphous semiconductor film and the impurity semiconductor film. Further, an end portion of the amorphous semiconductor film is located beyond the source and drain regions.

Further, in the present invention described above, an amorphous semiconductor film which is different from the above amorphous semiconductor film may be provided on the upper surface of the semiconductor film.

Another aspect of the present invention is a thin film transistor including a semiconductor film formed over a gate electrode and in an inner region of the gate electrode which does not reach an end portion of the gate electrode, with a gate insulating film interposed therebetween, an amorphous semiconductor film over the semiconductor film, an impurity semiconductor film to which an impurity element imparting one conductivity type is added and which forms source and drain regions over the amorphous semiconductor film, an insulating film covering a side surface of the semiconductor film, a side surface of the amorphous semiconductor film, and a side surface of the impurity semiconductor film; and a pair of wirings formed over the insulating film and in contact with the impurity semiconductor film; in which an impurity element serving as a donor is added to the semiconductor film.

Another aspect of the present invention is a thin film transistor including a semiconductor film formed over a gate electrode and in an inner region of the gate electrode which does not reach an end portion of the gate electrode, with a gate insulating film interposed therebetween, an amorphous semiconductor film over the semiconductor film, an insulating film covering a side surface of the semiconductor film and a side surface of the amorphous semiconductor film, an impurity semiconductor film to which an impurity element imparting one conductivity type is added and which forms source and drain regions over the insulating film, and a pair of wirings being in contact with the impurity semiconductor film; in which an impurity element serving as a donor is added to the semiconductor film.

Note that end portions of the semiconductor film on the source and drain regions sides overlap with the insulating film.

Further, the semiconductor film is any one of an amorphous silicon film, an amorphous silicon germanium film, an amorphous germanium film, a microcrystalline silicon film, a microcrystalline germanium film, a microcrystalline silicon germanium film, a polycrystalline silicon film, a polycrystalline silicon germanium film, or a polycrystalline germanium film. Alternatively, the semiconductor film includes crystal grains to which an impurity element serving as a donor is added and germanium which is added to cover the crystal grains.

Further, the impurity element serving as a donor is phosphorus, arsenic, or antimony.

Note that, the concentration of the impurity element serving as a donor which is added to the semiconductor film is, here, $1\times10^{15}$ atoms/cm$^3$ or more and $3\times10^{18}$ atoms/cm$^3$ or less, preferably $6\times10^{15}$ atoms/cm$^3$ or more and $3\times10^{18}$ atoms/cm$^3$ or less, more preferably $1\times10^{16}$ atoms/cm$^3$ or more and $3\times10^{18}$ atoms/cm$^3$ or less, further more preferably $3\times10^{16}$ atoms/cm$^3$ or more and $3\times10^{17}$ atoms/cm$^3$ or less. The concentration of the impurity element serving as a donor is defined by the concentration distribution (concentration profile) which is measured by secondary ion mass spectrometry.

Note that if the maximum concentration of the impurity element serving as a donor which is added to the semiconductor film is less than $6\times10^{15}$ atoms/cm$^3$, specifically, less than $1\times10^{15}$ atoms/cm$^3$, the quantity of the impurity element serving as a donor is not enough and thus increase in field effect mobility and in on-current of a thin film transistor cannot be expected. In addition, if the maximum concentration of the impurity element serving as a donor which is added to the semiconductor film is higher than $3\times10^{18}$ atoms/cm$^3$, the threshold voltage shifts to the minus side of the gate voltage, and the thin film transistor does not function well. Therefore, it is preferable that the concentration of the impurity element serving as a donor be $1\times10^{15}$ atoms/cm$^3$ or more and $3\times10^{18}$ atoms/cm$^3$ or less, preferably $6\times10^{15}$ atoms/cm$^3$ or more and $3\times10^{18}$ atoms/cm$^3$ or less, more preferably $1\times10^{16}$ atoms/cm$^3$ or more and $3\times10^{18}$ atoms/cm$^3$ or less, further more preferably $3\times10^{16}$ atoms/cm$^3$ or more and $3\times10^{17}$ atoms/cm$^3$ or less.

Further, another aspect of the present invention is a method for manufacturing any of the above-described thin film transistors.

Further, another aspect of the present invention is a display device including a pixel electrode which is connected to any of the above-described thin film transistors.

Still further, another aspect of the present invention is a display device in which any of the above-described thin film transistors is used in a pixel portion, or further in a driver circuit. In the thin film transistor of the present invention, a semiconductor film to which donor is added and which has low resistivity is formed in contact with the gate insulating film. Therefore, the thin film transistor has high field effect mobility and on-current compared with a thin film transistor using an amorphous semiconductor film. Therefore, a part of or the entire driver circuit can be foamed over the same substrate as the pixel portion, so that a system-on-panel can be manufactured.

Examples of a display device include a light-emitting device and a liquid crystal display device. A light-emitting device includes a light-emitting element, and a liquid crystal display device includes a liquid crystal element. A light-emitting element includes, in its category, an element whose luminance is controlled by current or voltage, and specifically includes organic electroluminescence (EL) and inorganic electroluminescence (EL).

In addition, the display device includes a panel in which a display element is sealed, and a module in which an IC and the like including a controller are mounted on the panel. An aspect of the present invention relates to one mode of an element substrate before a display element is completed in a manufacturing process of the display device, and the element substrate is provided with a means for supplying current or voltage to the display elements in each of a plurality of pixels. Specifically, the element substrate may be in a state provided with only a pixel electrode of the display element, a state after a conductive film to be a pixel electrode is formed and before the conductive film is etched to form the pixel electrode, or any other state.

Note that a display device in this specification refers to an image display device, a light-emitting device, or a light source (including a lighting device). Further, the display device includes any of the following modules in its category: a module to which a connector such as an flexible printed circuit (FPC), tape automated bonding (TAB) tape, or a tape carrier package (TCP) is attached; a module having a TAB tape or a TCP which is provided with a printed wiring board at the end thereof; and a module having an integrated circuit (IC) which is directly mounted on a display element by a chip on glass (COG) method.

According to the present invention, a semiconductor film with low resistivity is formed on a surface of an insulating film; an amorphous semiconductor film or an insulating film which covers side surfaces of the semiconductor film is formed; and a pair of wirings are provided over the amorphous semiconductor film or the insulating film; whereby off-current of the thin film transistor can be reduced and on-current and field effect mobility can be improved. Thus, electric characteristics of the thin film transistor can be improved. In addition, by manufacturing a display device including the thin film transistor, improvement in image quality of the display device can be achieved.

DETAILED DESCRIPTION OF THE INVENTION

Figure 1A:
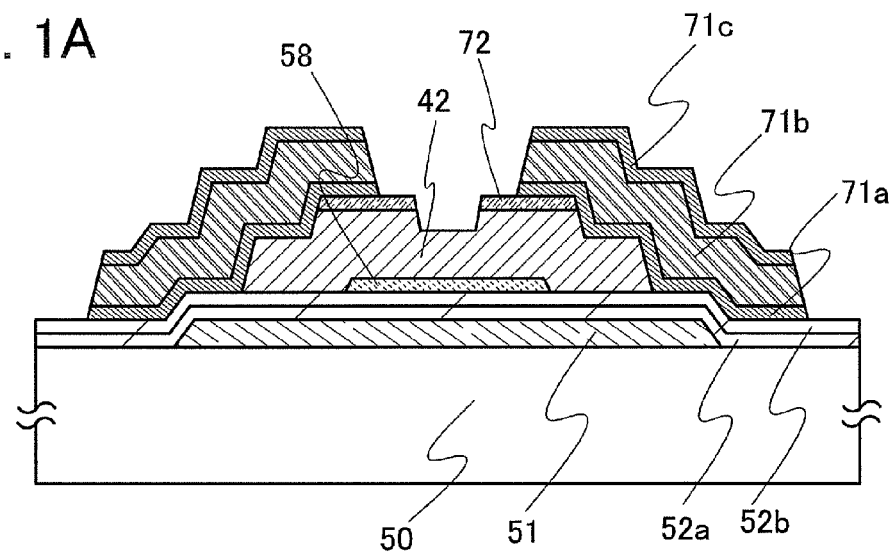
FIGS. 1A and 1B are cross-sectional views illustrating a thin film transistor according to one aspect of the present invention.

Embodiment modes of the present invention will be described with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiment modes to be given below. In a structure of the present invention described below, like portions in different drawings are denoted by the like reference numerals.

(Embodiment Mode 1)

Here, a structure of a thin film transistor having a higher field effect mobility and on-current and lower off-current than a conventional thin film transistor using a microcrystalline semiconductor film for a channel formation region is described with reference to FIGS. 1A and 1B, FIG. 2, FIG. 3, FIG. 4, FIG. 5, FIG. 6, FIG. 7, FIGS. 8A to 8C, FIGS. 9A to 9F, and FIGS. 10A to 10C.

In a thin film transistor illustrated in FIG. 1A, a gate electrode 51 is formed over a substrate 50, gate insulating films 52a and 52b are formed over the gate electrode, a semiconductor film 58 to which an impurity element serving as a donor is added is formed over the gate insulating film 52b, a buffer layer 42 is formed over the semiconductor film 58 to which an impurity element serving as a donor is added, a pair of source and drain regions 72 to which an impurity element serving as a donor is added is formed over the buffer layer 42, and wirings 71a to 71c are formed over the pair of source and drain regions 72.

In the semiconductor film 58 to which an impurity element serving as a donor is added, the impurity element serving as a donor is added at a concentration of $1\times10^{15}$ atoms/cm$^3$ or more and $3\times10^{18}$ atoms/cm$^3$ or less, preferably $6\times10^{15}$ atoms/cm$^3$ or more and $3\times10^{18}$ atoms/cm$^3$ or less, more preferably $1\times10^{16}$ atoms/cm$^3$ or more and $3\times10^{18}$ atoms/cm$^3$ or less, further more preferably $3\times10^{16}$ atoms/cm$^3$ or more and $3\times10^{17}$ atoms/cm$^3$ or less.

As a semiconductor film to which an impurity element serving as a donor is added, an amorphous silicon film, an amorphous silicon germanium film, an amorphous germanium film, a microcrystalline silicon film, a microcrystalline silicon germanium film, a microcrystalline germanium film, a polycrystalline silicon film, a polycrystalline silicon germanium film, a polycrystalline germanium film, or the like is given. Further, as an alternative to an impurity element serving as a donor, boron, which is an impurity element serving as an acceptor, may be used.

The concentration of an impurity element serving as a donor and is added to the semiconductor film 58 is set to be in the above range, whereby resistance at the interface between the gate insulating film 52b and the semiconductor film 58 to which an impurity element serving as a donor is added can be reduced. Thus, a thin film transistor having a high field effect mobility and high on-current can be manufactured. Note that if the maximum concentration of the impurity element serving as a donor which is added to the semiconductor film 58 is less than $6 \times 10^{15}$ atoms/cm$^3$, specifically less than $1 \times 10^{15}$ atoms/cm$^3$, the quantity of the impurity element serving as a donor is not enough and thus increase in field effect mobility and in on-current of a thin film transistor cannot be expected. In addition, if the maximum concentration of the impurity element serving as a donor which is added to the semiconductor film is higher than $3 \times 10^{18}$ atoms/cm$^3$, the threshold voltage shifts to the minus side of the gate voltage, and the thin film transistor does not function well. Therefore, it is preferable that the concentration of the impurity element serving as a donor be $1 \times 10^{15}$ atoms/cm$^3$ or more and $3 \times 10^{18}$ atoms/cm$^3$ or less, preferably $6 \times 10^{15}$ atoms/cm$^3$ or more and $3 \times 10^{18}$ atoms/cm$^3$ or less, more preferably $1 \times 10^{16}$ atoms/cm$^3$ or more and $3 \times 10^{18}$ atoms/cm$^3$ or less, further more preferably $3 \times 10^{16}$ atoms/cm$^3$ or more and $3 \times 10^{17}$ atoms/cm$^3$ or less.

Here, a microcrystalline semiconductor film is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with a grain size of 0.5 nm to 20 nm grown in the direction of a normal line with respect to the surface of the substrate. Further, an amorphous semiconductor is present between a plurality of microcrystalline semiconductors. Microcrystalline silicon, which is a typical example of a microcrystalline semiconductor, has a Raman spectrum which is shifted to a lower wave number side than 520 cm$^{-1}$ of single crystal silicon. That is to say, the peak of a Raman spectrum of microcrystalline silicon lies between 520 cm$^{-1}$, which represents single crystal silicon, and 480 cm$^{-1}$, which represents amorphous silicon. Furthermore, the microcrystalline semiconductor film contains hydrogen or a halogen at least 1 at. % in order to terminate dangling bonds. The microcrystalline semiconductor film may further contain a rare gas element such as helium, argon, krypton, or neon to further promote lattice distortion, so that the stability is enhanced and a favorable microcrystalline semiconductor film can be obtained. Such description about a microcrystalline semiconductor film is disclosed in, for example, U.S. Pat. No. 4,409,134.

The semiconductor film to which an impurity element serving as a donor is added is formed with a thickness of 5 nm or more and 50 nm or less, preferably 5 nm or more and 20 nm or less.

Further, it is preferable that the oxygen concentration or the nitrogen concentration in the semiconductor film 58 to which an impurity element serving as a donor is added be less than ten times the concentration of the impurity element serving as a donor, typically less than $3 \times 10^{19}$ atoms/cm$^3$, preferably less than $3 \times 10^{18}$ atoms/cm$^3$, and the concentration of carbon is preferably less than or equal to $3 \times 10^{18}$ atoms/cm$^3$. In the case where the semiconductor film 58 is a microcrystalline semiconductor film, by lowering the concentrations of oxygen, nitrogen, or carbon mixed in the semiconductor film 58, generation of defects in the microcrystalline semiconductor film can be suppressed. Furthermore, oxygen or nitrogen in the microcrystalline semiconductor film is likely to hinder crystallization. Therefore, in the case where the semiconductor film 58 is a microcrystalline semiconductor film, by making the oxygen concentration or the nitrogen concentration in the microcrystalline semiconductor film relatively low and by adding an impurity element serving as a donor, crystallinity of the microcrystalline semiconductor film can be improved.

In addition, since an impurity element serving as a donor is added to the semiconductor film 58 to which an impurity element serving as a donor of this embodiment mode is added, by adding an impurity element serving as an acceptor to the semiconductor film 58 to which an impurity element serving as a donor is added at the same time as or after film formation, the threshold voltage can be controlled. A typical example of an impurity element serving as an acceptor is boron, and an impurity gas such as $B_2H_6$ or $BF_3$ may be mixed into silicon hydride at 1 ppm to 1000 ppm, preferably 1 ppm to 100 ppm. Further, the concentration of boron is preferably set to be about one tenth the concentration of an impurity element serving as a donor, for example, $1 \times 10^{14}$ atoms/cm$^3$ to $6 \times 10^{16}$ atoms/cm$^3$.

The buffer layer 42 preferably covers side surfaces and an upper surface of the semiconductor film 58 to which an impurity element serving as a donor is added. Further, the gate insulating film 52b and the buffer layer 42 are preferably in contact with each other in a surrounding portion of the semiconductor film 58 to which an impurity element serving as a donor is added.

Figure 1B:
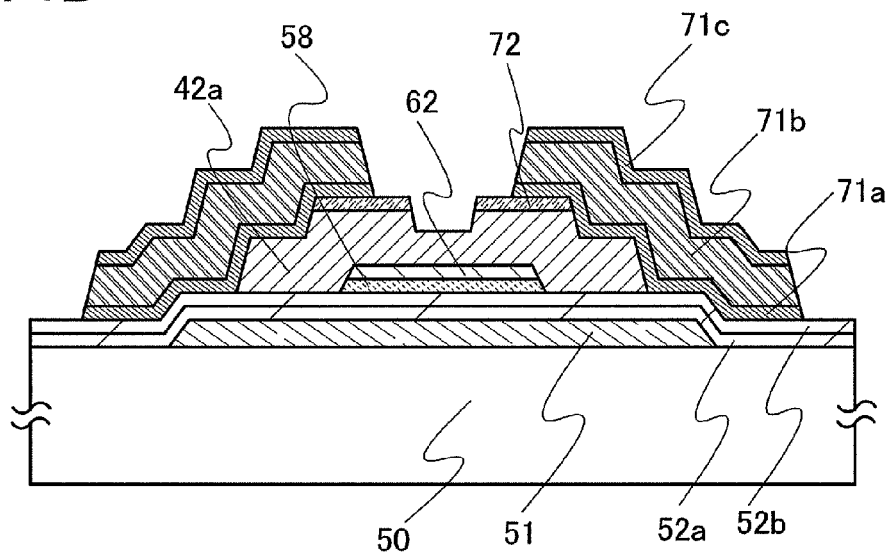

Further, as illustrated in FIG. 1B, as an alternative to the buffer layer 42 of FIG. 1A, a first buffer layer 62 which covers the upper surface of the semiconductor film 58 to which an impurity element serving as a donor is added and a second buffer layer 42a which covers an upper surface and side surfaces of the first buffer layer 62 and the side surfaces of the semiconductor film 58 to which an impurity element serving as a donor is added may be formed.

As for the buffer layer 42, the first buffer layer 62, and the second buffer layer 42a, an amorphous semiconductor film or an amorphous semiconductor film to which a halogen such as fluorine or chlorine is added is used. The thickness of the buffer layer 42 and the second buffer layer 42a is 50 nm to 200 nm. As an amorphous semiconductor film, an amorphous silicon film, an amorphous silicon film containing germanium, or the like can be given.

Since the buffer layer 42 and the second buffer layer 42a are provided between the semiconductor film 58 to which an impurity element serving as a donor is added and the wirings 71a to 71c, the semiconductor film 58 to which an impurity element serving as a donor is added and the wirings 71a to 71c are not in contact with each other. Further, the buffer layer 42 and the second buffer layer 42a are formed of an amorphous semiconductor film; therefore, the buffer layer 42 and the second buffer layer 42a have a larger energy gap and higher resistivity than the semiconductor film 58 to which an impurity element serving as a donor is added. In addition, the carrier mobility of the buffer layer 42 and the second buffer layer 42a is as low as one-fifth to one-tenth of that of the semiconductor film 58 to which an impurity element serving as a donor is added. Accordingly, in a thin film transistor which is completed later, the buffer layer 42 and the second buffer layer 42a serve as high resistance regions. Thus, the buffer layer 42 and the second buffer layer 42a can reduces leakage current between the source and drain regions 72 and the semiconductor film 58 to which an impurity element serving as a donor is added, and reduce off-current.

In the case where the semiconductor film 58 to which an impurity element serving as a donor is added is a microcrystalline semiconductor film, by forming an amorphous semiconductor film, or an amorphous semiconductor film containing hydrogen, nitrogen, or a halogen as the buffer layer 42 or the second buffer layer 42a on the surface of the semiconductor film 58 to which an impurity element serving as a donor is added, surfaces of crystal grains contained in the semiconductor film 58 to which an impurity element serving as a donor is added can be prevented from being oxidized naturally. In particular, in a microcrystalline semiconductor film, a crack is likely to be caused due to local stress in a region where an amorphous semiconductor is in contact with microcrystalline grains. When this crack is exposed to oxygen, the crystal grains are oxidized, whereby silicon oxide is formed. However, by forming the buffer layer 42 or the first buffer layer 62 on the surface of the semiconductor film 58 to which an impurity element serving as a donor is added, the microcrystalline grains can be prevented from being oxidized. Therefore, defects by which carriers are trapped or a region which hinders carrier movement can be reduced.

As the substrate 50, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, metal substrates of a stainless steel alloy and the like with the surface provided with an insulating film may be employed. When the substrate 50 is a mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 min×3400 mm), and the like.

The gate electrode 51 is formed of a metal material. As a metal material, aluminum, chromium, titanium, tantalum, molybdenum, copper, or the like is used. For example, the gate electrode 51 is preferably formed using aluminum or a stacked layer structure of aluminum and a barrier metal. As a barrier metal, a metal with a high melting point such as titanium, molybdenum, or chromium is used. A barrier metal is preferably provided for preventing hillocks and oxidation of aluminum.

The gate electrode 51 is formed with a thickness of 50 nm or more and 300 nm or less. The thickness of 50 nm or more and 100 nm or less of the gate electrode 51 can prevent breaking of a semiconductor film, an insulating film, or a wiring which are formed later due to level differences. Further, the thickness of 150 nm or more and 300 nm or less of the gate electrode 51 can lower the resistance and increase the size of the gate electrode 51.

Since the semiconductor film and the wiring are formed over the gate electrode 51, the gate electrode 51 is preferably processed to have a tapered end portion so that breaking of the semiconductor film and the wiring thereover due to level differences is prevented. Further, although not illustrated, a wiring or a capacitor wiring which is connected to the gate electrode can also be formed at the same time.

The gate insulating films 52a and 52b can each be formed using a silicon oxide film, a silicon nitride film, a silicon oxynitride film, or a silicon nitride oxide film with a thickness of 50 nm to 150 nm. Here, an example in which a silicon nitride film or a silicon nitride oxide film is formed as the gate insulating film 52a, and a silicon oxide film or a silicon oxynitride film is formed as the gate insulating film 52b to form a stacked-layer structure. Note that instead of a two-layer structure, the gate insulating film can be formed of a single layer of a silicon oxide film, a silicon nitride film, a silicon oxynitride film, or a silicon nitride oxide film.

By forming the gate insulating film 52a using a silicon nitride film or a silicon nitride oxide film, adhesion between the substrate 50 and the gate insulating film 52a is increased. In addition, in the case where a glass substrate is used as the substrate 50, impurities from the substrate 50 can be prevented from diffusing into the semiconductor film 58 to which an impurity element serving as a donor is added, the buffer layer 42, and the second buffer layer 42a, and oxidation of the gate electrode 51 can also be prevented. That is to say, film peeling can be prevented, and electric characteristics of the thin film transistor which is completed later can be improved. Further, the gate insulating films 52a and 52b each having a thickness of 50 nm or more are preferable because the gate insulating films 52a and 52b can alleviate reduction in coverage which is caused by unevenness due to the gate electrode 51.

Here, a silicon oxynitride film refers to a film that includes more oxygen than nitrogen, and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively in the case where measurements are performed using Rutherford backscattering spectrometry (RBS) and hydrogen forward scattering (HFS). Further, a silicon nitride oxide film refers to a film that includes more nitrogen than oxygen, and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively in the case where measurements are performed using RBS and HFS. Note that percentages of nitrogen, oxygen, silicon, and hydrogen fall within the ranges given above, where the total number of atoms contained in the silicon oxynitride film or the silicon nitride oxide film is defined as 100 at. %.

If an n-channel thin film transistor is formed, phosphorus, which is a typical impurity element, may be added to the pair of source and drain regions 72, which is formed of an impurity semiconductor film to which an impurity element imparting one conductivity type is added; for example, an impurity gas such as $PH_3$ may be added to silicon hydride. If a p-channel thin film transistor is fanned, boron, which is a typical impurity element, may be added; for example, an impurity gas such as $B_2H_6$ may be added to silicon hydride. By setting the concentration of phosphorus or boron at $1\times10^{19}$ atoms/$cm^3$ to $1\times10^{21}$ atoms/$cm^3$, the pair of source and drain regions 72 can form ohmic contact with the wirings 71a to 71c and therefore serve as source and drain regions. The pair of source and drain regions 72 can be formed of a microcrystalline semiconductor film or an amorphous semiconductor film. The pair of source and drain regions 72 is formed with a thickness of 2 nm or more and 50 nm or less. By reducing the thickness of the pair of source and drain regions 72, the throughput can be improved.

The wirings 71a to 71c are preferably formed of a single layer or a stacked layer using aluminum; copper; or an aluminum alloy to which an element for preventing hillocks or an element for improving a heat resistance property, such as copper, silicon, titanium, neodymium, scandium, or molybdenum, is added. Alternatively, the wirings 71a to 71c may have a stacked-layer structure in which a film in contact with the impurity semiconductor film to which an impurity element imparting one conductivity type is added is formed of titanium, tantalum, molybdenum, or tungsten, or nitride thereof; and a film of aluminum or an aluminum alloy is formed thereover. Further alternatively, the wirings 71a to 71c may have a stacked-layer structure in which films of titanium, tantalum, molybdenum, tungsten, or nitride thereof are provided on upper and lower surfaces of an aluminum film or an aluminum alloy film to sandwich the aluminum film or the aluminum alloy film. Here, a three-layer structure of the wirings 71a to 71c is illustrated and a stacked-layer of conductive films is employed in which the wirings 71a and 71c are formed using molybdenum films and the wiring 71b is formed using an aluminum film, or the wirings 71a and 71c are fanned using titanium films and the wiring 71b is formed using an aluminum film.

Figure 2:
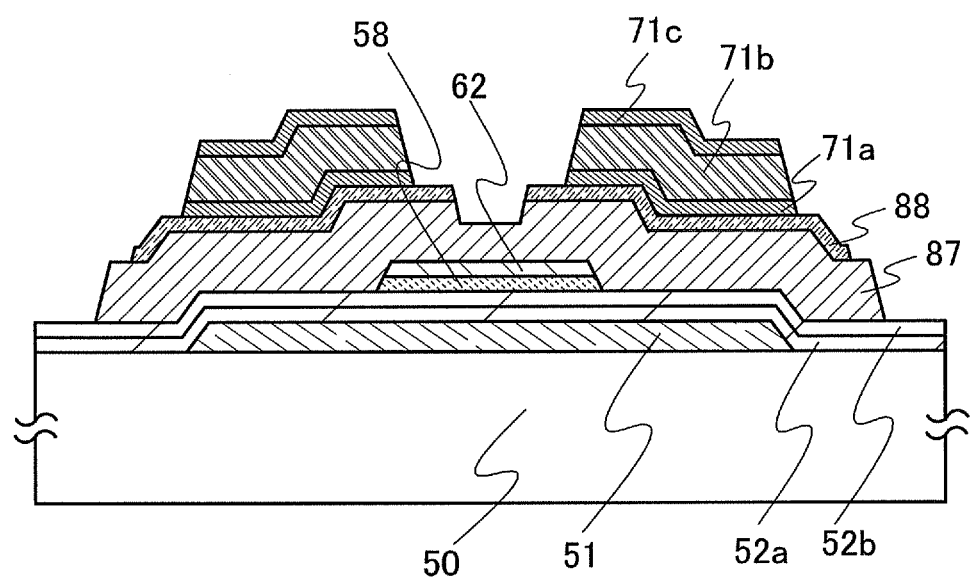
FIG. 2 is a cross-sectional view illustrating a thin film transistor according to one aspect of the present invention.

Although the thin film transistors of FIGS. 1A and 1B have a structure in which side surfaces of the buffer layer 42 or the second buffer layer 42a are in contact with the wirings 71a to 71c, a structure illustrated in FIG. 2 in which a buffer layer 87 is not in contact with the wirings 71a to 71c and the wirings 71a to 71c are formed over the buffer layer 87 with a pair of source and drain regions 88 interposed therebetween can be employed. Such a thin film transistor can be formed by employing a photolithography process using a multi-tone mask. Detailed description is given in Embodiment Mode 4.

By employing the structure illustrated in FIG. 2, the semiconductor film 58 to which an impurity element serving as a donor is added is not in direct contact with the pair of source and drain regions 88 and the wirings 71a to 71c, whereby leakage current and off-current of a thin film transistor can be reduced.

A thin film transistor having a structure which is different from the structures in FIGS. 1A and 1B and FIG. 2 is described with reference to FIG. 3.

Figure 3:
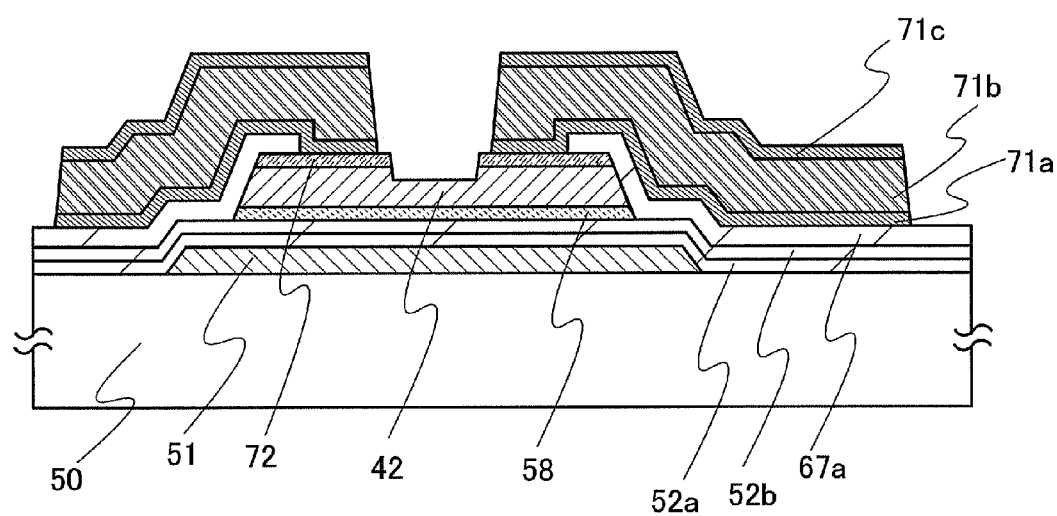
FIG. 3 is a cross-sectional view illustrating a thin film transistor according to one aspect of the present invention.

In the thin film transistor illustrated in FIG. 3, a gate electrode 51 is formed over the substrate 50, the gate insulating films 52a and 52b are formed over the gate electrode 51, the semiconductor film 58 to which an impurity element serving as a donor is added is formed over the gate insulating film 52b, the buffer layer 42 is formed over the semiconductor film 58 to which an impurity element serving as a donor is added, and the pair of source and drain regions 72 to which an impurity element serving as a donor is added is formed over the buffer layer 42. In addition, an insulating film 67a covers side surfaces of the semiconductor film 58 to which an impurity element serving as a donor is added, the buffer layer 42, and the pair of source and drain regions 72, and pairs of the wirings 71a to 71c are formed over the pair of source and drain regions 72, and an insulating film 67a.

The insulating film 67a can be formed using a film which is similar to the gate insulating films 52a and 52b. The insulating film 67a may alternatively be formed of an organic resin. Since the insulating film 67a at least covers the side surfaces of the semiconductor film 58 to which an impurity element serving as a donor is added, the semiconductor film 58 to which an impurity element serving as a donor is added and the wirings 71a to 71c are not in contact with each other; therefore, leakage current and off-current can be reduced. In addition, the buffer layer 42 between the semiconductor film 58 to which an impurity element serving as a donor is added and the pair of source and drain regions 72 formed of an amorphous semiconductor film; therefore, the buffer layer 42 has a larger energy gap and higher resistivity than the semiconductor film 58 to which an impurity element serving as a donor is added. In addition, the carrier mobility of the buffer layer 42 is as low as one-fifth to one-tenth of that of the semiconductor film 58 to which an impurity element serving as a donor is added. Accordingly, in a thin film transistor which is completed later, the buffer layer 42 serves as a high resistance region. Thus, the buffer layer 42 can reduce leakage current between the source and drain regions 72 and the semiconductor film 58 to which an impurity element serving as a donor is added, and reduce off-current.

Figure 4:
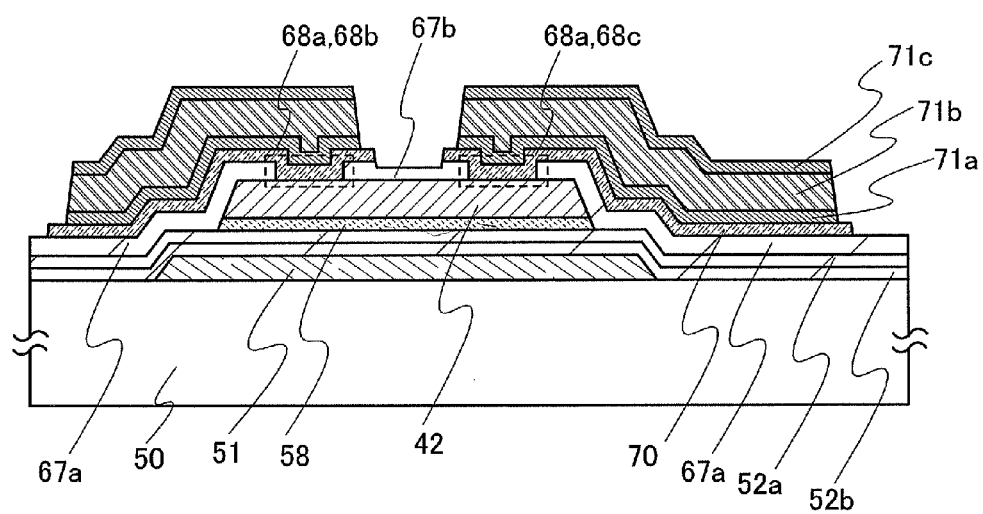
FIG. 4 is a cross-sectional view illustrating a thin film transistor according to one aspect of the present invention.
Figure 41A:
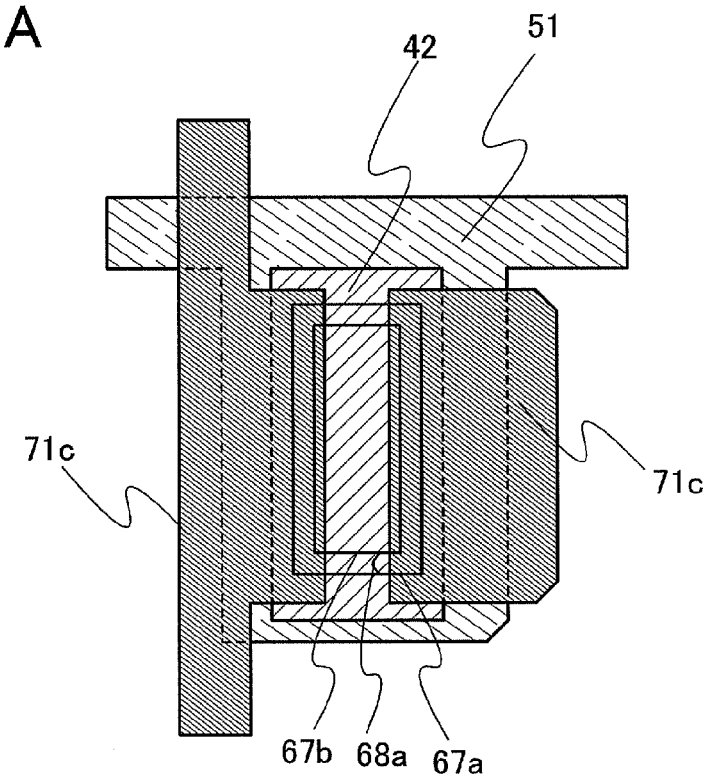
FIGS. 41A and 41B are top views illustrating thin film transistors according to one aspect of the present invention.
Figure 41B:
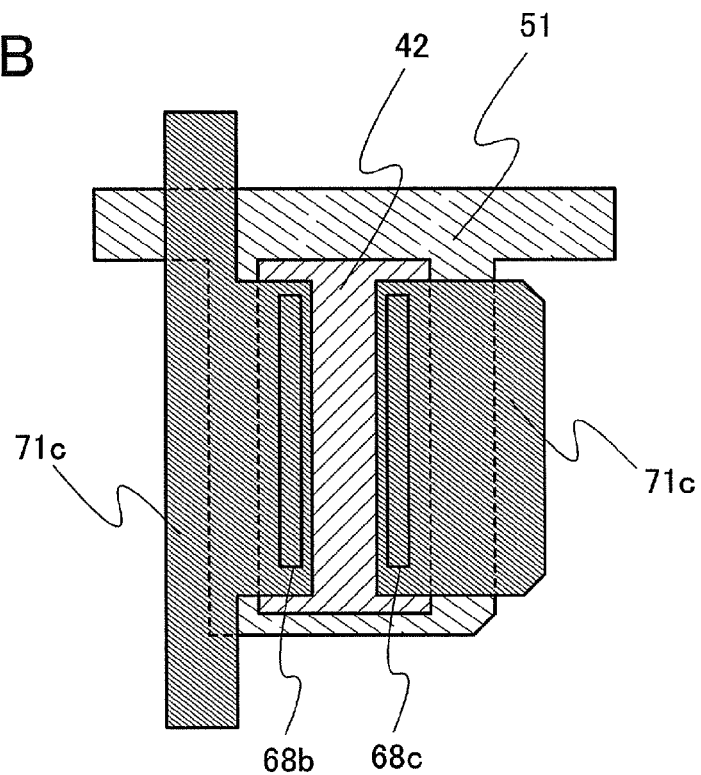

Although the thin film transistors of FIG. 3 has a structure in which the pair of source and drain regions 72 is formed over the buffer layer 42 and the insulating film 67a covers a part of upper surfaces and side surfaces of the pair of source and drain regions 72, structures illustrated in FIG. 4 and FIGS. 41A and 41B can be employed. The insulating film 67a covers side surfaces of the semiconductor film 58 to which an impurity element serving as a donor is added and the buffer layer 42 and one contact hole 68a is formed around an insulating film 67b over the buffer layer 42 (see FIG. 41A). In that case, the insulating film 67a and the insulating film 67b are separated. Alternatively, a pair of contact holes 68b and 68c may be formed (see FIG. 41B). In that case, the insulating film 67a and the insulating film 67b are not separated and connected to each other. In addition, a pair of source and drain regions 70 is formed over the insulating film 67a and in contact with the buffer layer 42 in the contact holes 68b and 68c. Further in addition, the pairs of wirings 71a to 71c are formed over the pair of source and drain regions 70.

As illustrated in FIG. 4, by forming a contact hole around the insulating film 67b, the insulating film 67b surrounded by the contact hole serves as a channel protection film; therefore, the buffer layer is not overetched and damage to the buffer layer due to etching can be reduced during separation of the source and drain regions 70. Further, in the case where a pair of contact holes is formed, the insulating film 67a and the insulating film 67b are connected to each other, and a region in the insulating film 67b serves as a channel protection film; therefore, the buffer layer is not overetched and damage to the buffer layer due to etching can be reduced during separation of the source and drain regions 70. A manufacturing process of such thin film transistors is described in Embodiment Mode 6.

By employing the structure illustrated in FIG. 4, the semiconductor film 58 to which an impurity element serving as a donor is added is not in direct contact with the pair of source and drain regions 70 and the wirings 71a to 71c, whereby leakage current and off-current of a thin film transistor can be reduced.

Figure 5:
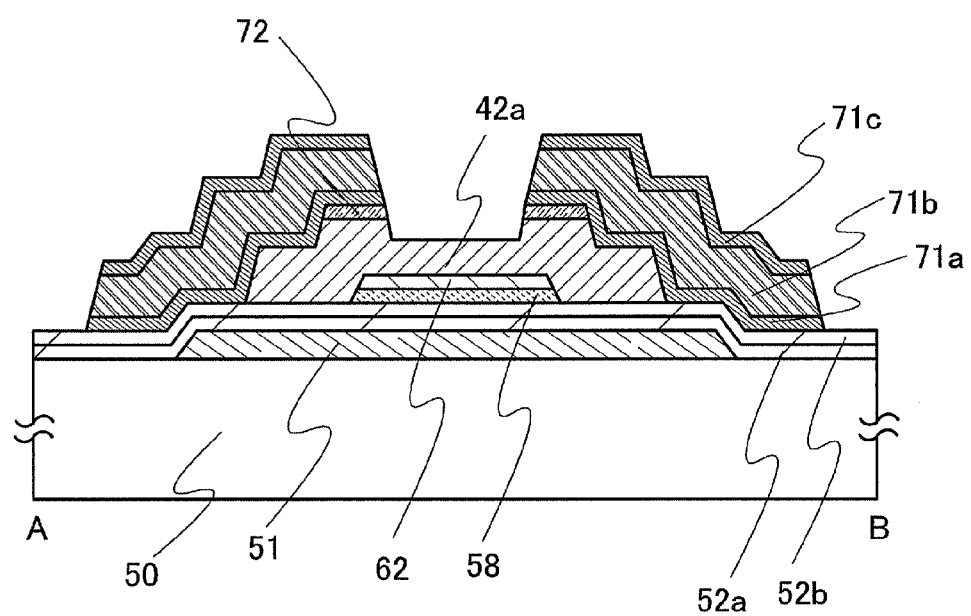
FIG. 5 is a cross-sectional view illustrating a thin film transistor according to one aspect of the present invention.

Note that while a mode in which end portions of the wirings 71a to 71c and end portions of the pair of source and drain regions 70 are not aligned is described here, a structure may alternatively be employed in which the end portions of the wirings 71a to 71c and the end portions of the pair of source and drain regions 72 are aligned as illustrated in FIG. 5.

Next, a thin film transistor in which a gate insulating film has a different structure from the gate insulating film of the above thin film transistors is described with reference to FIG. 6.

Figure 6:
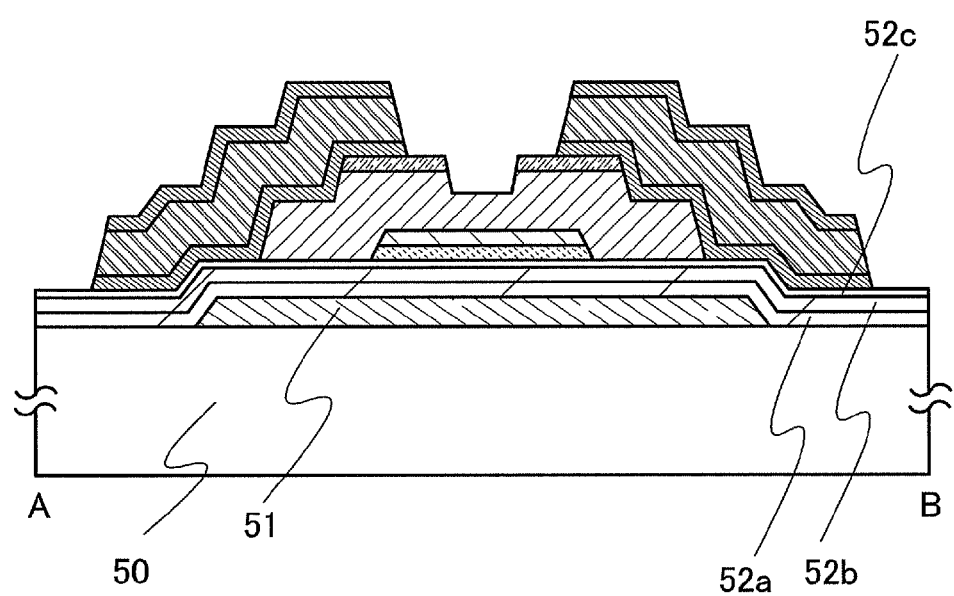
FIG. 6 is a cross-sectional view illustrating a thin film transistor according to one aspect of the present invention.

Instead of the gate insulating films 52a and 52b of the thin film transistors illustrated in FIGS. 1A and 1B, FIG. 2, FIG. 3, FIG. 4, and FIG. 5, three gate insulating films 52a, 52b, and 52c may be formed as illustrated in FIG. 6. As the gate insulating film 52c, which is a third layer, a silicon nitride film or a silicon nitride oxide film with a thickness of about 1 nm to 5 nm can be formed.

As a method for forming a silicon nitride film or a silicon nitride oxide film with a thickness of about 1 nm to 5 nm as the third gate insulating layer, a plasma CVD method can be employed. Further, it is also possible to have the gate insulating film 52b undergo nitridation treatment with high-density plasma to form a silicon nitride film on the surface of the gate insulating film 52b. By nitridation treatment using high-density plasma, a silicon nitride film that contains nitrogen at a higher concentration can be obtained. High-density plasma is produced by using a microwave with a high frequency, for example, 1 GHz or 2.45 GHz. With high-density plasma, which has the characteristic of having a low electron temperature, a layer can be formed with less plasma damage and few defects compared to a layer formed by a conventional plasma treatment because the kinetic energy of active species is low. In addition, carrier mobility can be increased because surface roughness of the gate insulating film 52b can be reduced.

Figure 7:
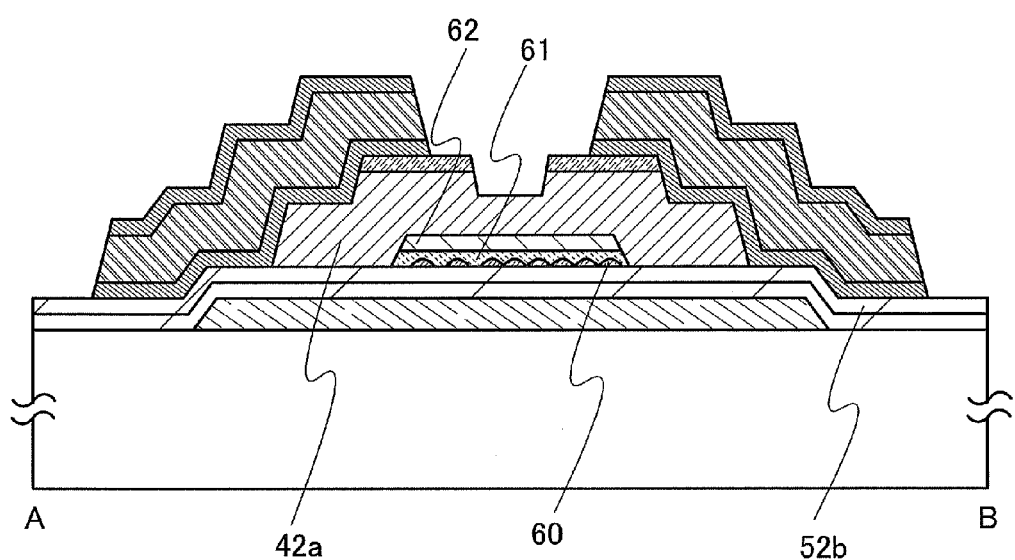
FIG. 7 is a cross-sectional view illustrating a thin film transistor according to one aspect of the present invention.

Further, instead of the semiconductor film 58 to which an impurity element serving as a donor is added in the thin film transistors illustrated in FIGS. 1A and 1B, FIG. 2, FIG. 3, FIG. 4, FIG. 5, and FIG. 6, crystal grains 60 to which an impurity element serving as a donor is added can be dispersed over the gate insulating film 52b, and a semiconductor film 61 containing germanium as its main component can be formed over the crystal grains 60 to which an impurity element serving as a donor is added and the gate insulating film 52b as illustrated in FIG. 7.

When the crystal grains 60 to which an impurity element serving as a donor is added are formed using silicon, since the semiconductor film 61 containing germanium as its main component has lower resistivity, carriers move through the semiconductor film 61 containing germanium as its main component. Therefore, a thin film transistor which includes a semiconductor film with lower resistivity than the semiconductor film 58 to which an impurity element serving as a donor is added is formed.

Next, the operation mechanism of the thin film transistor in which the semiconductor film to which an impurity element serving as a donor is added and the buffer layer are stacked over the gate insulating film as illustrated in FIGS. 1A and 1B, FIG. 2, FIG. 3, FIG. 4, FIG. 5, FIG. 6, and FIG. 7 is described below. In the following description, a microcrystalline silicon film to which phosphorus is added is used as the semiconductor film to which an impurity element serving as a donor is added and an amorphous silicon film is used as the buffer layer.

Figure 8A:
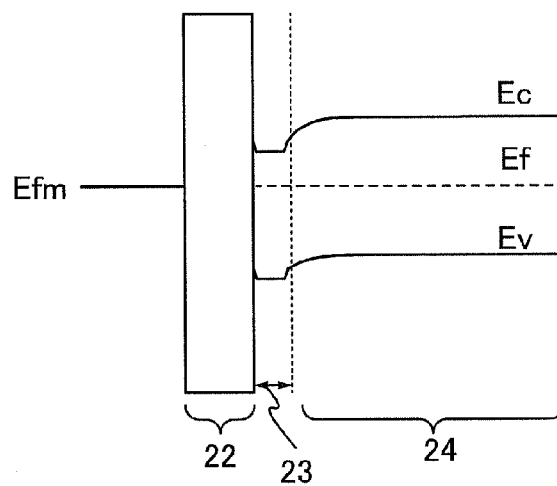
FIGS. 8A to 8C are energy band diagrams of a thin film transistor according to one aspect of the present invention.
Figure 8B:
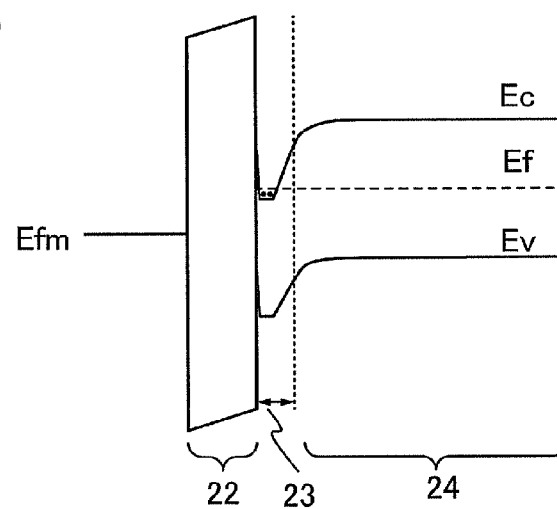
Figure 8C:
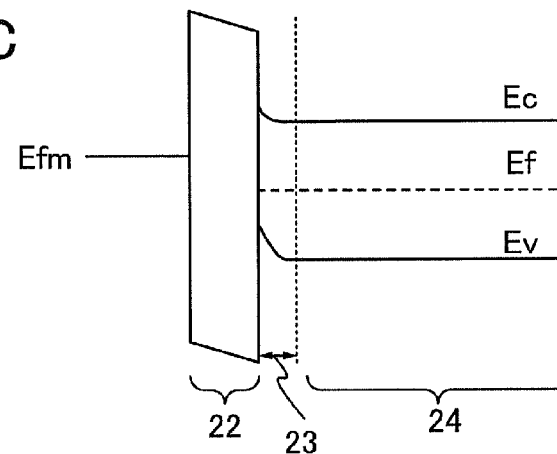
Figure 9A:
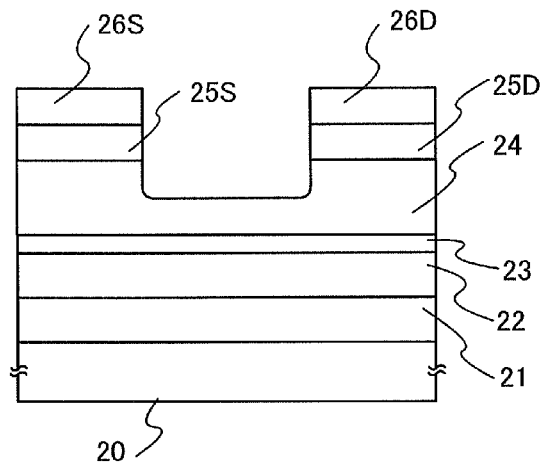
FIGS. 9A, 9C, and 9E are cross-sectional views
Figure 9B:
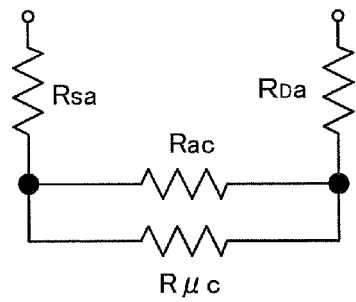
FIGS. 9B, 9D, and 9F are equivalent circuit diagrams of a thin film transistor according to one aspect of the present invention.
Figure 9C:
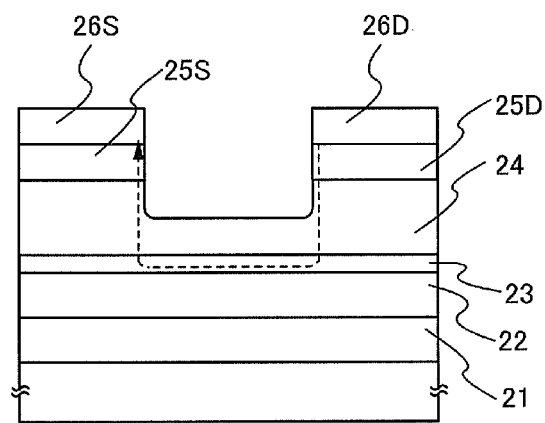
Figure 9D:
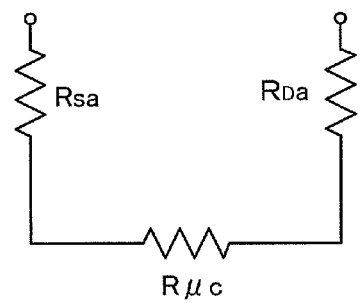
Figure 9E:
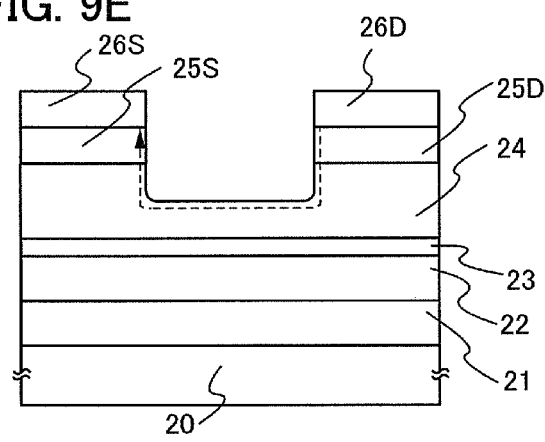
Figure 9F:
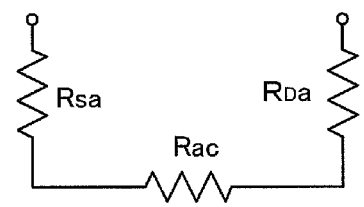

FIGS. 8A to 8C are energy band diagrams of the thin film transistor of the present invention, FIGS. 9A, 9C, and 9E are cross-sectional views of the thin film transistor, and FIGS. 9B, 9D, and 9F are equivalent circuit diagrams.

FIG. 9A illustrates a thin film transistor in which a substrate 20, a gate electrode 21, a gate insulating film 22, a microcrystalline silicon film 23 to which phosphorus is added, which is the semiconductor film to which an impurity element serving as a donor is added, an amorphous silicon film 24, which is a buffer layer, a source region 25S, a drain region 25D, a source electrode 26S, and a drain electrode 26D are stacked.

FIG. 9B illustrates an equivalent circuit of the thin film transistor in FIG. 9A, Here, resistance $R_{Sa}$ mainly represents a resistance value of the source region 25S and the amorphous silicon film 24; resistance $R_{Da}$ mainly represents a resistance value of the drain region 25D and the amorphous silicon film 24; resistance $R_{ac}$ mainly represents a resistance value of the amorphous silicon film 24; and resistance $R_{\mu c}$ mainly represents a resistance value of the microcrystalline silicon film 23.

FIG. 8A is a band diagram of the thin film transistor in FIG. 9A in a state in which voltage is not applied to the gate electrode 21 and shows a case where a Fermi level Ef of the amorphous silicon film 24 and a Fermi level Efm of the gate electrode are equal to each other.

The a microcrystalline silicon film 23 to which phosphorus is added, which is the semiconductor film to which an impurity element serving as a donor is added, of this embodiment mode is an n-type semiconductor because it contains phosphorus which is one of impurity elements serving as a donor; thus, the Fermi energy Ef is close to a conduction band energy Ec in the microcrystalline silicon film 23 to which phosphorus is added. In addition, the microcrystalline silicon film 23 to which phosphorus is added is an n-type film, and the amorphous silicon film 24 is an i-type film. Further, when the band gap (an energy difference between the bottom Ec of the conduction band and the top Ev of the valence band) of the microcrystalline silicon film is 1.4 eV, for example, and the band gap of the amorphous silicon film is 1.7 eV, for example, an n-i junction is formed at the interface between the microcrystalline silicon film 23 to which phosphorus is added and the amorphous silicon film 24. Thus, the energy band near the interface between the microcrystalline silicon film 23 to which phosphorus is added and the amorphous silicon film 24 curves, and the bottom Ec of the conduction band of the microcrystalline silicon film 23 to which phosphorus is added is below the bottom Ec of the conduction band of the amorphous silicon film 24.

Then, the gate electrode 21 is supplied with positive voltage, the source electrode 26S is grounded to have ground potential, and the drain electrode 26D is supplied with positive voltage. The path through which drain current and carriers flow between the drain electrode 26D and the source electrode 26S at this time is illustrated in FIG. 9C. As denoted by a dotted line in FIG. 9C, drain current flows through the drain electrode 26D, the drain region 25D, the amorphous silicon film 24, a part close to the interface with the gate insulating film 22 of the microcrystalline silicon film 23 to which phosphorus is added, the amorphous silicon film 24, the source region 25S, and the source electrode 26S. In other words, a carrier path between the drain electrode 26D and the source electrode 26S is formed through the source electrode 26S, the source region 25S, the amorphous silicon film 24, a part close to the interface with the gate insulating film 22 of the microcrystalline silicon film 23, the amorphous silicon film 24, the drain region 25D, and the drain electrode 26D.

FIG. 9D illustrates an equivalent circuit of the thin film transistor illustrated in FIG. 9C. Here, forward bias is applied at the interface between the source region 25S and the amorphous silicon film 24, so that the resistance $R_{Sa}$ represents a resistance value of the source region 25S and the amorphous silicon film 24 connected in forward direction, and the resistance $R_{Sa}$ is low. In addition, at the interface between the drain region 25D and the amorphous silicon film 24, reverse bias is applied and a depletion layer is formed, so that the resistance $R_{Da}$ is high. The resistance $R_{\mu c}$ represents a resistance value of the microcrystalline silicon film 23 to which phosphorus is added and which is inverted. Here, the inverted microcrystalline silicon film 23 to which phosphorus is added refers to the microcrystalline silicon film 23 to which phosphorus is added and in which conduction electrons are induced to the interface with the gate insulating film 22 by applying potential to the gate electrode 21. The resistance $R_{Sa}$ is much lower than the resistance $R_{Da}$ and the resistance $R_{\mu c}$.

FIG. 8B is a band diagram of the thin film transistor illustrated in FIG. 9C in a state in which positive voltage, typically, positive voltage which is high enough to form an inversion layer, is applied to the gate electrode 21. By application of positive voltage to the gate electrode 21, an energy band in the microcrystalline silicon film 23 to which phosphorus is added curves, and a region where the bottom Ec of the conduction band is lower than the Fermi level Ef, i.e., an inversion layer, is formed, and electrons are induced to a part close to the interface with the gate insulating film 22 of the microcrystalline silicon film 23 to which phosphorus is added so as to enhance the density of conduction electrons. Positive voltage at which the inversion layer begins to be formed substantially equals to the threshold voltage Vth.

In an actual device structure, the resistance $R_{Da}$ is typically formed in the amorphous silicon film with a thickness of about 0.1 μm to 0.3 μm. On the other hand, the resistance $R_{\mu c}$ is typically formed in the microcrystalline silicon film to which phosphorus is added with a length of about 3 μm to 6 μm. Therefore, the traveling distance of carriers in the channel is 10 to 30 times as long as that in the amorphous silicon film. By making the resistance $R_{\mu c}$ of the microcrystalline silicon film much smaller than the resistance $R_{ac}$ of the amorphous silicon film, on-current and field effect mobility of the thin film transistor can be increased. Therefore, by adding the impurity element serving as a donor, phosphorus here, to the microcrystalline silicon film, the carrier concentration can be increased, and thus, electric conductivity of the microcrystalline silicon film can be improved. As a result, on-current can be increased.

On the other hand, the gate electrode 21 is supplied with negative voltage, the source electrode 26S is grounded to have ground potential, and the drain electrode 26D is supplied with positive voltage. A drain-current and carrier path at this time is illustrated in FIG. 9E. The path through which drain current flows between the drain electrode 26D and the source electrode 26S at this time is illustrated. As denoted by a dotted line in FIG. 9E, drain current flows through the drain electrode 26D, the drain region 25D, the vicinity of the surface of the amorphous silicon film 24, the source region 25S, and the source electrode 26S. In other words, a carrier path between the drain electrode 26D and the source electrode 26S is formed through the source electrode 26S, the source region 25S, the vicinity of the surface of the amorphous silicon film 24, the drain region 25D, and the drain electrode 26D.

FIG. 9F illustrates an equivalent circuit of the thin film transistor illustrated in FIG. 9E. Here, forward bias is applied at the interface between the source region 25S and the amorphous silicon film 24, so that the resistance $R_{Sa}$ represents a resistance value of the source region 25S and the amorphous silicon film 24 connected in forward direction, and the resistance $R_{Sa}$ is low. In addition, at the interface between the drain region 25D and the amorphous silicon film 24, reverse bias is applied and a depletion layer is formed, so that the resistance $R_{Da}$ is high. The resistance $R_{ac}$ represents a resistance value of the amorphous silicon film 24. The resistance $R_{Sa}$ is much lower than the resistance $R_{Da}$ and the resistance $R_{ac}$.

FIG. 8C is a band diagram of the thin film transistor illustrated in FIG. 9E in a state in which negative voltage is applied to the gate electrode 21. By applying negative voltage to the gate electrode 21, electrons are forced away from the interface between the gate insulating film 22 and the microcrystalline silicon film 23 to which phosphorus is added. As a result, the electron density is depleted, and a depletion layer is formed. In this condition, conduction electrons are removed from the conduction band, and at the interface between the microcrystalline silicon film 23 to which phosphorus is added and the gate insulating film 22, the bottom Ec of the conduction band of the microcrystalline silicon film 23 to which phosphorus is added is higher than the Fermi level Ef. In addition, the surface of the microcrystalline silicon film 23 to which phosphorus is added has higher resistance than the amorphous silicon film 24. Accordingly, when negative voltage is applied to the gate electrode 21, electrons pass through the amorphous silicon film 24, so that current flows. In the vicinity of the interface between the amorphous silicon film 24 and the drain region 25D, reverse bias is applied, and a depletion layer is formed, so that the resistance $R_{Da}$ is increased. However, when the amorphous silicon film 24 has defects, impurity elements, or recombination centers, the defects, the impurity elements, or the recombination centers serve as a leakage path, whereby a depletion layer does not spread and off-current flows. Therefore, the amorphous silicon film 24 is formed of a film which forms perfect bonding at the interface with the drain region 25D and has less impurity elements, less defects, and less recombination centers. That is, by forming the amorphous silicon film 24 whose photoelectric current is high and whose dark current is low, leakage current of the thin film transistor can be reduced.

Note that the microcrystalline silicon film 23 to which phosphorus is added is used as the semiconductor film to which an impurity element serving as a donor is added in the description above. However, other films such as an amorphous silicon film, an amorphous germanium film, an amorphous silicon germanium film, a microcrystalline germanium film, a microcrystalline silicon germanium film, a polycrystalline silicon film, a polycrystalline germanium film, or a polycrystalline silicon germanium film may be used, in which, similarly, by adding an impurity element serving as a donor, such as phosphorus, arsenic, or antimonym, a band gap become smaller than the band gap of amorphous silicon which forms a buffer layer. Accordingly, at the interface between the semiconductor film to which an impurity element serving as a donor is added and the buffer layer, an n-i junction is formed, whereby an energy band curves and the bottom Ec of the conduction band of the semiconductor film to which an impurity element serving as a donor is added lies below the bottom Ec of the conduction band of the buffer layer. Therefore, thin film transistor characteristics which are similar to characteristics of above thin film transistors can be obtained.

As described in this embodiment mode, when positive voltage is applied to the gate electrode, the semiconductor film with high conductivity to which an impurity element serving as a donor is added is used as a travel region for carriers; while when negative voltage is applied to the gate electrode, the amorphous semiconductor film with low conductivity is used as a travel region for carriers. Thus, a thin film transistor with a high ON/OFF ratio can be obtained. That is, a thin film transistor which has high on-current and high field effect mobility and which can suppress off-current can be manufactured.

By providing a film with low resistivity over a gate insulating film, a semiconductor film to which an impurity element serving as a donor is added here, on-current and field effect mobility of the thin film transistor can be improved. Further, by providing an amorphous semiconductor film or an insulating film to cover side surfaces of the semiconductor film to which an impurity element serving as a donor is added, off-current of the thin film transistor can be reduced. That is, a higher-performance thin film transistor can be formed. Accordingly, a driving frequency of a display device can be increased, whereby a panel size can be increased and high density of pixels can be well achieved. In addition, since the thin film transistor of this embodiment mode is an inverted staggered thin film transistor, thin film transistors can be manufactured with fewer steps over a large substrate.

(Embodiment Mode 2)

In this embodiment mode, another structure of the thin film transistor of Embodiment Mode 1 is described with reference to FIG. 1A and FIGS. 40A and 40B. Although FIG. 1A is referred to here, this embodiment mode can be applied as appropriate to the thin film transistors of other drawings described in Embodiment Mode 1.

In FIG. 1A, the end portions of the pair of source and drain regions 72 serving as source and drain regions and the semiconductor film 58 to which an impurity element serving as a donor is added overlap.

Figure 40A:
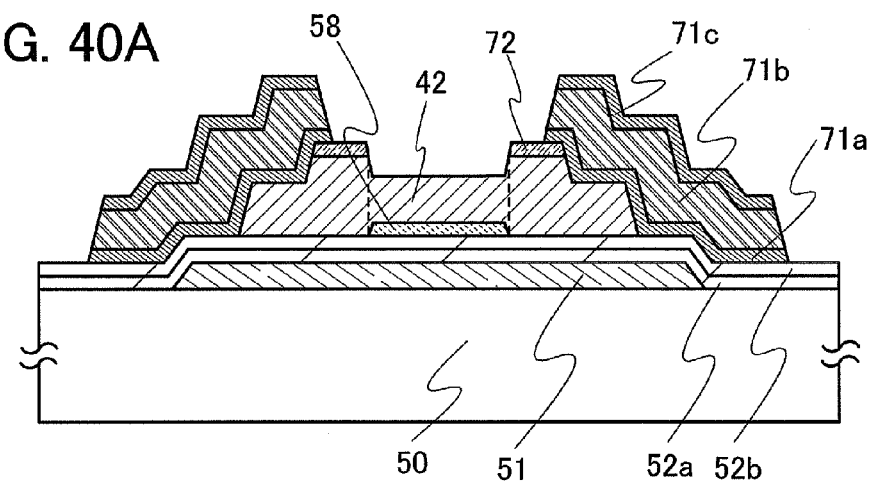
FIGS. 40A and 40B are cross-sectional views illustrating thin film transistors according to one aspect of the present invention.

In addition, in the thin film transistor illustrated in FIG. 40A, the end portions of the pair of source and drain regions 72 serving as source and drain regions and the end portions of the semiconductor film 58 to which an impurity element serving as a donor is added overlap. In a thin film transistor in which the end portions of the pair of source and drain regions 72 serving as source and drain regions and the end portions of the semiconductor film 58 to which an impurity element serving as a donor is added overlap as indicated by a dotted line in FIG. 40A or are substantially aligned as in FIG. 1A, a traveling distance of carriers is short and thus on-current can be improved.

Figure 40B:
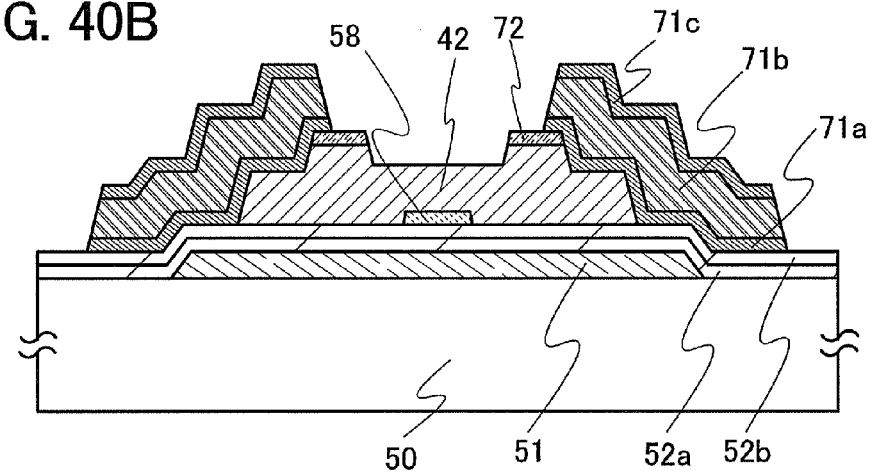

Alternatively, a so-called off-set structure illustrated in FIG. 40B in which the end portions of the pair of source and drain regions 72 serving as source and drain regions and the end portion of the semiconductor film 58 to which an impurity element serving as a donor is added do not overlap can be employed. By having such a structure, the pair of source and drain regions 72 serving as source and drain regions and the semiconductor film 58 to which an impurity element serving as a donor is added are spaced; accordingly, an electric field formed in the buffer layer 42 is relieved and off-current can be reduced.

(Embodiment Mode 3)

In this embodiment mode, a manufacturing process for a thin film transistor having high field effect mobility and on-current, and low off-current is described. Here, as a typical example, method for manufacturing the thin film transistor of FIG. 1B in Embodiment Mode 1 is described.

An n-type thin film transistor having an amorphous semiconductor film or a microcrystalline semiconductor film has higher field effect mobility than a p-type thin film transistor having an amorphous semiconductor film or a microcrystalline semiconductor film, and therefore is more suitable for being used in a driver circuit. It is desired that all thin film transistors formed over one substrate have the same polarity in order to reduce the number of manufacturing steps. Here, description is made using an n-channel thin film transistor.

Figure 10A:
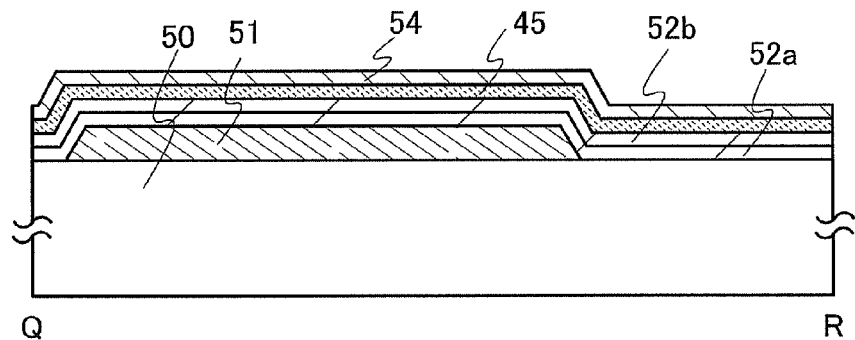
FIGS. 10A to 10C are cross-sectional views illustrating a method for manufacturing a display device according to one aspect of the present invention.

As illustrated in FIG. 10A, the gate electrode 51 is formed over the substrate 50, and the gate insulating films 52a and 52b are formed over the gate electrode 51.

The gate electrode 51 is formed by a sputtering method, a CVD method, a plating method, a printing method, a droplet discharge method, or the like using any of the metal materials which are given as materials for the gate electrode 51 in Embodiment Mode 1. Here, a molybdenum film is formed as a conductive film over the substrate 50 by a sputtering method and is etched using a resist mask which is formed using a first photomask. Thus, the gate electrode 51 is formed.

The gate insulating films 52a and 52b can each be a silicon oxide film, a silicon nitride film, a silicon oxynitride film, or a silicon nitride oxide film which is formed by a CVD method, a sputtering method, or the like. Here, a mode is described in which a silicon nitride film or a silicon nitride oxide film is formed as the gate insulating film 52a, and a silicon oxide film or a silicon oxynitride film is formed as the gate insulating film 52b to form a stacked-layer structure.

Then, a semiconductor film 45 to which an impurity element serving as a donor is added is formed over the gate insulating film 52b. The semiconductor film 45 to which an impurity element serving as a donor is added is formed by a plasma CVD method or a sputtering method. Further, the semiconductor film 45 to which an impurity element serving as a donor is added is formed through heat treatment of a semiconductor film which is formed by a plasma CVD method or a sputtering method. As the heat treatment, heat may be added or laser beam irradiation or lamp light irradiation may be performed.

In the case of forming the semiconductor film 45 to which an impurity element serving as a donor is added by a plasma CVD method, in a reaction chamber of a plasma CVD apparatus, a deposition gas containing silicon or germanium, hydrogen, and a gas which contains an impurity element serving as a donor are mixed; and an amorphous semiconductor film or a microcrystalline semiconductor film is formed using glow discharge plasma. Note that in the case of forming an amorphous semiconductor film, a deposition gas containing silicon or germanium and a gas which contains an impurity element serving as a donor are mixed, and an amorphous semiconductor film can be formed using glow discharge plasma without using hydrogen.

In the step of forming the semiconductor film 45 to which an impurity element serving as a donor is added, glow discharge plasma is generated by applying high-frequency power with a frequency of 1 MHz, to 30 MHz, typically 13.56 or 27.12 MHz, or high-frequency power with a frequency in the VHF band of more than 30 MHz to about 300 MHz, typically 60 MHz.

As typical examples of the deposition gas containing silicon or germanium, $SiH_4$, $Si_2H_6$, $GeH_4$, and $Ge_2H_6$ are given. As the impurity element serving as a donor, phosphorus, arsenic, antimony, or the like can be used.

Alternatively, as the semiconductor film 45 to which an impurity element serving as a donor is added, an amorphous silicon film, an amorphous silicon germanium film, an amorphous germanium film, or the like can be formed by sputtering using a silicon target, a germanium target, a silicon germanium target, or the like with helium, argon, neon, or the like. In the sputtering, a semiconductor film to which an impurity element serving as a donor is added can be formed by introducing a gas containing an impurity element serving as a donor into a film formation chamber.

Further, by heat treatment of an amorphous semiconductor film or microcrystalline semiconductor film to which an impurity element serving as a donor is added, a crystal semiconductor film to which an impurity element serving as a donor is added can be formed.

Note that instead of forming the semiconductor film 45 to which an impurity element serving as a donor is added, it is possible to form a semiconductor film which does not contain an impurity element serving as a donor and to form an insulating film to which an impurity element serving as a donor is added as the gate insulating film 52b. For example, the gate insulating film 52b can be formed using a silicon oxide film, a silicon nitride film, a silicon oxynitride film, or a silicon nitride oxide film to which an impurity element serving as a donor (phosphorus, arsenic, or antimony) is added. Further, in the case where the gate insulating film 52b has a stacked-layer structure, an impurity element serving as a donor may be added to a layer which is in contact with the semiconductor film 45 or in contact with the gate insulating film 52a.

As a method for forming an insulating film to which an impurity element serving as a donor is added as the gate insulating film 52b, an insulating film may be formed using a source gas of the insulating film with a gas containing an impurity element serving as a donor. For example, by a plasma CVD method using a silane, ammonia, and phosphine, a silicon nitride film to which phosphorus is add can be formed. Alternatively, a silicon oxynitride film to which phosphorus is added can be formed by a plasma CVD method using a silane, dinitrogen monoxide, ammonia, and phosphine.

Further, a gas containing an impurity element serving as a donor may be fed into a reaction chamber of a film formation apparatus before forming the gate insulating film 52b so that the impurity element serving as a donor is adsorbed onto the surface of the substrate 50 and an inner wall of the reaction chamber. After that, the gate insulating film 52b is formed. Then, a semiconductor film is deposited while taking in the impurity element serving as a donor. Thus, the semiconductor film 45 to which an impurity element serving as a donor is added can be formed.

Still further, before forming the semiconductor film 45 to which an impurity element serving as a donor is added, a gas containing an impurity element serving as a donor may be fed into a reaction chamber of a film formation apparatus so that the impurity element serving as a donor is adsorbed onto the gate insulating film 52b and an inner wall of the reaction chamber. After that, a semiconductor film is deposited while taking in the impurity element serving as a donor. Thus the semiconductor film 45 to which an impurity element serving as a donor is added can be formed.

Note that in the case of forming a microcrystalline semiconductor film as a semiconductor film 45 to which an impurity element serving as a donor is added, a fluoride gas containing silicon or germanium may be used with a deposition gas containing silicon or germanium in order to form the semiconductor film 45 to which an impurity element serving as a donor is added. In that case, it is preferable that the flow ratio of a silane is 0.1 to 50 times, preferably 1 to 10 times that of fluorosilane. By using a fluoride gas containing silicon or germanium with a deposition gas containing silicon or germanium in order to form the semiconductor film 45 to which an impurity element serving as a donor is added, an amorphous semiconductor component in a place where crystal growth proceeds in a microcrystalline semiconductor film is etched by fluorine radicals; therefore, crystals with high crystallinity grow. That is, a microcrystalline semiconductor film having high crystallinity can be formed.

Further, an energy band width may be adjusted to be 0.9 eV to 1.1 eV by mixing germanium hydride or germanium fluoride such as $GeH_4$ or $GeF_4$ into a gas such as a silane. By adding germanium to silicon, the temperature characteristic of a thin film transistor can be changed.

In the film formation treatment of the semiconductor film 45 to which an impurity element serving as a donor is added, helium may be added to a reaction gas, in addition to a silane and hydrogen. Helium has an ionization energy of 24.5 eV, which is the largest among all gases, and has a metastable state in the level of about 20 eV, which is a little lower than the ionization energy; therefore, only about 4 eV, the difference therebetween, is necessary for ionization during discharging. Therefore, the discharge starting voltage also has the lowest value among all gases. By such characteristics, plasma can be held stably with helium. Further, since uniform plasma can be formed, even if the area of a substrate over which the semiconductor film to which an impurity element serving as a donor is added is deposited is large, plasma having uniform density can be obtained.

Here, as a mode of the semiconductor film 45 to which an impurity element serving as a donor is added, a microcrystalline silicon film to which phosphorus is added is formed by a plasma CVD method.

In a reaction chamber of a plasma CVD apparatus, a deposition gas containing silicon or germanium, which is a silane here, hydrogen, and/or a rare gas are mixed, and a microcrystalline silicon film is formed using glow discharge plasma. Hydrogen is diluted to so that the flow rate of hydrogen is 10 to 2000 times, preferably 50 to 200 times that of the silane, and the microcrystalline silicon film is formed. The substrate heating temperature is 100° C. to 300° C., preferably 120° C. to 220° C. Further, by using phosphine with the above-mentioned source gas, a microcrystalline silicon film to which an impurity element serving as a donor is added can be formed. Here, 0.01% to 5% phosphine (diluted with a silane or hydrogen) gas, a silane, and hydrogen are used to form a microcrystalline silicon film to which phosphorus is added.

Then, a first buffer layer 54 is formed. As the first buffer layer 54, an amorphous semiconductor film can be formed by a plasma CVD method using a deposition gas containing silicon or germanium. Alternatively, by diluting a deposition gas containing silicon or germanium with one or plural kinds of rare gases selected from helium, argon, krypton, and neon, an amorphous semiconductor film can be formed. Further alternatively, by using hydrogen at a flow rate which is 1 or more and 10 or less times, preferably 1 or more and 5 or less times a flow rate of a silane gas, a hydrogen-containing amorphous semiconductor film can be formed. Further, a halogen such as fluorine or chlorine may be added to the above hydrogenated semiconductor film or hydrogen-containing amorphous semiconductor film.

Further, as the first buffer layer 54, an amorphous semiconductor film can be formed by sputtering using a semiconductor target such as a silicon target, a silicon germanium target, or a germanium target with hydrogen or a rare gas.

As the amorphous semiconductor film, an amorphous silicon film, an amorphous silicon germanium film, or the like can be employed.

The thickness of the first buffer layer 54 is 10 nm to 100 nm, preferably 30 nm to 50 nm.

In the case where the semiconductor film 45 to which an impurity element serving as a donor is added is a microcrystalline semiconductor film, by forming an amorphous semiconductor film, or an amorphous semiconductor film containing hydrogen, nitrogen, or a halogen as the first buffer layer 54 on the surface of the semiconductor film 45 to which an impurity element serving as a donor is added, surfaces of crystal grains contained in the microcrystalline semiconductor film can be prevented from being oxidized naturally. In particular, in a region where an amorphous semiconductor is in contact with microcrystalline grains, a crack is likely to be caused due to local stress. When this crack is exposed to oxygen, the crystal grains are oxidized, whereby silicon oxide is formed. However, by forming the first buffer layer 54 on the surface of the semiconductor film 45 to which an impurity element serving as a donor is added, the microcrystalline grains can be prevented from being oxidized.

In addition, it is preferable that the first buffer layer 54 be formed by a plasma CVD method at a temperature of 300° C. to 400° C. after forming the semiconductor film 45 to which an impurity element serving as a donor is added. By the film formation, hydrogen is supplied to the semiconductor film 45, and the same effect as hydrogenating the semiconductor film

45 can be obtained. In other words, by depositing the first buffer layer 54 over the semiconductor film 45 to which an impurity element serving as a donor is added, hydrogen is diffused into the semiconductor film 45 to which an impurity element serving as a donor is added, whereby dangling bonds can be terminated.

Figure 10B:
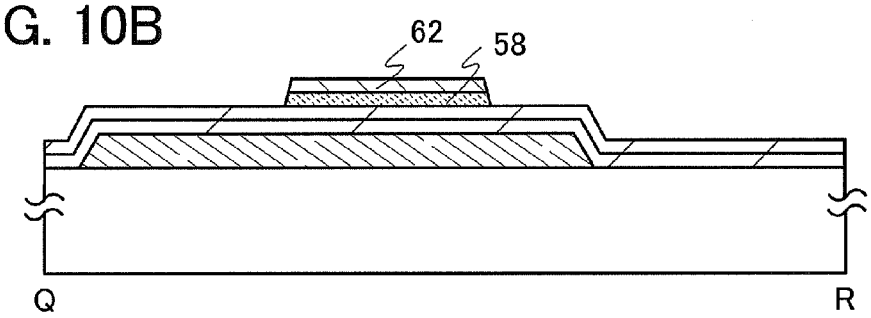

Then, a resist is applied over the first buffer layer 54, then, the resist is exposed to light and developed through a photolithography process using a second photomask to form a resist mask. Then, using the resist mask, the first buffer layer 54 and the semiconductor film 45 to which an impurity element serving as a donor is added are etched to form the first buffer layer 62 and the semiconductor film 58 to which an impurity element serving as a donor is added as illustrated in FIG. 10B.

Figure 10C:
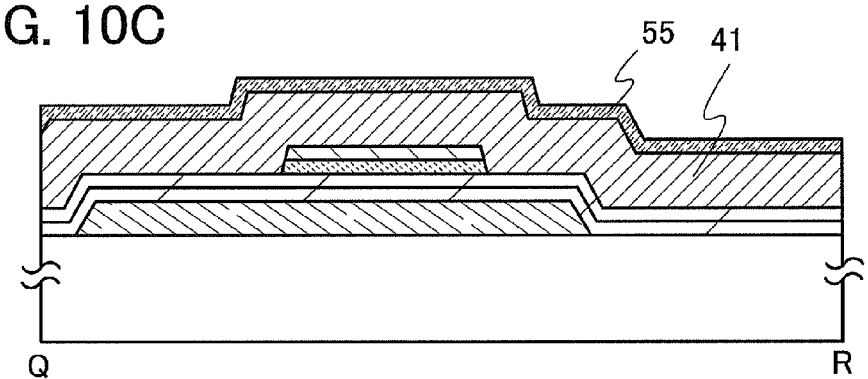

Then, as illustrated in FIG. 10C, a second buffer layer 41 and an impurity semiconductor film 55 to which an impurity element imparting one conductivity type is added are formed over the first buffer layer 62 and the gate insulating film 52*b*.

The second buffer layer 41 is formed in a manner similar to that of the first buffer layer 54. In some cases, the second buffer layer 41 is partly etched in a later step of formation of source and drain regions, and therefore is preferably formed with a thickness such that the second buffer layer 41 is partly left after the etching. Typically, it is preferable to form the second buffer layer 41 with a thickness of 30 nm or more and 500 nm or less, preferably 50 nm or more and 200 nm or less.

In a display device in which high voltage (e.g., about 15 V) is applied to thin film transistors, typically, in a liquid crystal display device, if the first buffer layer 54 and the second buffer layer 41 are formed thick, withstand drain voltage is increased. Therefore, deterioration of the thin film transistors can be reduced even if high voltage is applied to the thin film transistors.

Since the first buffer layer 54 and the second buffer layer 41 are formed using an amorphous semiconductor film or an amorphous semiconductor film containing hydrogen or a halogen, the first buffer layer 54 and the second buffer layer 41 have a larger energy gap than the semiconductor film 58 to which an impurity element is added, and higher resistivity and lower mobility. Therefore, in a thin film transistor which is completed later, the first buffer layer and the second buffer layer, which are formed between the source and drain regions and the semiconductor film 58 to which an impurity element serving as a donor is added, serve as high resistance regions; therefore off-current of the thin film transistor can be reduced. When the thin film transistor is used as a switching element of a display device, the contrast of the display device can be improved.

If an n-channel thin film transistor is formed, phosphorus, which is a typical impurity element, may be added to the impurity semiconductor film 55 to which an impurity element imparting one conductivity type is added; for example, an impurity gas such as $PH_3$ may be added to a deposition gas containing silicon or germanium. If a p-channel thin film transistor is formed, boron, which is a typical impurity element, may be added; for example, a gas containing an impurity element such as $B_2H_6$ may be added to a deposition gas containing silicon or germanium. By setting the concentration of phosphorus or boron at $1\times10^{19}$ atoms/cm$^3$ to $1\times10^{21}$ atoms/cm$^3$, the impurity semiconductor film 55 can form ohmic contact with the wirings 71*a* to 71*c*, which are formed later, and therefore serve as source and drain regions. The impurity semiconductor film 55 to which an impurity element imparting one conductivity type is added can be formed of a microcrystalline semiconductor film or an amorphous semiconductor film. The impurity semiconductor film 55 to which an impurity element imparting one conductivity type is added is formed with a thickness of 2 nm or more and 50 nm or less. By reducing the thickness of the impurity semiconductor film to which an impurity element imparting one conductivity type is added, the throughput can be improved.

Then, a resist mask is formed over the impurity semiconductor film 55 to which an impurity element imparting one conductivity type is added. The resist mask is formed by a photolithography technique. Here, a resist which is applied over the impurity semiconductor film 55 to which an impurity element imparting one conductivity type is added is exposed to light and developed using a third photomask to form the resist mask.

Figure 11A:
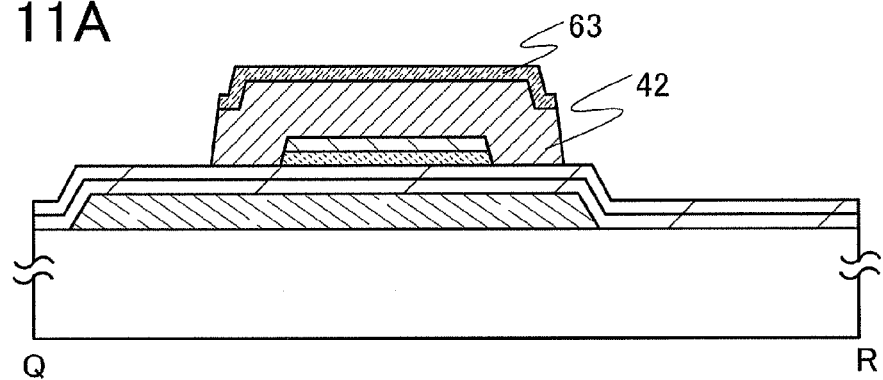
FIGS. 11A to 11C are cross-sectional views illustrating a method for manufacturing a display device according to one aspect of the present invention.

Then, using the resist mask, the second buffer layer 41 and the impurity semiconductor film 55 to which an impurity element imparting one conductivity type is added are etched and separated to form the second buffer layer 42 and an impurity semiconductor film 63 to which an impurity element imparting one conductivity type is added as illustrated in FIG. 11A. Then, the resist mask is removed.

The second buffer layer 42 covers the semiconductor film 58 to which an impurity element serving as a donor is added, whereby leakage current between source and drain regions formed over the second buffer layer 42 and the semiconductor film 58 to which an impurity element serving as a donor is added can be prevented. In addition, leakage current between a wiring and the semiconductor film 58 to which an impurity element serving as a donor is added can be prevented.

Figure 11B:
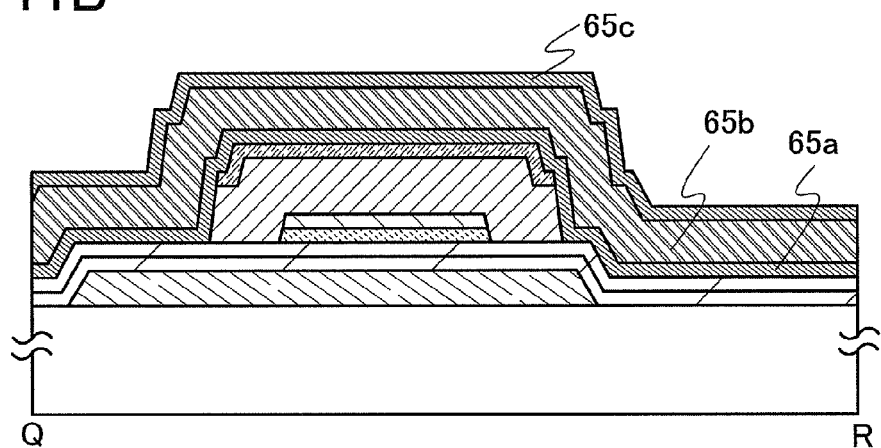

Then, as illustrated in FIG. 11B, conductive films 65*a* to 65*c* are formed over the impurity semiconductor film 63 to which an impurity element imparting one conductivity type is added and the gate insulating film 52*b*. The conductive films 65*a* to 65 are formed by a sputtering method, a CVD method, a printing method, a droplet discharge method, a vapor deposition method, or the like. Here, the conductive film having a three-layer structure of the conductive films 65*a* to 65*c* is illustrated, and a stacked-layer structure in which molybdenum films are used as the conductive films 65*a* and 65*c* and an aluminum film is used as the conductive film 65*b*, or a stacked-layer structure in which titanium films are used as the conductive films 65*a* and 65*c* and an aluminum film is used as the conductive films 65*b* is employed. The conductive films 65*a* to 65*c* are formed by a sputtering method or a vacuum evaporation method.

The conductive films 65*a* to 65*c* can be formed using any of the metal materials which are listed as materials for the wirings 71*a* to 71*c* in Embodiment Mode 1.

Then, a resist mask is formed over the conductive film 65*c* through a photolithography process using a fourth photomask.

Figure 11C:
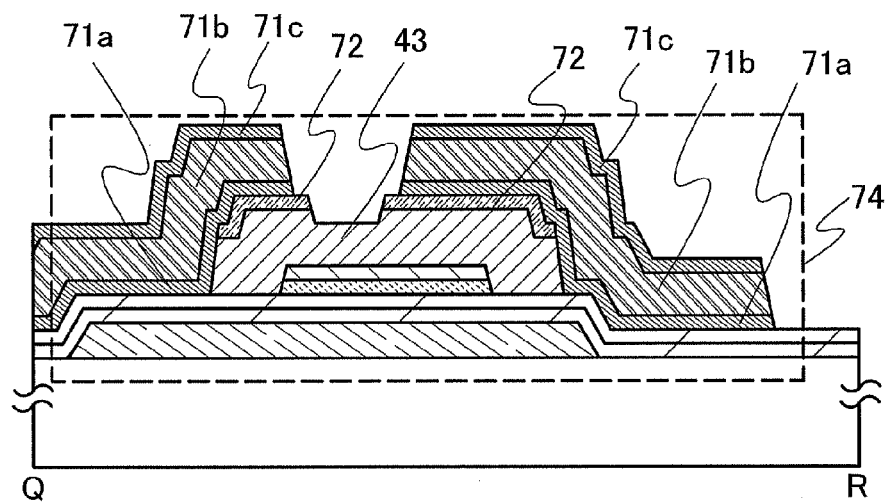

Then, the conductive films 65*a* to 65*c* are etched using the resist mask to form pairs of the wirings 71*a* to 71*c* (which serve as source and drain electrode) as illustrated in FIG. 11C.

Then, the impurity semiconductor film 63 to which an impurity element imparting one conductivity type is added is etched and separated using the resist mask. As a result, the pair of source and drain regions 72 can be formed as illustrated in FIG. 11C. Note that in this etching process, the second buffer layer 42 is also partly etched. The second buffer layer 42 which is partly etched and has a depressed portion is referred to as a second buffer layer 43. The source and drain regions and the depressed portion of the buffer layer can be formed in the same process. The depth of the depressed portion of the second buffer layer 43 is set to half to one-third of the thicknesses of the thickest region in the second buffer layer 43, whereby the source region and the drain region can be spaced apart from each other. Accordingly, leakage current between the source region and drain region can be reduced. Then, the resist mask is removed.

Next, dry etching may be performed under such a condition that the second buffer layer 43 which is exposed is not damaged and an etching rate of the second buffer layer 43 is low. Through this step, an etching residue on the second buffer layer 43 between the source and drain regions, a residue of the resist mask, and a contamination source in the apparatus used for removal of the resist mask can be removed, whereby the source and drain regions can be certainly insulated. As a result, leakage current of the thin film transistor can be reduced; therefore, a thin film transistor with small off-current and high withstand voltage can be manufactured. Note that a chlorine gas may be used for an etching gas, for example.

Through the above process, a channel-etched thin film transistor 74 can be formed.

Figure 12A:
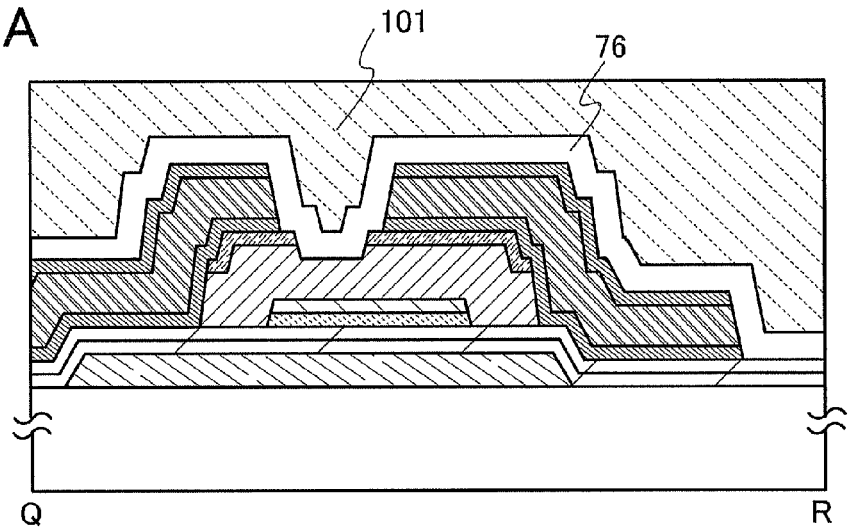
FIGS. 12A to 12C are cross-sectional views illustrating a method for manufacturing a display device according to one aspect of the present invention.

Next, as illustrated in FIG. 12A, a protective insulating film 76 is formed over the wirings 71a to 71c, the source and drain regions 72, the second buffer layer 43, and the gate insulating film 52b. The protective insulating film 76 can be formed in a manner to that of the gate insulating films 52a and 52b. Note that the protective insulating film 76 is provided to prevent intrusion of contaminating impurities such as organic matters, metal, or water vapor contained in the atmosphere; thus, a dense film is preferably used for the protective insulating film 76. Further, by using a silicon nitride film as the protective insulating film 76, the oxygen concentration in the second buffer layer 43 can be $5 \times 10^{19}$ atoms/cm$^3$ or less, preferably $1 \times 10^{19}$ atoms/cm$^3$ or less, so that the second buffer layer 43 can be prevented from being oxidized.

Figure 12B:
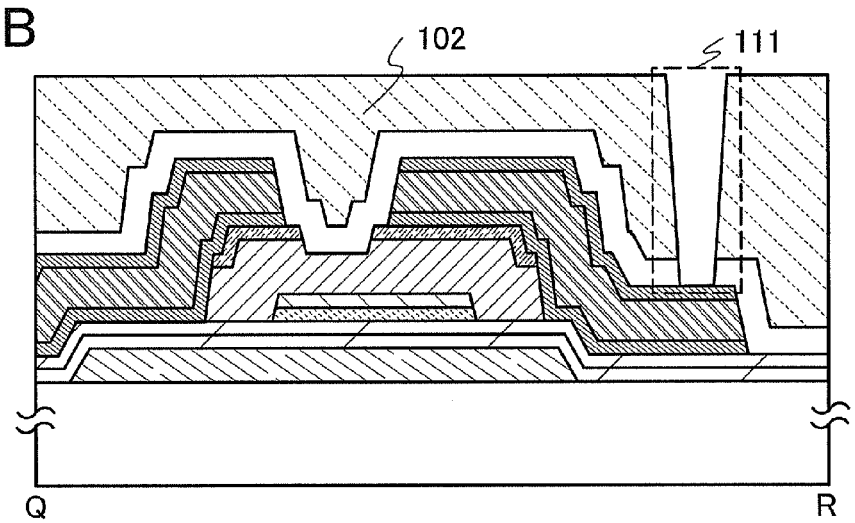

Then, an insulating film 101 is formed over the protective insulating film 76. The insulating film 101 is formed using a photosensitive organic resin here. Then, the insulating film 101 is exposed to light and developed using a fifth photomask to form an insulating film 102 which exposes the protective insulating film 76. Then, the protective insulating film 76 is etched using the insulating film 102 to faun a contact hole 111 which partly exposes the wiring 71c (see FIG. 12B).

Figure 12C:
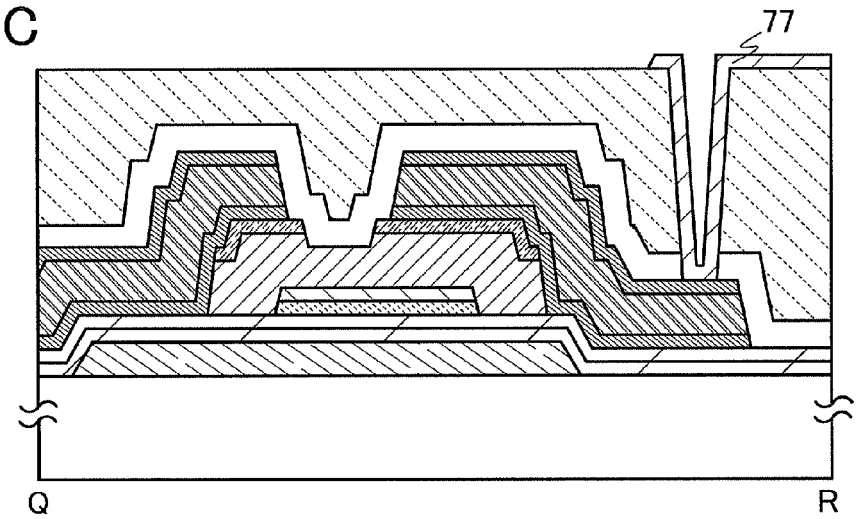

Then, as illustrated in FIG. 12C, a pixel electrode 77 is formed in the contact hole 111. Here, after a conductive film is formed over the insulating film 102, the conductive film is etched using a resist mask which is formed through a photolithography process using a sixth photomask, whereby the pixel electrode 77 is formed.

The pixel electrode 77 can be formed of a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added.

Alternatively, the pixel electrode 77 can be formed using a conductive composition containing a conductive high-molecular compound (also referred to as a conductive polymer). The pixel electrode 77 which is formed of a conductive composition preferably has a sheet resistance of 10000Ω/square or less and a transmittance for light at a wavelength of 550 nm of 70% or more. In addition, the resistivity of the conductive high-molecular compound contained in the conductive composition is preferably 0.1 Ω·cm or less.

As the conductive high-molecular compound, a so-called rt-electron conjugated conductive high-molecular compound can be used. For example, polyaniline or a derivative thereof, polypyrrole or a derivative thereof, polythiophene or a derivative thereof, a copolymer of two or more kinds thereof, and the like can be given.

Here, as the pixel electrode 77, a film of ITO is formed by a sputtering method, and then, a resist is applied to the ITO film. Then, the resist is exposed to light and developed using the sixth photomask. Then, the ITO film is etched using the resist mask to form the pixel electrode 77.

Figure 13:
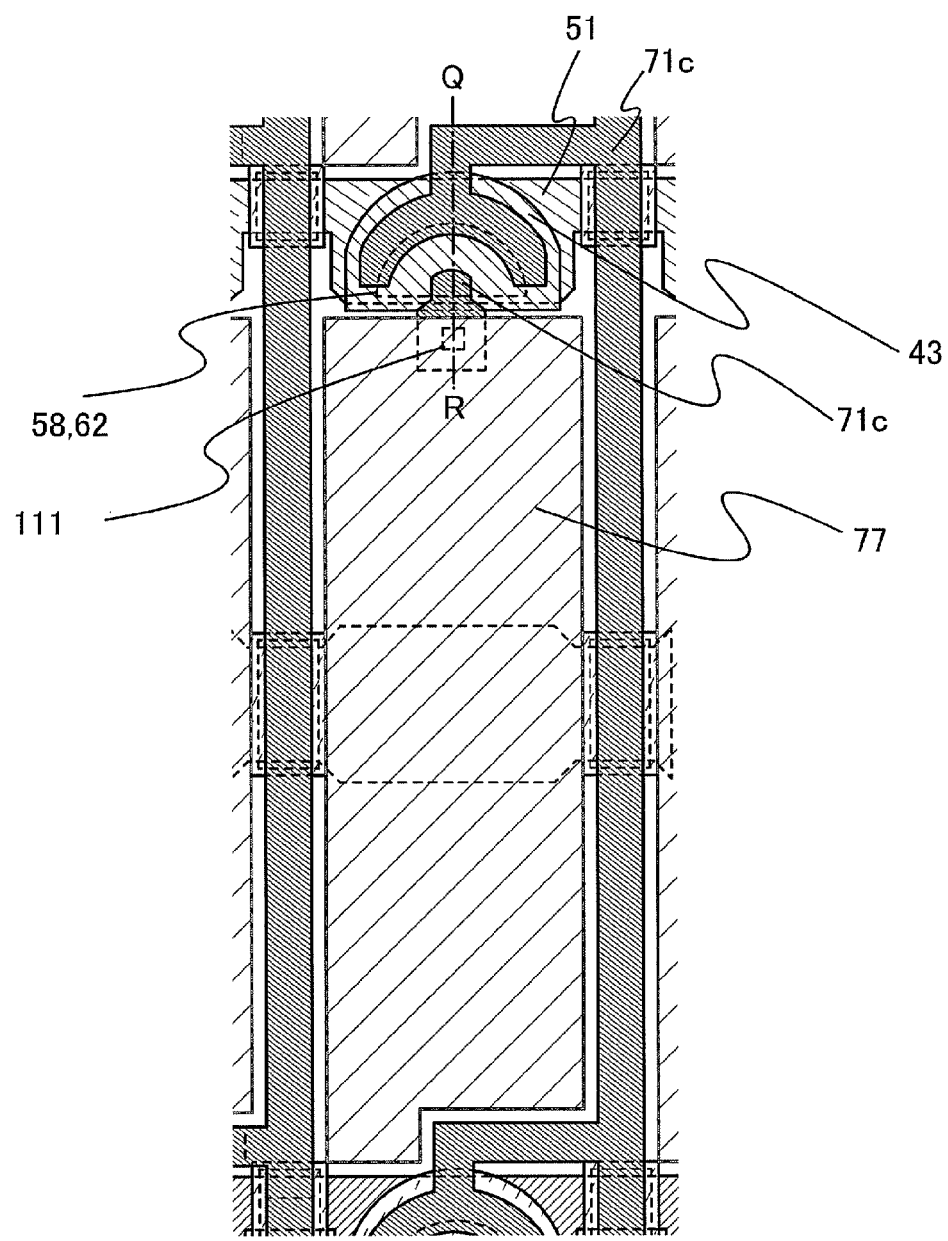
FIG. 13 is a top view illustrating a method for manufacturing a display device according to one aspect of the present invention.

Note that FIG. 12C is a cross-sectional view taken along line Q-R in FIG. 13. In FIG. 13, it is not illustrated that the end portions of source and drain regions 72 are exposed and located beyond the end portion of the wiring 71c. Furthermore, one of the pair of wirings surrounds the other wirings (specifically, the former wiring is in a U-shape or a C-shape). Thus, an area in which carriers travel can be increased, and thus the amount of current can be increased and an area of the thin film transistor can be reduced. In addition, the semiconductor film 58 to which an impurity element serving as a donor is added, the gate insulating films 52a and 52b, and the wirings 71a to 71c overlap over the gate electrode, and thus an influence by unevenness due to the gate electrode is small and reduction in coverage and generation of leakage current can be suppressed.

Further, in the case of a liquid crystal display device, the wirings 71a to 71c which is connected to a signal line serves as a source and the wirings 71a to 71c which is connected to a pixel electrode serves as a drain, and by making the source have a U-shape or a C-shape (that is, the shape with an upper surface shape having a curve around the drain with the insulating film interposed therebetween) with which a region of the source which faces the drain is larger than a region of the drain which faces the source, parasitic capacitance between the gate electrode (gate wiring) and the drain can be reduced. Therefore, a thin film transistor in which voltage drop in the drain electrode side is reduced can be formed. In addition, the display device having such a structure can have improved response speed of pixels. In particular, in the case of thin film transistors formed in pixels in a liquid crystal display device, since drop in drain voltage can be reduced, response speed of a liquid crystal material can be improved.

Through the above process, a thin film transistor and an element substrate which can be used for a display device can be formed.

Although this embodiment mode describes a channel-etched thin film transistor, this embodiment mode can be applied to a channel-protective thin film transistor. In specific, it is possible to form a channel protection film over the second buffer layer and to provide the pair of impurity semiconductor films over the channel protection film and the second buffer layer.

According to this embodiment mode, a high-performance thin film transistor can be manufactured. Accordingly, a driving frequency of a display device can be increased, whereby the panel size can be increased and high density of pixels can be achieved.

(Embodiment Mode 4)

In this embodiment mode, a manufacturing process for a thin film transistor having high field effect mobility and on-current, and low off-current is described. In addition, a process for manufacturing a thin film transistor is described through which the number of photomasks can be less than that in Embodiment Mode 3. Here, as a typical example, a method for manufacturing a thin film transistor of FIG. 2 in Embodiment Mode 1 is described.

Figure 14A:
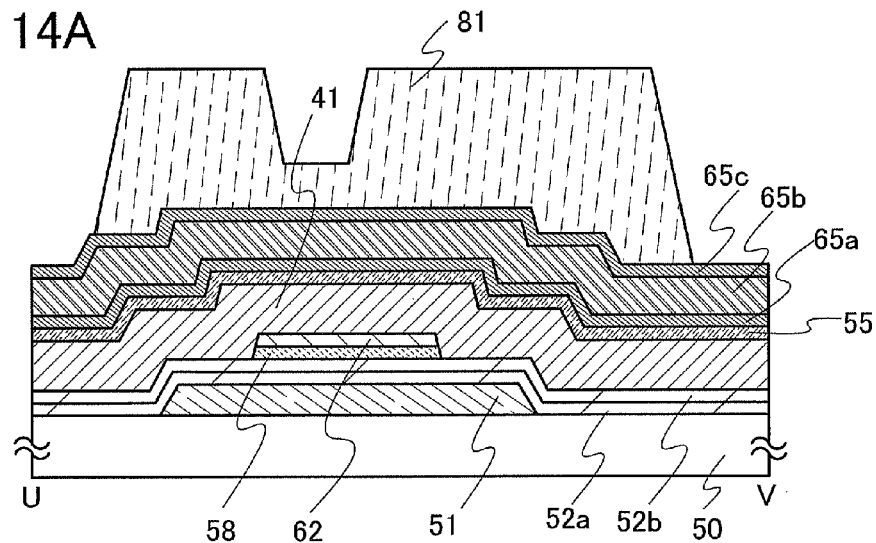
FIGS. 14A to 14C are cross-sectional views illustrating a method for manufacturing a display device according to one aspect of the present invention.

In a manner similar to that in Embodiment Mode 3, as illustrated in FIG. 14A, a conductive film is formed over the substrate 50; a resist is applied to the conductive film; and the conductive film is partly etched using a resist mask which is formed through a photolithography process using the first photomask to form the gate electrode 51. Then, the gate insulating films 52a and 52b are formed over the gate electrode 51. Then, the semiconductor film 58 to which an impurity element serving as a donor is added and the first buffer layer 62 are formed over the gate insulating film 52b through photolithography process using the second photomask. Then, the second buffer layer 41, the impurity semiconductor film 55 to which an impurity element imparting one conductivity type is added, and the conductive films 65a to 65c are formed in that order over the first buffer layer 62. Then, a resist is applied to the conductive film 65c.

As the resist, a positive resist or a negative resist can be used. Here, a positive resist is used.

Then, the resist is irradiated with light using a multi-tone mask as a third photomask, so that the resist is exposed to the light to be a resist mask 81.

Light exposure using a multi-tone mask is described here with reference to FIGS. 15A to 15D.

A multi-tone mask can perform three levels of light exposure to obtain an exposed portion, a half-exposed portion, and an unexposed portion; with which one-time light exposure and development process can form a resist mask with regions of plural thicknesses (typically, two kinds of thicknesses) to be formed. Accordingly, by using a multi-tone mask, the number of photomasks can be reduced.

Figure 15A:
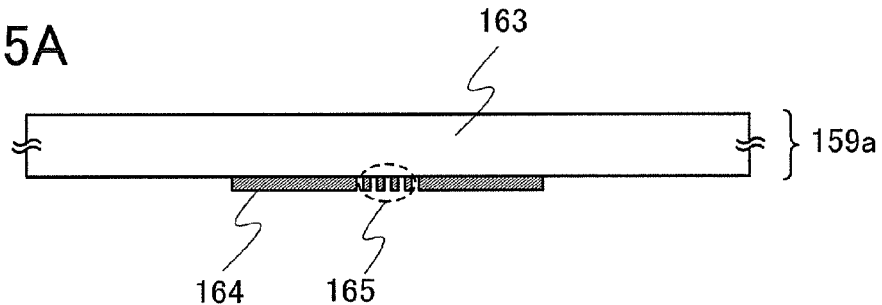
FIGS. 15A to 15D illustrate multi-tone masks applicable to the present invention.
Figure 15B:
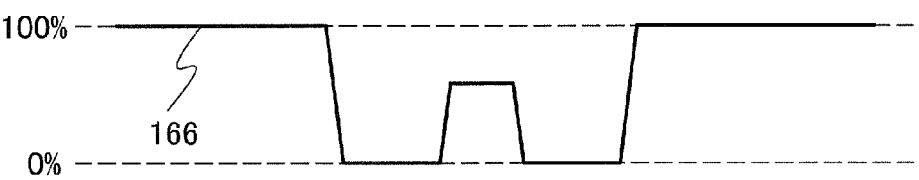
Figure 15C:
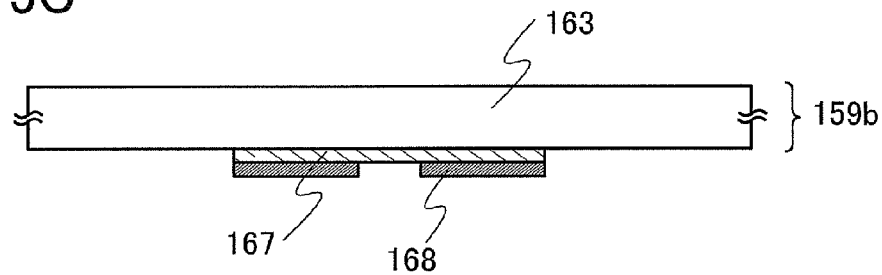

As typical examples of a multi-tone mask, a gray-tone mask 159a illustrated in FIG. 15A and a half-tone mask 159b illustrated in FIG. 15C can be given.

As illustrated in FIG. 15A, the gray-tone mask 159a includes a light-transmitting substrate 163 provided with a light-blocking portion 164 and a diffraction grating 165. The light transmittance of the light-blocking portion 164 is 0%. On the other hand, the diffraction grating 165 has a light transmitting portion in a slit form, a dot form, a mesh form, or the like with intervals of equal to or less than the resolution limit of light used for the exposure, and therefore controls the light transmittance. The diffraction grating 165 can be in a slit form, a dot form, or a mesh form with regular intervals; or in a slit form, a dot form, or a mesh form with irregular intervals.

For the light-transmitting substrate 163, a light-transmitting substrate such as a quartz substrate can be used. The light-blocking portion 164 and the diffraction grating 165 can be formed using a light-blocking material such as chromium or chromium oxide, which absorbs light.

When the gray-tone mask 159a is irradiated with light, a light transmittance 166 of the light-blocking portion 164 is 0% and the light transmittance 166 of a region where neither the light-blocking portion 164 nor the diffraction grating 165 is provided is 100% as illustrated in FIG. 15B. The light transmittance 166 of the diffraction grating 165 can be controlled in a range of 10% to 70%. The light transmittance in the diffraction grating 165 can be controlled by adjusting the interval of slits, dots, or meshes of the diffraction grating and the pitch thereof.

As illustrated in FIG. 15C, the half-tone mask 159b includes the light-transmitting substrate 163 provided with a semi-light-transmitting portion 167 and a light-blocking portion 168. The semi-light-transmitting portion 167 can be formed using MoSiN, MoSi, MoSiO, MoSiON, CrSi, or the like. The light-blocking portion 168 can be formed using a light-blocking material such as chromium or chromium oxide, which absorbs light.

Figure 15D:
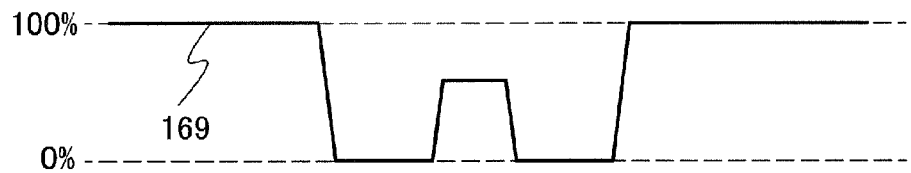

When the half-tone mask 159b is irradiated with light, a light transmittance 169 of the light-blocking portion 168 is 0% and the light transmittance 169 of the region where neither the light-blocking portion 168 nor the semi-light-transmitting portion 167 is provided is 100% as illustrated in FIG. 15D. The light transmittance 169 of the semi-light-transmit-ting portion 167 can be controlled in a range of 10% to 70%. The light transmittance in the semi-light-transmitting portion 167 can be controlled by a material of the semi-light-transmitting portion 167.

After light exposure using the multi-tone mask, development is carried out, whereby the resist mask 81 including regions having different thicknesses can be formed, as illustrated in FIG. 14A.

Figure 14B:
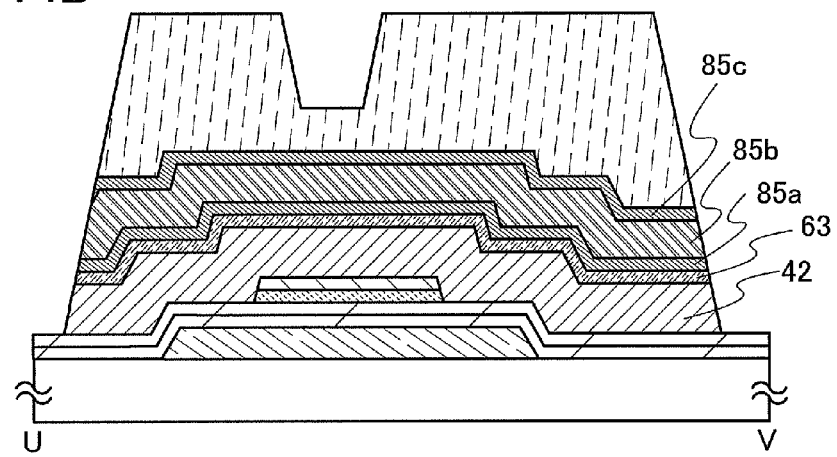

Next, with the resist mask 81, the second buffer layer 41, the impurity semiconductor film 55 to which an impurity element imparting one conductivity type is added, and the conductive films 65a to 65c are etched and separated. As a result, the second buffer layer 42, the impurity semiconductor film 63 to which an impurity element imparting one conductivity type is added, and conductive films 85a to 85c as illustrated in FIG. 14B can be formed.

Figure 14C:
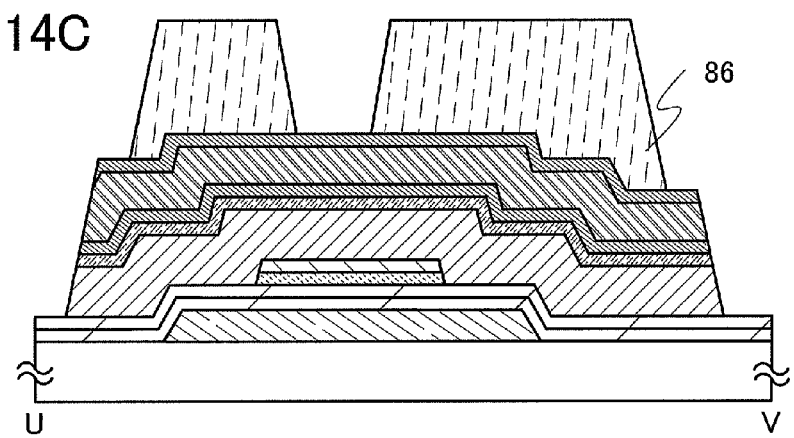

Next, ashing is performed on the resist mask 81. As a result, the areas and the thickness of the resist are reduced. Accordingly, a region of the resist having a small thickness (a region overlapping with a part of the gate electrode 51) is removed to form a separated resist mask 86 as illustrated in FIG. 14C.

Figure 16A:
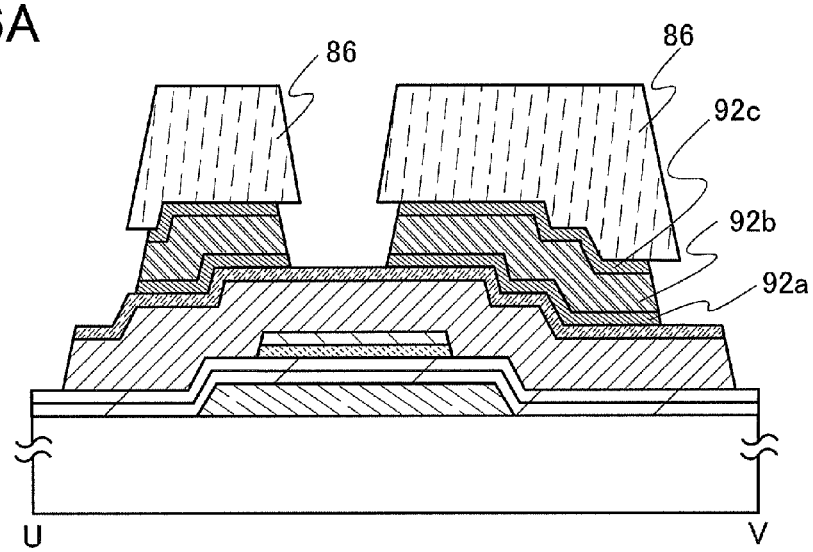
FIGS. 16A to 16C are cross-sectional views illustrating a method for manufacturing a display device according to one aspect of the present invention.

Then, the conductive films 85a to 85c are etched and separated using the resist mask 86. As a result, pairs of wirings 92a to 92c as illustrated in FIG. 16A, can be formed. By wet etching the conductive films 85a to 85c using the resist mask 86, the conductive films 85a to 85c are etched isotropically. As a result, the wirings 92a to 92c with smaller areas than the resist mask 86 can be formed.

Figure 16B:
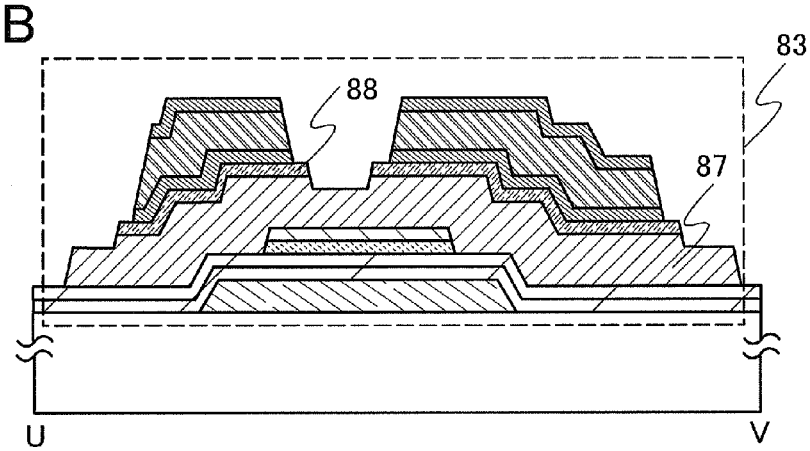

Then, the impurity semiconductor film 63 to which an impurity element imparting one conductivity type is added is etched using the resist mask 86 to form the pair of source and drain regions 88 as illustrated in FIG. 16B. Note that the second buffer layer 42 is also etched partly in this etching step. The partly etched second buffer layer is referred to as a second buffer layer 87. Note that the second buffer layer 87 has a depressed portion. The source and drain regions and the depressed portion of the second buffer layer can be formed in the same process. Here, the second buffer layer 87 is partly etched using the resist mask 86 having a smaller area than the resist mask 81; accordingly, the second buffer layer 87 is protruded from the source and drain regions 88. In addition, the end portions of the wirings 92a to 92c are not aligned with those of the source and drain regions 88, and the end portions of the source and drain regions 88 are located beyond the end portions of the wirings 92a to 92c. After that, the resist mask 86 is removed.

Next, dry etching may be performed under such a condition that the buffer layer which is exposed is not damaged and an etching rate of the buffer layer is low. Through this step, an etching residue on the buffer layer between the source and drain regions, a residue of the resist mask, and a contamination source in the apparatus used for removal of the resist mask can be removed, whereby the source and drain regions can be certainly insulated. As a result, leakage current of the thin film transistor can be reduced; therefore, a thin film transistor with small off-current and high withstand voltage can be manufactured. Note that a chlorine gas may be used for an etching gas, for example.

Through the above process, a channel-etched thin film transistor 83 can be formed. In addition, the thin film transistor can be formed using two photomasks.

Figure 16C:
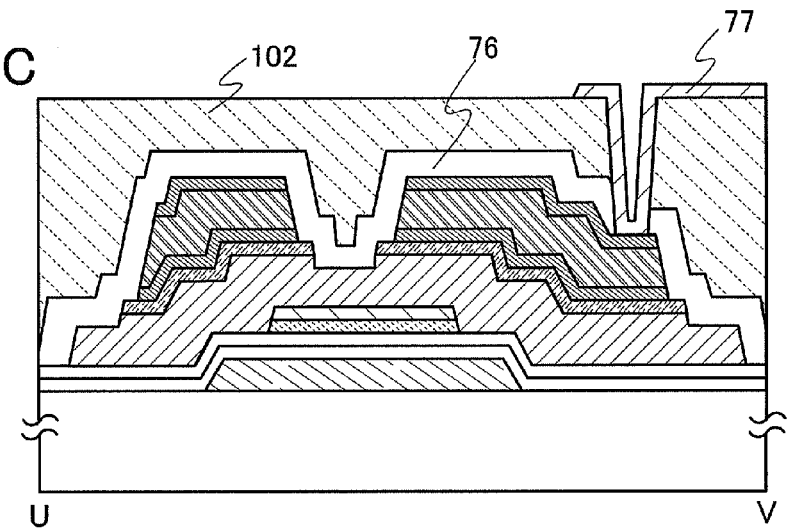

After that, through a process similar to the process in Embodiment Mode 3, the protective insulating film 76 and the insulating film 102 are formed over the wiring 92a to 92c, the source and drain regions 88, the second buffer layer 87, and the gate insulating film 52b, then, a contact hole is formed through a photolithography process using a fourth photomask as illustrated in FIG. 16C.

Figure 17:
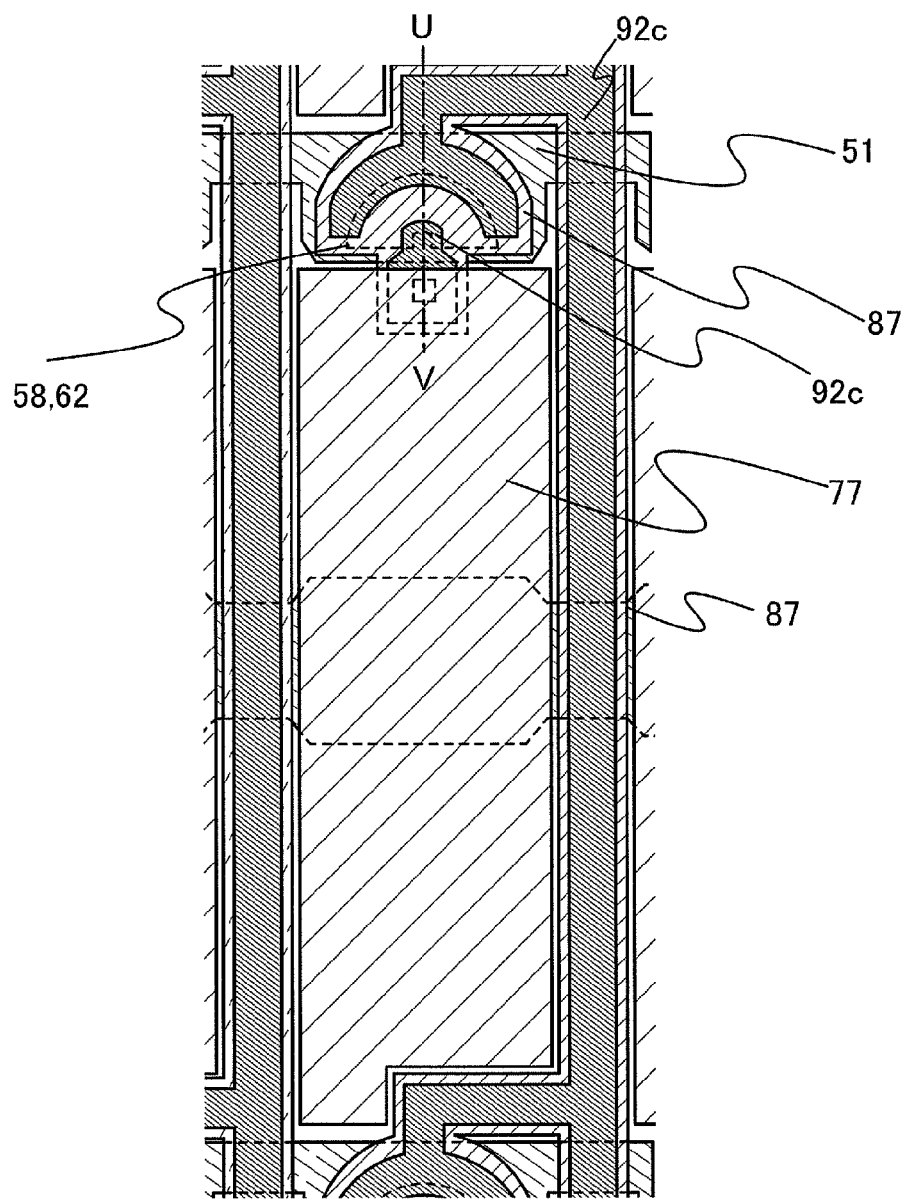
FIG. 17 is a top view illustrating a method for manufacturing display device according to one aspect of the present invention.

Then, the pixel electrode 77 is formed over the insulating film 102 through a photolithography process using a fifth photomask. Note that FIG. 16C is a cross-sectional view taken along line U-V in FIG. 17.

Through the above process, an element substrate having a thin film transistor which can be used for a display device can be formed with photomasks the number of which is reduced by one compared to the number in Embodiment Mode 3.
(Embodiment Mode 5)

In this embodiment mode, a manufacturing process for a thin film transistor having high mobility and on-current, and low off-current is described below. Here, as a typical example, a method for manufacturing a thin film transistor of FIG. 3 in Embodiment Mode 1 is described.

Figure 18A:
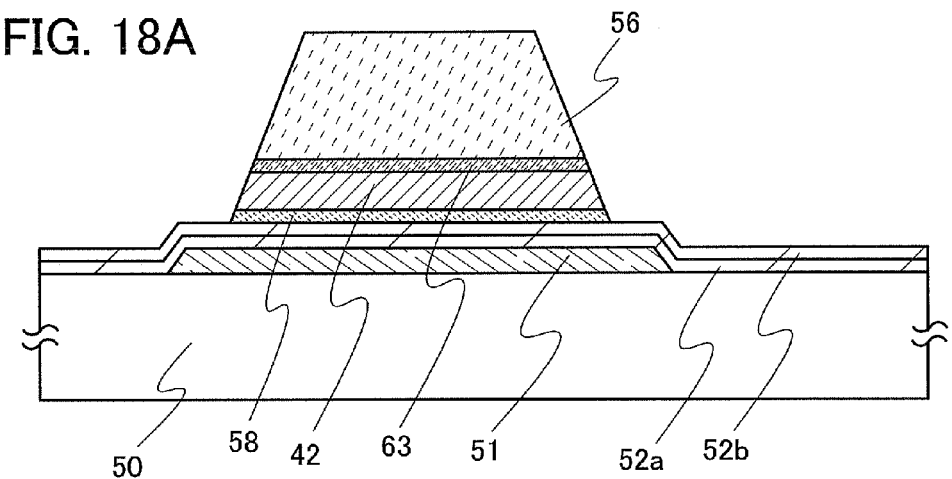
FIGS. 18A to 18C are cross-sectional views illustrating a method for manufacturing a display device according to one aspect of the present invention.

In a manner similar to that in. Embodiment Mode 3, the gate electrode 51 and the gate insulating films 52a and 52b are formed over the substrate 50. Then, a semiconductor film to which an impurity element serving as a donor is added is formed over the gate insulating film 52b, and a buffer layer and an impurity semiconductor film to which an impurity element imparting one conductivity type is added are formed in that order over the semiconductor film. Then, a resist mask 56 is formed over the impurity semiconductor film to which an impurity element imparting one conductivity type is added, and the impurity semiconductor film to which an impurity element imparting one conductivity type is added, the buffer layer, and the semiconductor film to which an impurity element serving as a donor is added are etched, whereby the semiconductor film 58 to which an impurity element serving as a donor is added, the buffer layer 42, and the impurity semiconductor film 63 to which an impurity element imparting one conductivity type is added are formed as illustrated in FIG. 18A.

Figure 18B:
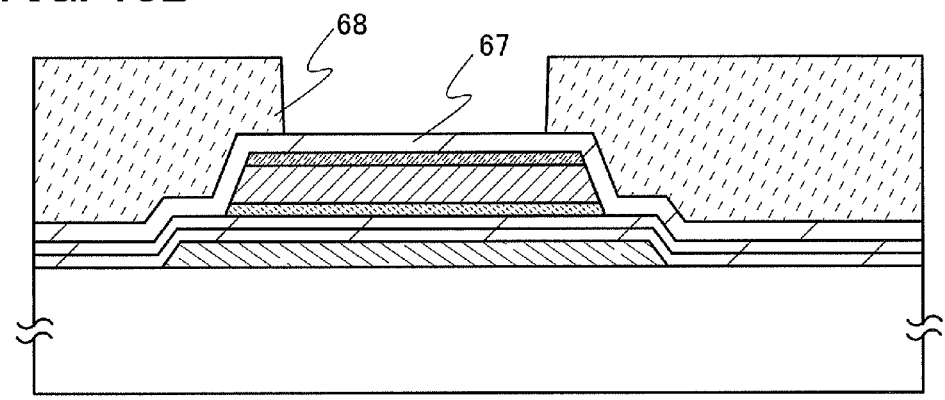

Then, as illustrated in FIG. 18B, the insulating film 67 is formed over the impurity semiconductor film 63 to which an impurity element imparting one conductivity type is added and the gate insulating film 52b. The insulating film 67 can be formed using a material similar to the material for the gate insulating films 52a and 52b as appropriate.

Then, a resist mask 68 is formed over the insulating film 67. The resist mask 68 is provided to form an insulating film by partly etching the insulating film 67. The insulating film is provided in a manner such that the wirings which are formed later are prevented from being in contact with the semiconductor film 58 to which an impurity element serving as a donor is added, and are in contact with the impurity semiconductor film 63 to which an impurity element imparting one conductivity type is added. The resist mask 68 preferably has an opening which is smaller than an area of an upper surface of the insulating film 63 to which an impurity element imparting one conductivity type is added.

Figure 18C:
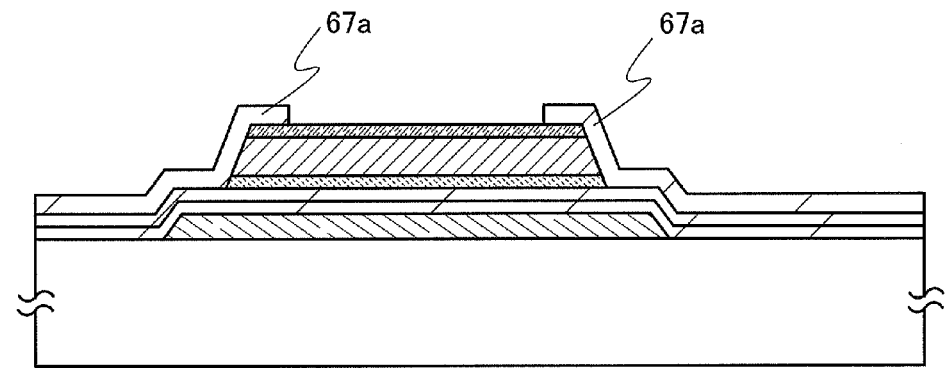

Then, as illustrated in FIG. 18C, the insulating film 67 is etched using the resist mask 68 to form the insulating film 67a which covers an end portion of the impurity semiconductor film 63 to which an impurity element imparting one conductivity type is added.

Figure 19A:
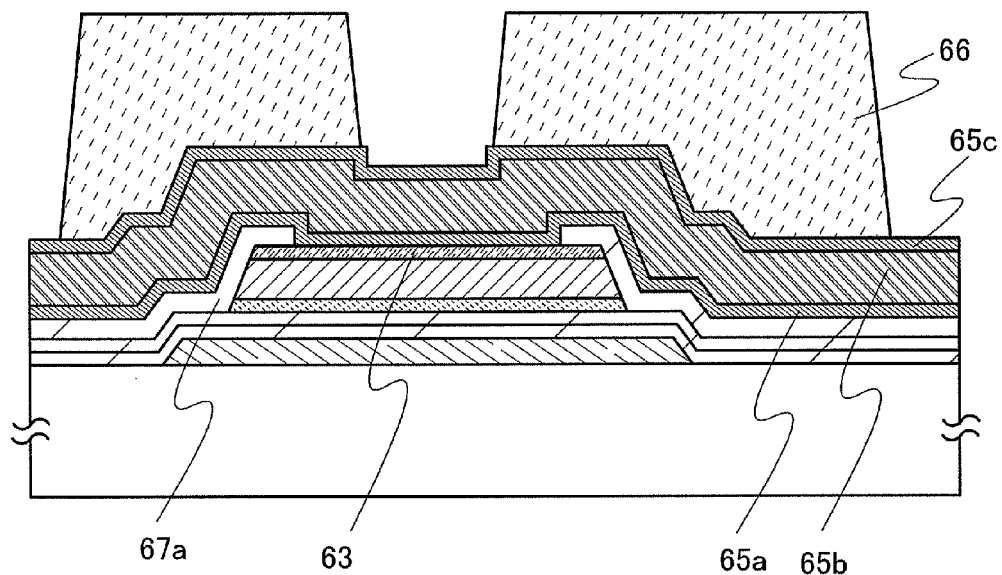
FIGS. 19A and 19B are cross-sectional views illustrating a method for manufacturing a display device according to one aspect of the present invention.

Then, as illustrated in FIG. 19A, the conductive films 65a to 65c are formed over the insulating film 67a and the impurity semiconductor film 63 to which the impurity element imparting one conductivity type is added as in Embodiment Mode 3, and a resist mask 66 is formed over the conductive films 65a to 65c.

Figure 19B:
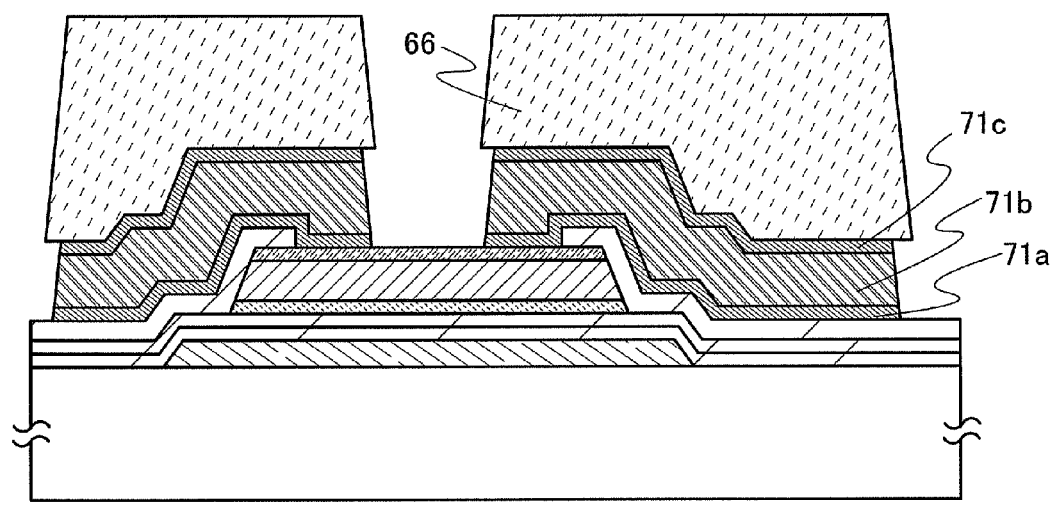

Then, as illustrated in FIG. 19B, the wirings 71a to 71c are formed by etching the conductive films 65a to 65c using the resist mask 66.

Figure 20A:
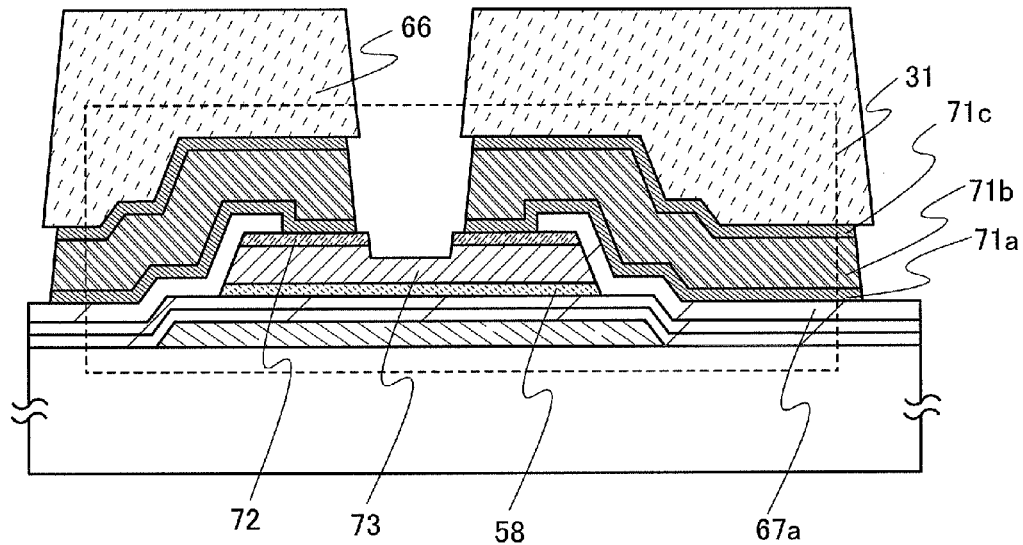
FIGS. 20A to 20C are cross-sectional views illustrating a method for manufacturing a display device according to one aspect of the present invention.

Then, the impurity semiconductor film 63 to which an impurity element imparting one conductivity type is added is etched and separated using the resist mask 66. As a result, the pair of source and drain regions 72 can be formed as illustrated in FIG. 20A. Note that in this etching process, the buffer layer 42 is also partly etched. The buffer layer 42 which is partly etched and has a depressed portion is referred to as the buffer layer 73.

Through the above process, a channel-etched thin film transistor 31 can be formed. Since the semiconductor film 58 to which an impurity element serving as a donor is added and the wirings 71a to 71c are isolated by the insulating film 67a, leakage current between the semiconductor film 58 to which an impurity element serving as a donor is added and the wirings 71a to 71c can be reduced. Accordingly, a thin film transistor with low off-current can be formed.

Figure 20B:
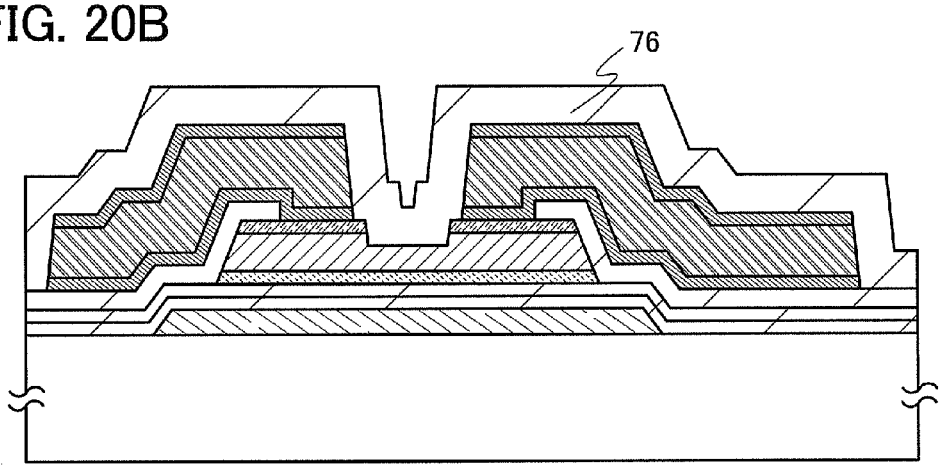
Figure 20C:
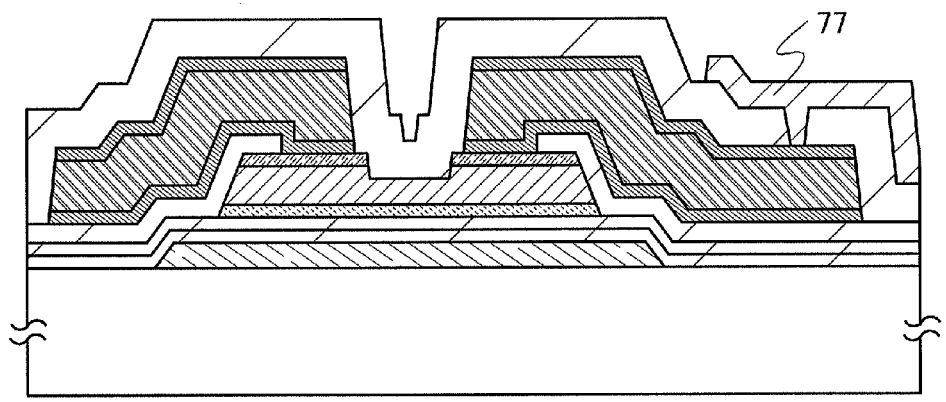

Then, as illustrated in FIG. 20B, the protective insulating film 76 is formed over the wiring 71c and the gate insulating film 52b in a manner similar to that in Embodiment Mode 3. Then, the protective insulating film 76 is partly etched to form a contact hole and expose the wiring 71c partly. Then, as illustrated in FIG. 20C, the pixel electrode 77 is formed in the contact hole as in Embodiment Mode 3. Through the above process, an element substrate can be manufactured.

Through the above process, an element substrate having a thin film transistor with low off-current can be manufactured. By using the element substrate, a display device with high contrast can be manufactured.
(Embodiment Mode 6)

Next, a method for manufacturing a channel-protective thin film transistor, as illustrated in FIG. 4, in which leakage current can be reduced is described below.

In a manner similar to that of Embodiment Mode 3, the gate electrode 51 and the gate insulating films 52a and 52b are formed over the substrate 50. Then, through a process similar to the process in Embodiment Mode 5, a semiconductor film to which an impurity element serving as a donor is added is formed over the gate insulating film 52b. Then, a buffer layer is formed over the semiconductor film. Then, a resist mask is formed over the buffer layer, and then the buffer layer and the semiconductor film to which an impurity element serving as a donor is added are etched to form the semiconductor film 58 to which an impurity element serving as a donor is added and the buffer layer 42.

Figure 21A:
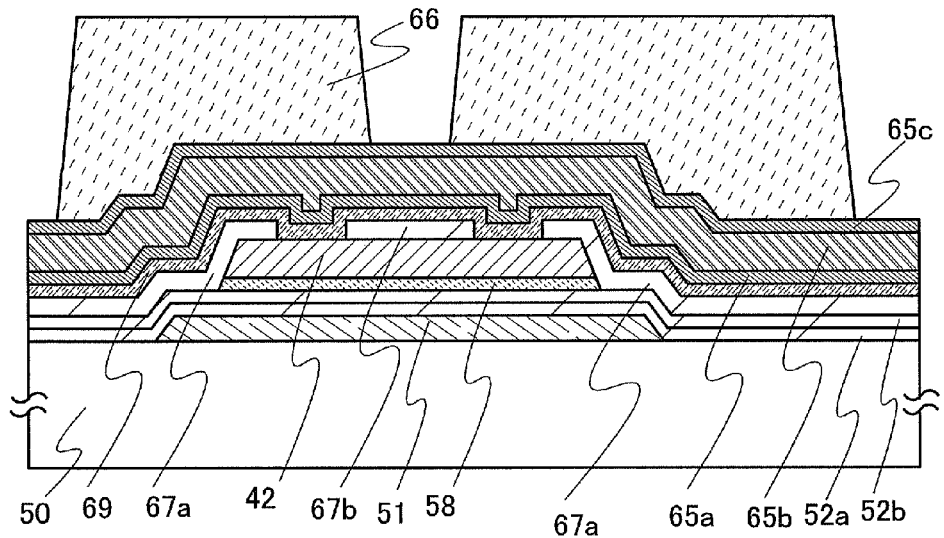
FIGS. 21A to 21C are cross-sectional views illustrating a method for manufacturing a display device according to one aspect of the present invention.

Then, the insulating film 67 as illustrated in FIG. 18B is formed over the buffer layer 42, and the gate insulating film 52b. Then, a resist mask is formed over the insulating film 67 and the insulating film 67 is etched using the resist mask to form the insulating films 67a, and 67b as illustrated in FIG. 21A. Note that one contact hole may be formed around the insulating film 67b. In that case, the insulating film 67a and the insulating film 67b are separated. Alternatively, a pair of contact holes may be formed. In that case, the insulating film 67a and the insulating film 67b are connected to each other. As a result, the insulating film 67a which covers an end portion of the buffer layer can be formed over the buffer layer 42 as well as the insulating film 67b which serves as a channel protection film in the thin film transistor which is completed later.

Then, the impurity semiconductor film 69 to which an impurity element imparting one conductivity type is added is formed over the gate insulating film 52b, an exposed portion of the buffer layer 42, and the insulating films 67a and 67b. The impurity semiconductor film 69 to which an impurity element imparting one conductivity type is added can be formed in a manner similar to the impurity semiconductor film 55 to which an impurity element imparting one conductivity type is added, which is described in Embodiment Mode 3.

Then, the conductive films 65a to 65c are formed over the impurity semiconductor film 69 to which an impurity element imparting one conductivity type is added. Then, the resist mask 66 is formed over the conductive films 65a to 65c.

Figure 21B:
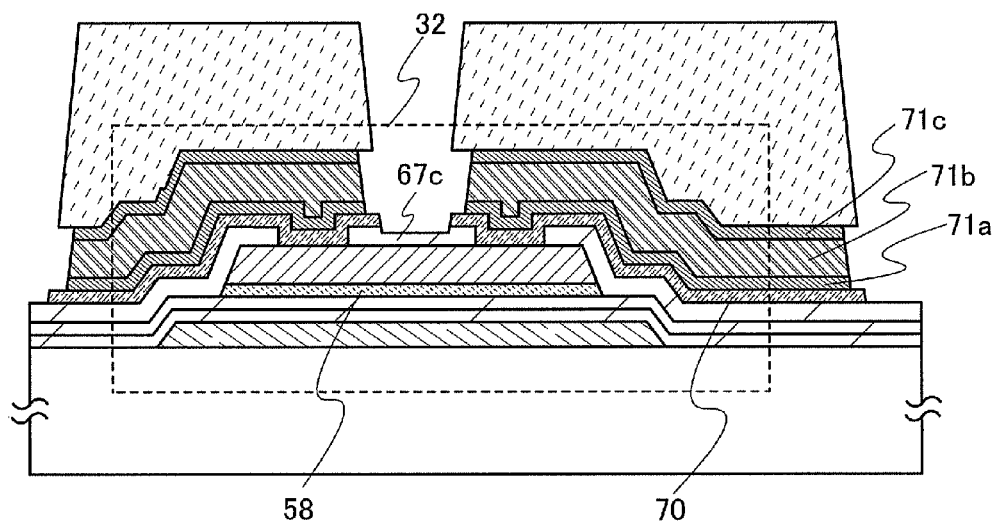

Then, as illustrated in FIG. 21B, the conductive films 65a to 65c are formed using the resist mask 66 to form the wirings 71a to 71c. Then, the impurity semiconductor film 69 to which an impurity element imparting one conductivity type is added is etched and separated using the resist mask 66. As a result, the pair of source and drain regions 70 can be formed as illustrated in FIG. 21B. Note that in this etching process, the insulating film 67b is also partly etched. The insulating film 67b which is partly etched and has a depressed portion is referred to as a channel protection film 67c.

Through the above process, a channel-protective thin film transistor 32 can be formed. Since the semiconductor film 58 to which an impurity element serving as a donor is added and the pair of source and drain regions 70 are isolated by the insulating film 67a, leakage current between the semiconductor film 58 to which an impurity element serving as a donor is added and the pair of source and drain regions 70 can be reduced. Accordingly, a thin film transistor with low off-current can be formed. In addition, the channel protection film 67c can also be formed in formation of the insulating film 67a for reducing leakage current.

Figure 21C:
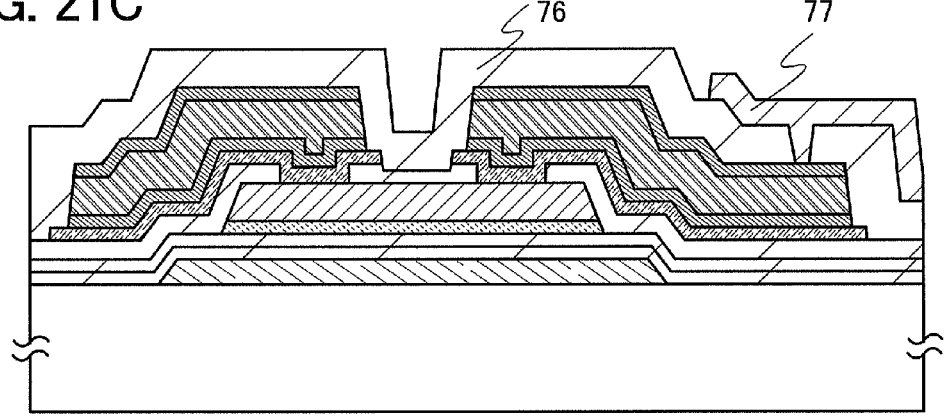

Then, the protective insulating film 76 and the pixel electrode 77 which is in contact with the wiring 71c through the protective insulating film 76 are formed as illustrated in FIG. 21C, whereby an element substrate can be manufactured.

Through the above process, an element substrate having a thin film transistor with low off-current can be manufactured. By using the element substrate, a display device with high contrast can be manufactured.

(Embodiment Mode 7)

Next, a method for manufacturing a thin film transistor as illustrated in FIG. 5, in which leakage current can be reduced is described below.

After forming the wirings 71a to 71c, which are illustrated in FIG. 11C and described in Embodiment Mode 3, the wirings 92a to 92c, which are illustrated in FIG. 16B and described in Embodiment Mode 4, the wirings 71a to 71c, which are illustrated in FIG. 19B and described in Embodiment Mode 5, or the wirings 71a to 71c, which are illustrated in FIG. 4 and described in Embodiment Mode 6; the resist mask 66 or 86 is removed. Then, the impurity semiconductor film to which an impurity element imparting one conductivity type is added may be etched using the wirings 71a to 71c or the wiring 92a to 92c as a mask. As a result, a thin film transistor as illustrated in FIG. 5 in which end portions of the wirings 71a to 71c or 92a to 92c are aligned with end portions of the source and drain region 70, 72, or 88 can be formed.

(Embodiment Mode 8)

Next, a method for manufacturing a thin film transistor as illustrated in FIG. 7, in which leakage current can be reduced is described below.

FIG. 7 illustrates a mode of a thin film transistor in which, instead of the semiconductor film 58 to which an impurity element serving as a donor is added in the thin film transistors described in Embodiment Modes 1 to 7, crystal grains 60 to which an impurity element serving as a donor is added are dispersed over the gate insulating film 52b, and the semiconductor film 61 containing germanium as its main component is formed over the gate insulating film 52b and the crystal grains 60 to which an impurity element serving as a donor is added. In addition, the buffer layer 42a which covers an upper surface and side surface of the semiconductor film 61 containing germanium as its main component is formed. Since the semiconductor film containing germanium as its main component has higher mobility than the crystal grains containing silicon as its main component and to which an impurity element serving as a donor is added, carriers move through the semiconductor film containing germanium as its main component. Therefore, a film with low resistivity can be formed over the gate insulating film 52b.

In a manner similar to that in Embodiment Mode 3, the crystal grains 60 to which an impurity element serving as a donor is added are formed as follows. A microcrystalline semiconductor film or amorphous semiconductor film to which an impurity element serving as a donor is added is formed over the gate insulating film 52b. Then, the microcrystalline semiconductor film or amorphous semiconductor film to which an impurity element serving as a donor is added is exposed to plasma to form the crystal grains 60. As plasma, any one or more of hydrogen, fluorine, and fluoride gas are introduced into a reaction chamber of a plasma CVD apparatus, then, a high-frequency power is applied to generate plasma.

Any one or more of fluorine, a fluoride gas, and hydrogen are introduced, and high-frequency power is applied, whereby hydrogen plasma or fluorine plasma is generated. Hydrogen plasma introduces hydrogen to a reaction chamber so that plasma is generated. The fluorine plasma introduces fluorine or a fluoride gas to a reaction chamber so that plasma is generated. As examples of a fluoride gas, HF, $SiF_4$, $SiHF_3$, $SiH_2F_2$, $SiH_3F$, $Si_2F_6$, $GeF_4$, $GeHF_3$, $GeH_2F_2$, $GeH_3F$, $Ge_2F_6$, and the like are given. Note that, as well as fluorine, a fluoride gas, or hydrogen, a rare gas may be introduced to a reaction chamber so that rare gas plasma is generated.

Hydrogen radicals or fluorine radicals are generated in plasma by hydrogen plasma, fluorine plasma, or the like. The hydrogen radicals react with an amorphous component in a microcrystalline semiconductor film or an amorphous semiconductor film to which an impurity element serving as a donor is added to crystallize a part of the semiconductor film and to etch the amorphous component. The fluorine radicals etch an amorphous component in the microcrystalline semiconductor film or the amorphous semiconductor film to which an impurity element serving as a donor is added. Accordingly, crystal grains with high crystallinity can be left. In the case where an amorphous semiconductor film to which an impurity element serving as a donor is formed over the gate insulating film 52b, an amorphous semiconductor component is etched and partly crystallized to form crystal grains. Thus, an amorphous semiconductor component at an interface with the gate insulating film is also etched by plasma. Accordingly, crystal grains having high crystallinity can be formed over the gate insulating film.

As for a method for generating plasma, the HF band (3 MHz to 30 MHz, typically 13.56 MHz or 27.12 MHz) or the VHF band of more than 30 MHz to about 300 MHz, typically 60 MHz is preferably used. Further, high-frequency plasma with a frequency of, for example, 1 GHz or 2.45 GHz can be used. In particular, by using high-frequency power of 13.56 MHz, uniformity of plasma can be increased. Thus, a germanium film can be exposed to plasma with high uniformity even over a large-sized substrate of the sixth to tenth generations. This is favorable for mass production.

Then, a film containing germanium as its main component over the crystal grains, adhesion between the crystal grains and the film containing germanium as its main component can be improved. Further, a microcrystalline germanium film can be formed as the semiconductor film 61 containing germanium as its main component can be formed by crystal growth using the crystal grains as crystal nucleus.

In the case of forming the semiconductor film 61 containing germanium as its main component by a CVD method, together with hydrogen, a deposition gas containing germanium is introduced into a reaction chamber of a plasma CVD apparatus and high-frequency power is applied to generate plasma, thus an amorphous germanium film or a microcrystalline germanium film is formed as the semiconductor film 61 containing germanium as its main component. Alternatively, together with hydrogen and a deposition gas containing germanium, a deposition gas containing silicon is used to form an amorphous silicon germanium film or a microcrystalline silicon germanium film.

Note that one mode for forming an amorphous germanium film as a semiconductor film 61 containing germanium as its main component is that an amorphous germanium film can be formed by glow discharge plasma using a deposition gas containing germanium in a reaction chamber. Alternatively, a deposition gas containing germanium is diluted with one or plural kinds of rare gas elements selected from helium, argon, krypton, and neon, and thus an amorphous germanium film can be formed by glow discharge plasma. Further alternatively, an amorphous germanium film can be formed by glow discharge plasma using hydrogen with a flow rate of 1 or more and 10 or less times, preferably 1 or more and 5 or less times a flow rate of a deposition gas containing germanium. Further, by using a deposition gas containing silicon together with hydrogen and a deposition gas containing germanium, an amorphous silicon germanium film can be formed as the semiconductor film 61 containing germanium as its main component.

Further, another mode for forming a microcrystalline amorphous germanium film as the semiconductor film 61 containing germanium as its main component is that a deposition gas containing germanium, which is germane here, and hydrogen and/or a rare gas are mixed in a reaction chamber, and a microcrystalline germanium film is formed by glow discharge plasma. Germane is diluted 10-folds to 2000-folds with hydrogen and/or a rare gas. Thus, a large amount of hydrogen and/or a rare gas is necessary. The substrate heating temperature is 100° C. to 400° C., preferably 250° C. to 350° C. Further, by using a deposition gas containing silicon together with hydrogen and a deposition gas containing germanium, a microcrystalline silicon germanium film is formed as the semiconductor film 61 containing germanium as its main component.

In the process of forming the semiconductor film 61 containing germanium as its main component, glow discharge plasma is generated by applying high-frequency power with a frequency of 1 MHz, to 30 MHz, typically 13.56 MHz or 27.12 MHz, or high-frequency power with a frequency in the VHF band of more than 30 MHz to about 300 MHz, typically 60 MHz. Further, high-frequency plasma with a frequency of, for example, 1 GHz or 2.45 GHz can be used.

After forming the crystal grains to which an impurity element serving as a donor is added and the semiconductor film containing germanium as its main component, instead of the semiconductor film 45 to which an impurity element serving as a donor is added and the first buffer layer 54 which are described in Embodiment Mode 3, the thin film transistor illustrated in FIG. 7 can be manufactured in a process similar to that in Embodiment Mode 3. Further, a thin film transistor can be formed in a process similar to that in any of Embodiment modes 4 to 7.

(Embodiment Mode 9)

In this embodiment mode, manufacture of a thin film transistor having high field effect mobility and on-current, and low off-current is described below. Here, a manufacturing process for a thin film transistor of FIG. 1B is described below.

Figure 22A:
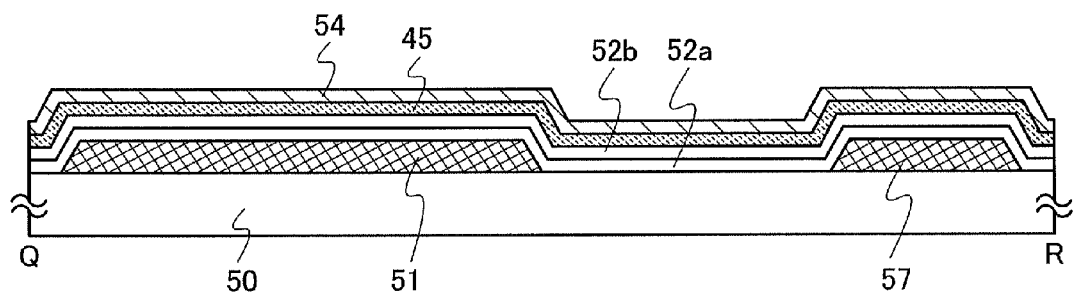
FIGS. 22A to 22C are cross-sectional views illustrating a manufacturing process for a thin film transistor according to one aspect of the present invention.

As illustrated in FIG. 22A, the gate electrode 51 and a capacitor wiring 57 are formed over the substrate 50, and the gate insulating films 52a and 52b are formed over the gate electrode 51 and the capacitor wiring 57.

Then, the semiconductor film 45 to which an impurity element serving as a donor is added is formed over the gate insulating film 52b. Here, as a mode of the semiconductor film 45 to which an impurity element serving as a donor is added, a microcrystalline silicon film containing phosphorus is formed.

Then, the first buffer layer 54 is formed. As the first buffer layer 54, an amorphous semiconductor film can be formed. As an amorphous semiconductor film, an amorphous silicon film, amorphous silicon germanium film, or the like can be given.

The thickness of the first buffer layer 54 is 10 nm to 100 nm, preferably 30 nm to 50 nm.

By forming an amorphous semiconductor film, or, an amorphous semiconductor film containing hydrogen, nitrogen, or a halogen as the first buffer layer 54 on the surface of the semiconductor film 45 to which an impurity element serving as a donor is added, surfaces of crystal grains contained in the semiconductor film 45 to which an impurity element serving as a donor is added can be prevented from being oxidized naturally. In particular, in a region where an amorphous semiconductor is in contact with microcrystalline grains, a crack is likely to be caused due to local stress. When this crack is exposed to oxygen, the crystal grains are oxidized, whereby silicon oxide is formed. However, by forming the first buffer layer 54 on the surface of the semiconductor film 45 to which an impurity element serving as a donor is added, the microcrystalline grains can be prevented from being oxidized.

In addition, it is preferable that the first buffer layer 54 be formed by a plasma CVD method at a temperature of 300° C. to 400° C. after forming the semiconductor film 45 to which an impurity element serving as a donor is added. This film formation treatment supplies hydrogen to the semiconductor film 45, and the same effect as hydrogenating the semiconductor film 45 can be obtained. In other words, by depositing the first buffer layer 54 over the semiconductor film 45 to which an impurity element serving as a donor is added, hydrogen is diffused into the semiconductor film 45 to which an impurity element serving as a donor is added, whereby dangling bonds can be terminated.

Figure 22B:
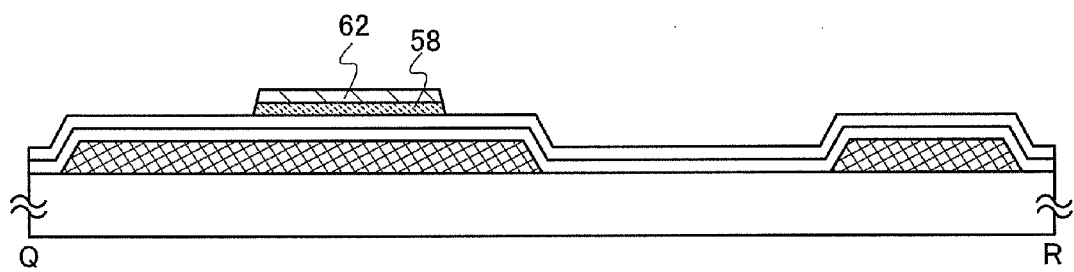
Figure 25A:
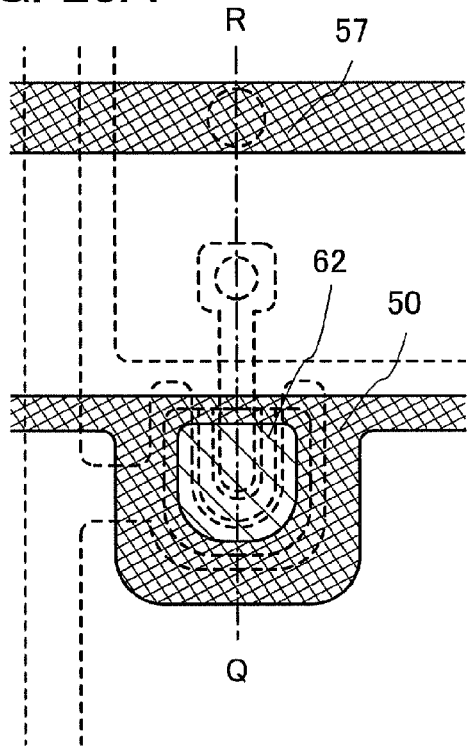
FIGS. 25A to 25D illustrate a manufacturing process for a thin film transistor according to one aspect of the present invention.

Then, a resist is applied over the first buffer layer 54, then, the resist is exposed to light and developed through a photolithography process using a second photomask to form a resist mask. Then, using the resist mask, the first buffer layer 54 and the semiconductor film 45 to which an impurity element serving as a donor is added are etched to form the first buffer layer 62 and the semiconductor film 58 to which an impurity element serving as a donor is added. Then, the resist mask is removed (see FIG. 22B). Note that FIG. 22B is a cross-sectional view taken along line Q-R in FIG. 25A.

Figure 22C:
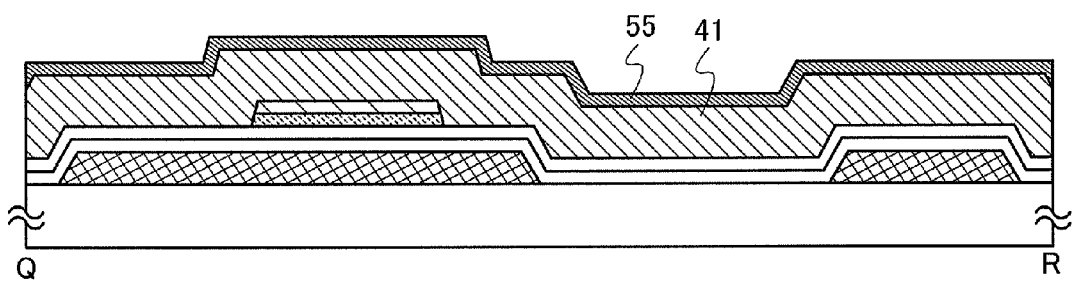

Then, as illustrated in FIG. 22C, the second buffer layer 41 and the impurity semiconductor film 55 to which an impurity element imparting one conductivity type is added are formed over the first buffer layer 62 and the gate insulating film 52b.

The second buffer layer 41 is formed in a manner similar to that of the first buffer layer 54. In some cases, the second buffer layer 41 is partly etched in a later step of formation of source and drain regions, and therefore is preferably formed with a thickness such that the second buffer layer 41 is partly left after the etching. Typically, it is preferable to form the second buffer layer 41 with a thickness of 30 nm or more and 500 nm or less, preferably 50 nm or more and 200 nm or less.

In a display device in which high voltage (e.g., about 15 V) is applied to thin film transistors, typically, in a liquid crystal display device, if the first buffer layer 54 and the second buffer layer 41 are formed thick, withstand voltage is increased. Therefore, deterioration of the thin film transistors can be prevented even if high voltage is applied to the thin film transistors.

Since the first buffer layer 54 and the second buffer layer 41 are formed using an amorphous semiconductor film or an amorphous semiconductor film containing hydrogen or a halogen, the first buffer layer 54 and the second buffer layer 41 have a larger energy gap than the semiconductor film 45 to which an impurity element is added, and higher resistivity. In addition the mobility of the first buffer layer 54 and the second buffer layer 41 is as low as one-fifth to one-tenth of that of the semiconductor film 45. Therefore, in a thin film transistor which is completed later, the first buffer layer and the second buffer layer, which are formed between the source and drain regions and the semiconductor film 45 to which an impurity element serving as a donor is added, serve as high resistance regions and the semiconductor film 45 to which an impurity element is added serves as a channel formation region; therefore, off-current of the thin film transistor can be reduced. When the thin film transistor is used as a switching element in a display device, the contrast of the display device can be improved.

If an n-channel thin film transistor is formed, phosphorus, which is a typical impurity element, may be added to the impurity semiconductor film 55 to which an impurity element imparting one conductivity type is added; for example, an impurity gas such as $PH_3$ may be added to a deposition gas containing silicon or germanium. If a p-channel thin film transistor is formed, boron, which is a typical impurity element, may be added; for example, a gas containing an impurity element such as $B_2H_6$ may be added to a gas which contains a deposition gas containing silicon or germanium.

Then, a resist mask is formed over the impurity semiconductor film 55 to which an impurity element imparting one conductivity type is added. The resist mask is formed by a photolithography technique. Here, a resist which is applied over the impurity semiconductor film 55 to which an impurity element imparting one conductivity type is added is exposed to light and developed using a third photomask to form the resist mask.

Figure 23A:
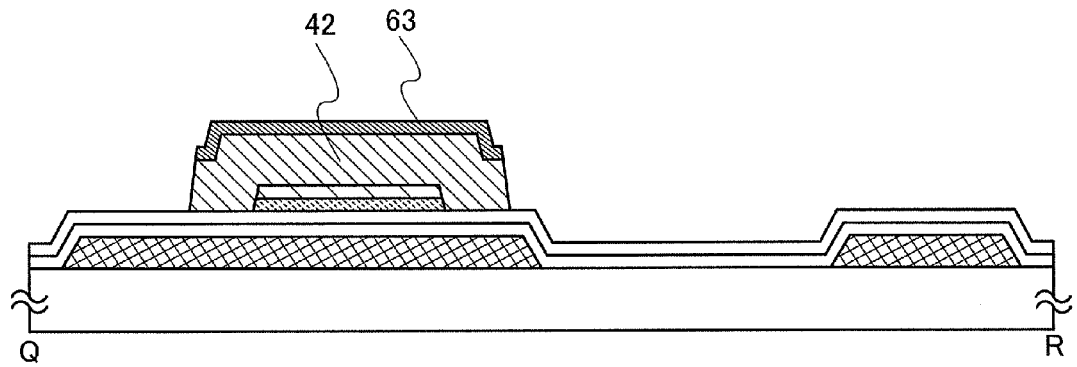
FIGS. 23A to 23C are cross-sectional views illustrating a manufacturing process for a thin film transistor according to one aspect of the present invention.
Figure 25B:
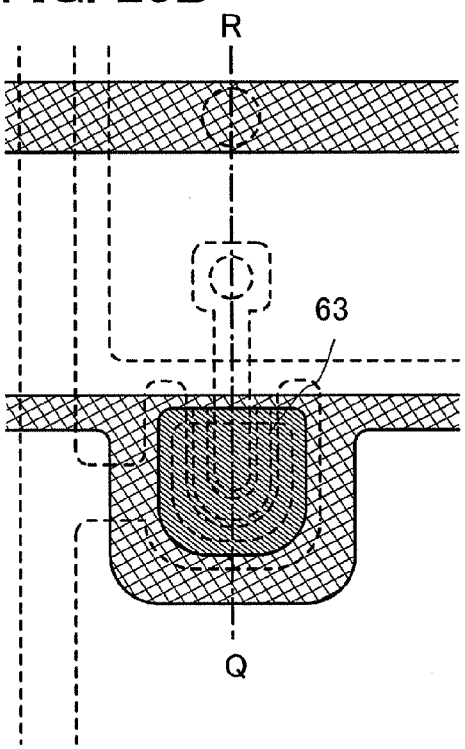

Then, using the resist mask, the second buffer layer 41 and the impurity semiconductor film 55 to which an impurity element imparting one conductivity type is added are etched and separated to form the second buffer layer 42 and the impurity semiconductor film 63 to which an impurity element imparting one conductivity type is added as illustrated in FIG. 23A. Then, the resist mask is removed. Note that FIG. 25B is a cross-sectional view taken along line Q-R in FIG. 25B.

The second buffer layer 42 covers the semiconductor film 58 to which an impurity element serving as a donor is added, whereby leakage current between source and drain regions formed over the second buffer layer 42 between the semiconductor film 58 can be prevented. In addition, leakage current between a wiring and the semiconductor film 58 can be prevented.

Figure 23B:
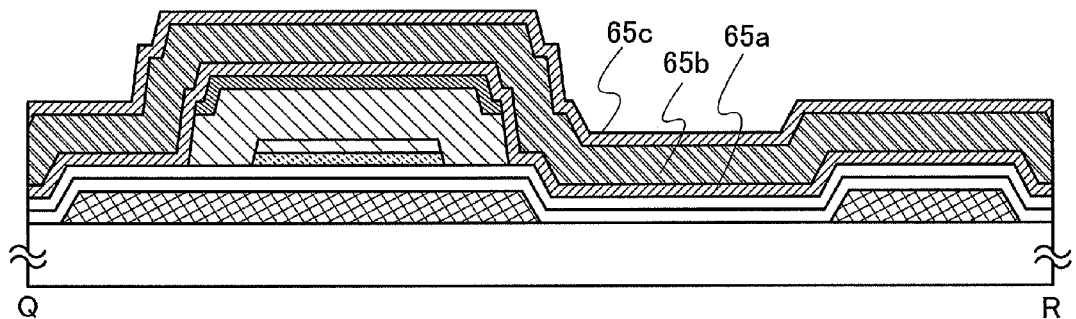

Then, as illustrated in FIG. 23B, the conductive films 65a to 65c are formed over the impurity semiconductor film 63 to which an impurity element imparting one conductivity type is added and the gate insulating film 52b.

The conductive films 65a to 65c can be formed using any of the metal materials which are listed as materials for the wirings 71a to 71c in the above embodiment modes.

Then, a resist mask is formed over the conductive film 65c through a photolithography process using a fourth photomask.

Figure 23C:
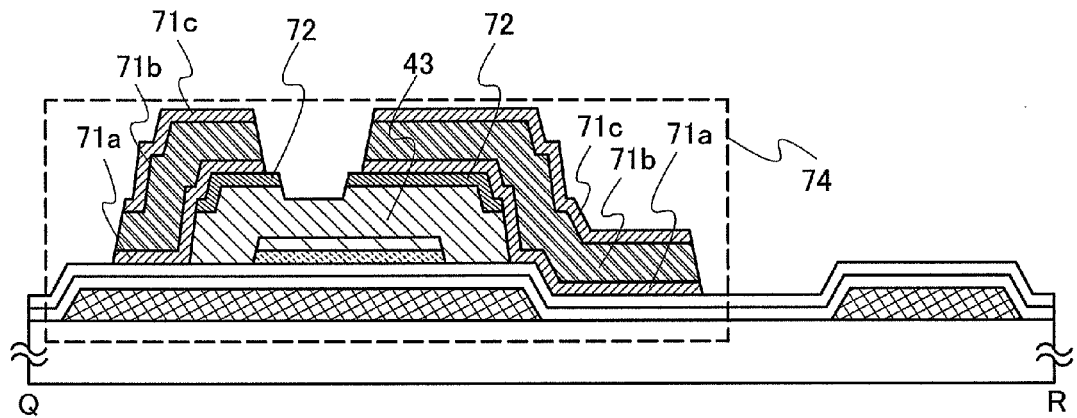

Then, the conductive films 65a to 65c are etched using the resist mask to fond the pairs of the wirings 71a to 71c (which serve as source and drain electrode) as illustrated in FIG. 23C.

Then, the impurity semiconductor film 63 to which an impurity element imparting one conductivity type is added is etched and separated using the resist mask. As a result, the pair of source and drain regions 72 can be formed as illustrated in FIG. 23C. Note that in this etching process, the second buffer layer 42 is also partly etched. The second buffer layer 42 which is partly etched and has a depressed portion is referred to as the second buffer layer 43. The source and drain regions and the depressed portion of the buffer layer can be formed in the same process. The depth of the depressed portion of the second buffer layer 43 is set to half to one-third of the thicknesses of the thickest region in the second buffer layer 43, whereby the source region and the drain region can be spaced apart from each other. Accordingly, leakage current between the source region and drain region can be reduced. Then, the resist mask is removed.

Next, dry etching may be performed under such a condition that the second buffer layer 43 which is exposed is not damaged and an etching rate of the second buffer layer 43 is low. Through this step, an etching residue on the second buffer layer 43 between the source and drain regions, a residue of the resist mask, and a contamination source in the apparatus used for removal of the resist mask can be removed, whereby the source and drain regions can be certainly insulated. As a result, leakage current of the thin film transistor can be reduced; therefore, a thin film transistor with small off-current and high withstand voltage can be manufactured. Note that a chlorine gas may be used for an etching gas, for example.

Figure 25C:
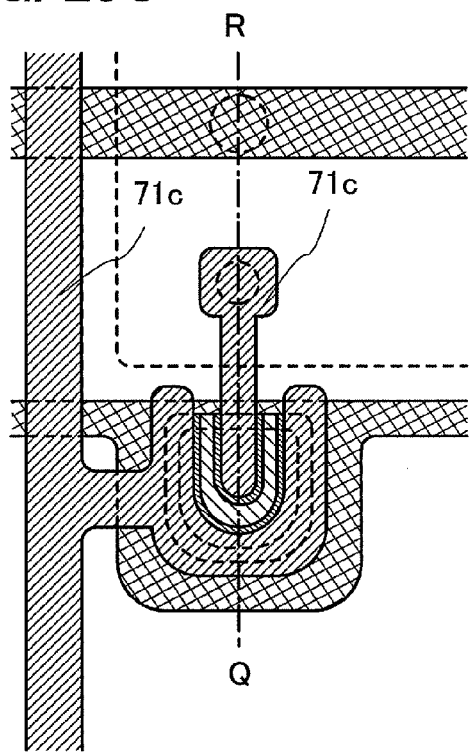

Note that FIG. 23C is a cross-sectional view taken along line Q-R in FIG. 25C. As illustrated in FIG. 25C, the end portion of the source and drain regions 72 is located beyond the end portion of the wiring 71c. Furthermore, one of the pair of wirings surrounds the other wirings (specifically, the former wiring is in a U-shape or a C-shape). Thus, an area in which carriers travel can be increased, and thus the amount of current can be increased and an area of the thin film transistor can be reduced. In addition, the microcrystalline semiconductor film and the wirings overlap over the gate electrode, and thus an influence by unevenness due to the gate electrode is small and reduction in coverage and generation of leakage current can be suppressed.

Through the above process, a channel-etched thin film transistor 74 can be formed.

Figure 24A:
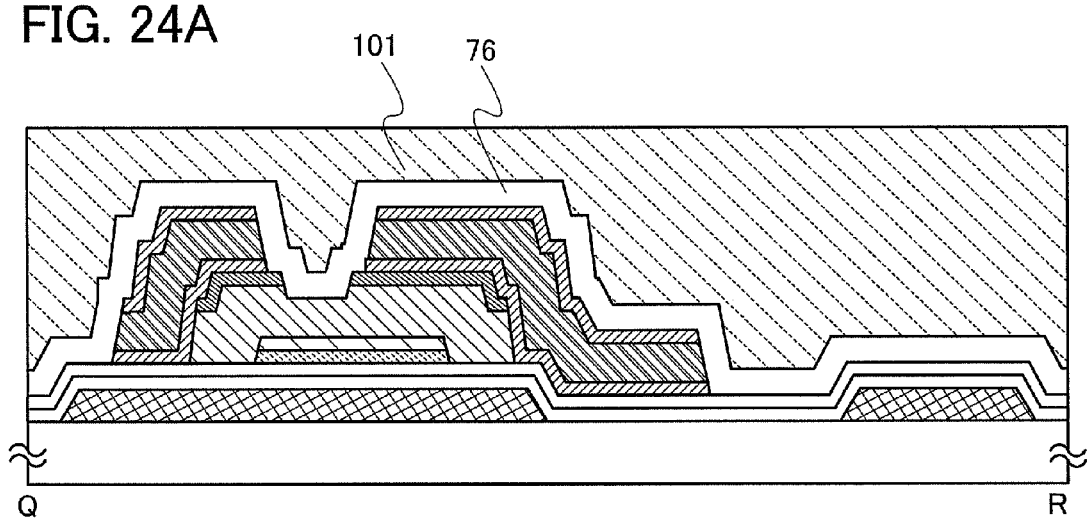
FIGS. 24A to 24C are cross-sectional views illustrating a manufacturing process for a thin film transistor according to one aspect of the present invention.

Next, as illustrated in FIG. 24A, a protective insulating film 76 is formed over the wirings 71a to 71c, the source and drain regions 72, the second buffer layer 43, and the gate insulating film 52b.

Figure 24B:
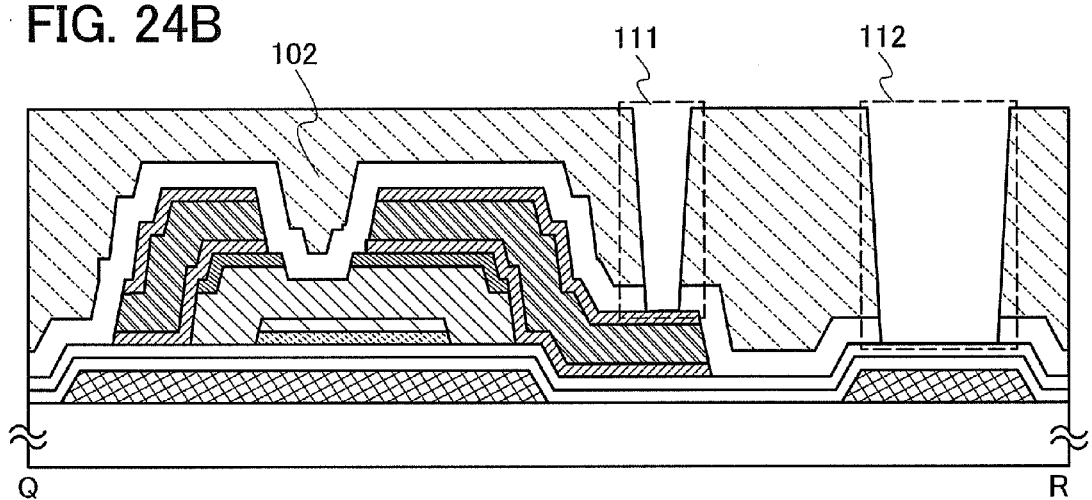

Then, the insulating film 101 is formed over the protective insulating film 76. The insulating film 101 is formed using a photosensitive organic resin here. Then, the insulating film 101 is exposed to light and developed using a fifth photomask to form the insulating film 102 which exposes the protective insulating film 76. Then, the protective insulating film 76 is etched using the insulating film 102 to form the contact hole 111 which partly exposes the wiring 71c and a contact hole 112 which partly exposes the gate insulating film 52b over the capacitor wiring 57 (see FIG. 24B).

Figure 24C:
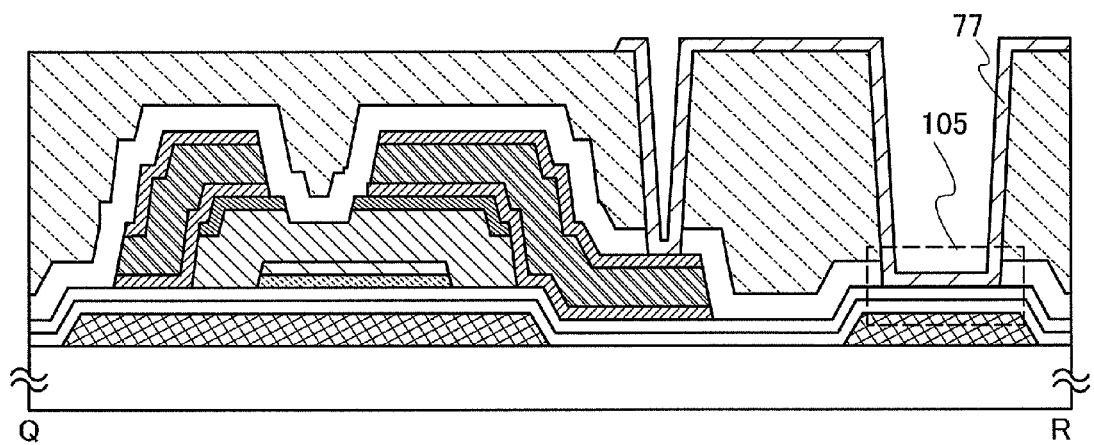
Figure 25D:
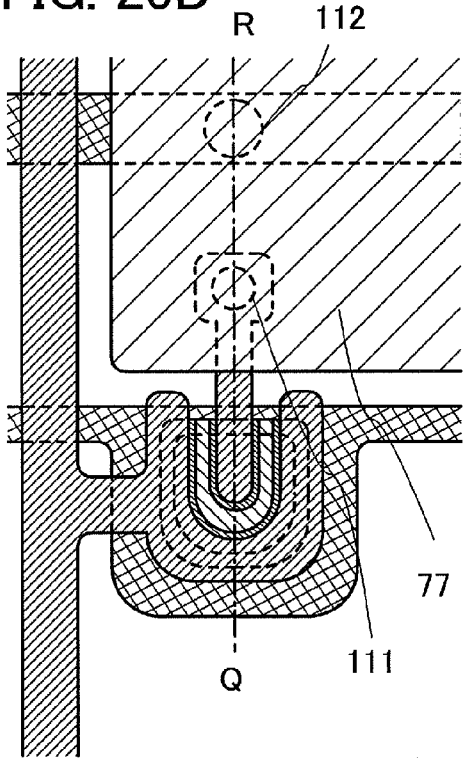

Then, as illustrated in FIG. 24C, the pixel electrode 77 is formed in the contact holes 111 and 112. In addition, a capacitor 105 including the capacitor wiring 57, the gate insulating films 52a and 52b, the protective insulating film 76, and the pixel electrode 77 can be formed. Here, after a conductive film is formed over the insulating film 102, the conductive film is etched using a resist mask which is formed through a photolithography process using a sixth photomask, whereby the pixel electrode 77 is formed. Note that FIG. 24C is a cross-sectional view taken along line Q-R in FIG. 25D.

Through the above process, a thin film transistor and an element substrate which can be used for a display device can be formed.

Since the channel formation region of the thin film transistor which is formed in this embodiment mode is formed of a microcrystalline semiconductor film, a driving frequency of a display device can be increased, whereby the panel size can be increased and high density of pixels can be achieved. Furthermore, the thin film transistors can be manufactured over a large-area substrate.

Although this embodiment mode describes a channel-etched thin film transistor, this embodiment mode can be applied to a channel-protective thin film transistor. In specific, it is possible to form a buffer layer which covers the microcrystalline semiconductor film to which an impurity element serving as a donor is added.

(Embodiment Mode 10)

This embodiment mode describes a mode in which a gate electrode and a capacitor wiring of a thin film transistor included in a semiconductor device described in the above embodiment modes have a different shape. Except the shape, the thin film transistor can be formed in a manner similar to that in the above embodiment modes; accordingly, repetitive description of the same components or components having functions similar to those of above embodiment modes and repetitive description of similar process will be omitted.

Figure 26:
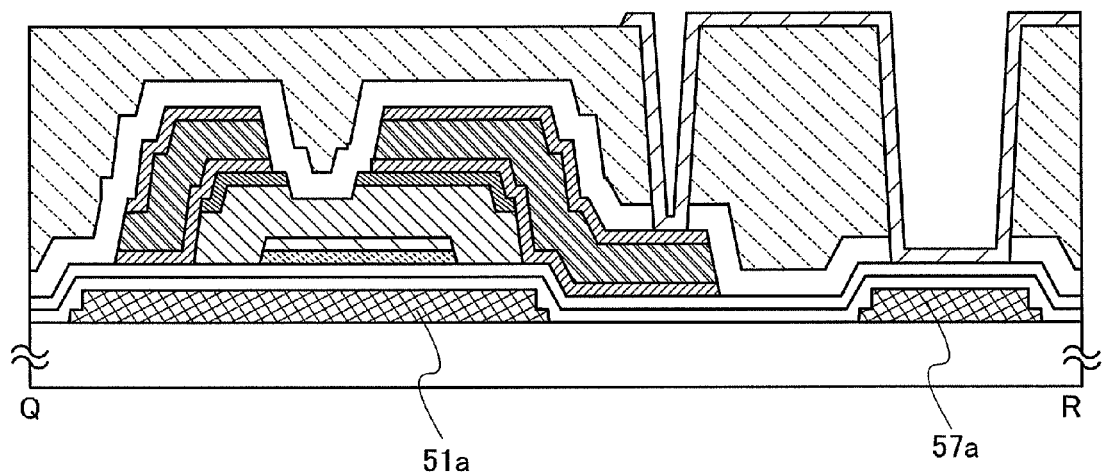
FIG. 26 is a cross-sectional view illustrating a manufacturing process for a thin film transistor according to one aspect of the present invention.

A semiconductor device of this embodiment mode is illustrated in FIG. 26. In FIG. 26, the gate electrode 51a and a capacitor wiring 57a has a step in their end portions. By providing the gate electrode 51a and the capacitor wiring 57a having a step in their end portions, coverage with the gate insulating film and the microcrystalline semiconductor film to which an impurity element serving as a donor is added can be improved. In addition, breaking of those layers due to level differences can be prevented; accordingly, a yield can be improved.

In this embodiment mode, an example in which light exposure using a multi-tone (high-tone) mask is performed to form a resist mask for forming the gate electrode 51a and the capacitor wiring 57a is described. As a resist, a positive resist or a negative resist can be used. Here, a positive resist is used.

A multi-tone mask can perform three levels of light exposure to obtain an exposed portion, a half-exposed portion, and an unexposed portion. A multi-tone mask is a mask through which light is transmitted to have a plurality of intensities. One-time light exposure and development process can form a resist mask with regions of plural thicknesses (typically, two kinds of thicknesses) to be formed. Accordingly, by using a multi-tone mask, the number of photomasks can be reduced.

Figure 27A:
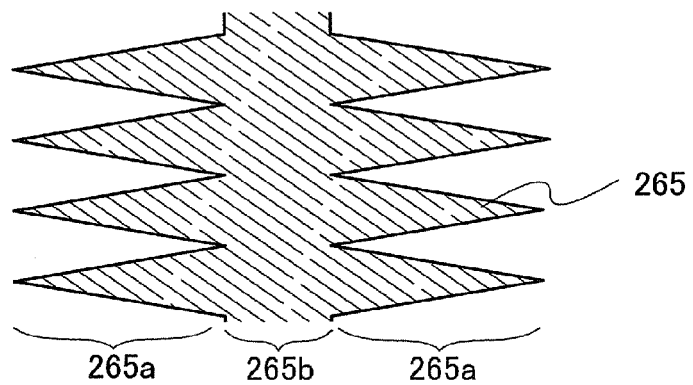
FIGS. 27A to 27D illustrate multi-tone masks applicable to the present invention.
Figure 27B:
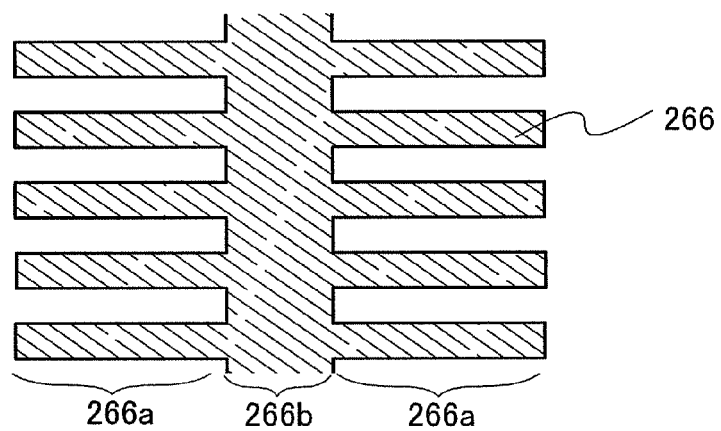
Figure 27C:
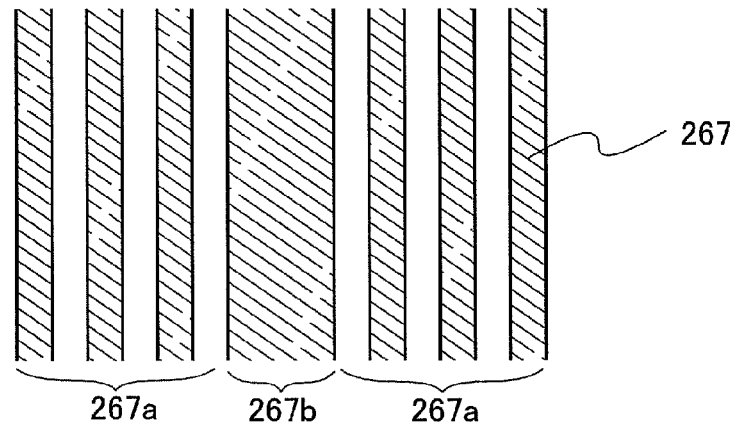

As typical examples of a multi-tone mask, there are a gray-tone mask, a half-tone mask, and the like. FIGS. 27A to 27C are plan views illustrating gray-tone masks 265, 266, and 267 which can be employed in the present invention.

The gray-tone mask 265 in FIG. 27A includes a diffraction grating portion 265a and a light-blocking portion 265b. The diffraction grating portions 265a are provided so as to make tapered projections at both sides of the light-blocking portion 265b.

The gray-tone mask 266 in FIG. 27B includes a diffraction grating portion 266a and a light-blocking portion 266b. The diffraction grating portions 266a have rectangular shapes and are provided like branches at both sides of the light-blocking portion 266b.

The gray-tone mask 267 in FIG. 27C includes a diffraction grating portion 267a and a light-blocking portion 267b. The diffraction grating portions 267a have rectangular shapes and are provided parallel to the light-blocking portion 267 at both sides of the light-blocking portion 267b.

A gray-tone mask includes a light-transmitting substrate (not illustrated), provided with a light-blocking portion and a diffraction grating. A light transmittance of the light-blocking portions 265b, 266b, and 267b is 0% and a light transmittance of a region where neither the light-blocking portions 265b, 266b, and 267b nor the portion 265a, 266a, and 267a is provided is 100%. On the other hand, the diffraction grating portions 265a, 266a, and 267a have a light-transmitting portion in a slit form, a dot form, a mesh form, or the like with intervals of equal to or less than the resolution limit of light used for the exposure, and therefore controls the light transmittance. The diffraction grating portions can be in a slit form, a dot form, or a mesh form with regular intervals; or in a slit form, a dot form, or a mesh form with irregular intervals. The light transmittance of the diffraction grating portion can be controlled in a range of 10% to 70%. The light transmittance in the diffraction grating portion can be controlled by adjusting the interval of slits, dots, or meshes of the diffraction grating portion and the pitch thereof.

For the light-transmitting substrate, a light-transmitting substrate such as a quartz substrate can be used. The light-blocking portion and the diffraction grating portion can be formed using a light-blocking material such as chromium or chromium oxide, which absorbs light.

Figure 27D:
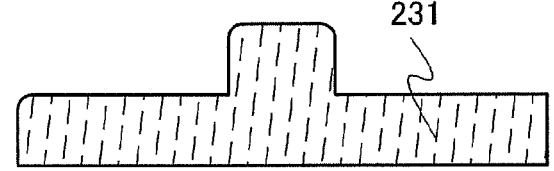

After light exposure using the multi-tone mask such as the gray-tone masks 265, 266, and 267, development is carried out, whereby a resist mask 231 including regions having different thicknesses can be formed, as illustrated in FIG. 27D.

By etching a conductive film using the resist mask 231 including regions having different thicknesses, the gate electrode 51a and the capacitor wiring 57a having a step in their end portions can be formed as illustrated in FIG. 26. Thus, breaking of the gate insulating film which is formed over the gate electrode 51a and the capacitor wiring 57a due to a large step can be prevented.

Note that while this embodiment mode describes an example in which the gate electrode has two steps, the gate electrode may have a plurality of steps such as three or four steps. In addition, while this embodiment mode describes an example in which a multi-tone mask is used for forming the gate electrode and the capacitor wiring, a multi-tone mask can be used for another portion (such as a semiconductor film or another wiring) of a semiconductor device.

This embodiment mode can be combined with any of the above embodiment modes as appropriate.

A resist mask which is formed using a multi-tone mask as a photomask has a shape with a plurality of thicknesses.

Accordingly, the number of photomasks and corresponding photolithography steps can be reduced, whereby simplification of process can be realized.

(Embodiment Mode 11)

In this embodiment mode, a preferred mode of Embodiment Modes 1 to 8 is described with reference to FIGS. 31A and 31B.

Figure 31A:
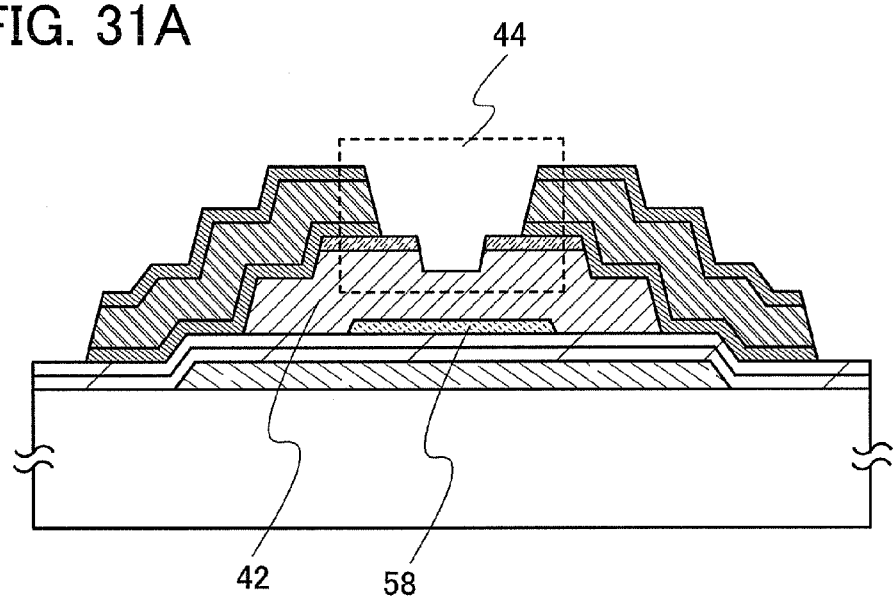
FIGS. 31A and 31B are cross-sectional views illustrating a thin film transistor according to one aspect of the present invention.
Figure 31B:
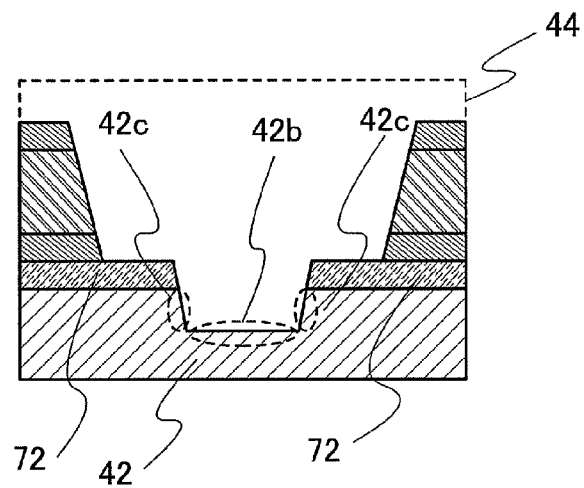

FIG. 31A illustrates one mode of a thin film transistor of the present invention. FIG. 31B is an enlarged view 44 of an upper portion of the buffer layer 42.

In the present invention, the buffer layer 42 has a depressed portion in its upper portion. This is because in formation of the pair of source and drain regions 72 by etching an impurity semiconductor film to which an impurity element imparting one conductivity type is added, the buffer layer is also partly etched. In an etching step for forming the pair of source and drain regions 72, it is preferable to perform anisotropic etching. As anisotropic etching, reactive ion beam etching (RIBE) using electronic cyclotron resonance (ECR) plasma, inductively coupled plasma (ICP) etching, or the like may be used. As a result, the depressed portion of the buffer layer 42 has a side surface 42c having an angle of 70° or more and 90° or less, preferably 80° or more and 90° or less to the substrate surface, whereby etching damage to the side surface 42c in the depressed portion can be reduced.

The side surface 42c of the depressed portion of the buffer layer 42 is a region where carriers flow when positive or negative voltage is applied to the gate electrode 51. In this region, if there is a few defects due to etching damage, carriers are not easily trapped and can easily move when positive voltage is applied to the gate electrode 51. Therefore, on-current and field effect mobility can be improved, which is preferable.

With the above-described structure, a thin film transistor with higher on-current and higher field effect mobility can be manufactured.

(Embodiment Mode 12)

In this embodiment mode, a step before formation of the semiconductor film 45 to which an impurity element serving as a donor is added as described in Embodiment Modes 3 to 11 is described below. Here, Embodiment Mode 3 is used for description as a typical example, but this embodiment mode can be applied to any of Embodiment Modes 4 to 11 as appropriate.

As illustrated in FIG. 10A, the gate electrode 51 is formed over the substrate 50, and the gate insulating films 52a and 52b are formed over the gate electrode 51.

Next, a surface of the gate insulating film 52b is subjected to plasma treatment. Typically, the surface of the gate insulating film 52b is exposed to plasma, such as hydrogen plasma, ammonia plasma, helium plasma, argon plasma, or neon plasma. As plasma treatment, a substrate provided with the gate insulating film 52b is placed in a reaction chamber. In addition, a gas such as hydrogen, ammonia, helium, argon, or neon is introduced into the reaction chamber, and glow discharge is carried out, whereby plasma such as hydrogen plasma, ammonia plasma, helium plasma, argon plasma, or neon plasma is generated and a surface of the gate insulating film can be exposed to the plasma.

By exposing the surface of the gate insulating film 52b to plasma such as hydrogen plasma, ammonia plasma, helium plasma, argon plasma, or neon plasma, defects of the surface of the gate insulating film can be reduced. Typically, dangling bonds on the surface of the gate insulating film 52b can be terminated. Then, the semiconductor film to which an impurity element serving as a donor is added is formed, thus, defects at the interface of the gate insulating film 52b and the semiconductor film to which an impurity element serving as a donor is added can be reduced. Accordingly, trapping of carriers by defects can be reduced, whereby on-current can be improved.

(Embodiment Mode 13)

In this embodiment mode, a film formation apparatus which can be used in a film formation process of the above embodiment modes and flow of a substrate therein are described below.

Next, as an example of a plasma CVD apparatus which can be used for a film formation process of this embodiment mode, a structure suitable for forming a gate insulating film, a semiconductor film to which an impurity element serving as a donor is added, a buffer layer, and an impurity semiconductor film to which an impurity element imparting one conductivity type is added is described.

Figure 28:
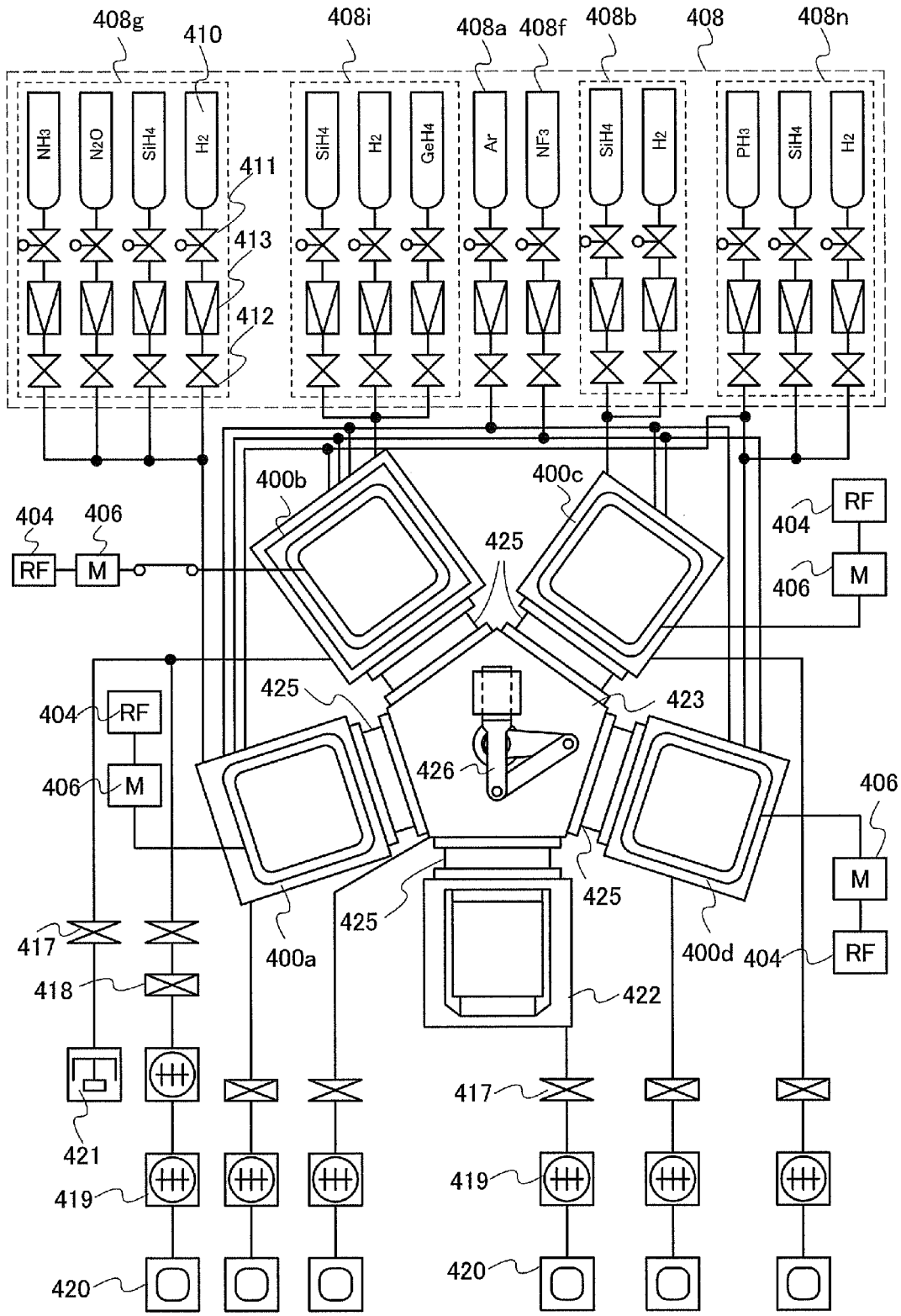
FIG. 28 illustrates a structure of a plasma CVD apparatus applicable to the present invention.

FIG. 28 illustrates an example of a multi-chamber plasma CVD apparatus having a plurality of reaction chambers. The apparatus is provided with a common chamber 423, a load/unload chamber 422, a first reaction chamber 400a, a second reaction chamber 400b, a third reaction chamber 400c, and a fourth reaction chamber 400d. This apparatus is a single wafer-processing type in which a substrate set in a cassette in the load/unload chamber 422 is transferred to/from each reaction chamber by a transfer mechanism 426 in the common chamber 423. A gate valve 425 is provided between the common chamber 423 and each chamber so that treatment performed in the chambers does not interfere with each other.

The reaction chambers are classified according to the kinds of thin films to be formed. For example, an insulating film such as a gate insulating film, a semiconductor film to which an impurity element serving as a donor is added, a buffer layer which serves as a high resistance region of a thin film transistor, and an impurity semiconductor film to which an impurity element imparting one conductivity type is added and which forms a source and a drain are formed in the first reaction chamber 400a, in the second reaction chamber 400b, the third reaction chamber 400c, and in the fourth reaction chamber 400d, respectively. Needless to say, the number of reaction chambers is not limited to four and may be increased or decreased as necessary.

A turbo-molecular pump 419 and a dry pump 420 are connected to each reaction chamber as an evacuation means. The evacuation means is not limited to a combination of these vacuum pumps and can employ other vacuum pumps as long as they can evacuate the reaction chamber to a pressure of about $10^{-1}$ Pa to $10^{-5}$ Pa. A butterfly valve 417 which can interrupt vacuum evacuation is provided between the evacuation means and each reaction chamber. A conductance valve 418 can control an evacuation speed to adjust the pressure in each reaction chamber.

Note that the second reaction chamber 400b in which a semiconductor film to which an impurity element serving as a donor is added is formed may be connected to a cryopump 421 which performs vacuum evacuation to an ultra-high vacuum. By using the cryopump 421, the reaction chamber can be evacuated to an ultra-high vacuum with a pressure of lower than $10^{-5}$ Pa. In this embodiment mode, by setting the pressure in the reaction chamber at an ultra-high vacuum of lower than $10^{-5}$ Pa, the oxygen concentration and the nitrogen concentration in the semiconductor film to which an impurity element serving as a donor is added can be effectively reduced. Consequently, the oxygen concentration in the semiconductor film 45 to which an impurity element serving as a donor is added can be $1 \times 10^{16}$ atoms/cm$^3$ or lower. In the case where the semiconductor film to which an impurity element serving as a donor is added is a microcrystalline semiconductor film, by reducing the oxygen concentration and the nitrogen concentration in the microcrystalline semiconductor film, defects in the film can be reduced and crystallinity can be improved and thus carrier mobility can be improved.

A gas supply means 408 includes a cylinder 410 filled with a gas used for the process, such as a rare gas or a semiconductor source gas typified by a silane and germane, stop valves 411 and 412, a mass flow controller 413, and the like. A gas supply means 408g is connected to the first reaction chamber 400a and supplies a gas for forming a gate insulating film. A gas supply means 408i is connected to the second reaction chamber 400b and supplies a gas for a semiconductor film to which an impurity element serving as a donor is added. A gas supply means 408b is connected to the third reaction chamber 400c and supplies a gas for a buffer layer. A gas supply means 408n is connected to the fourth reaction chamber 400d and supplies a gas for forming an n-type semiconductor film, for example. In addition, phosphine, which is one of gases including an impurity element which serves as a donor may also be supplied to the first reaction chamber 400a and the second reaction chamber 400b. A gas supply means 408a supplies hydrogen, and a gas supply means 408f supplies an etching gas for cleaning of the inside of the reaction chambers. The gas supply means 408a and 408f are provided in common for the reaction chambers.

A high-frequency power supply means for generating plasma is connected to each reaction chamber. The high-frequency power supply means includes a high-frequency power source 404 and a matching box 406.

Each reaction chamber can be used independently for forming a different kind of thin film. Each thin film has an optimum temperature for formation. By fanning each thin film in a different reaction chamber, film formation temperatures can be easily controlled. Further, the same kind of films can be repeatedly formed in one reaction chamber; therefore, an influence of residual impurities of a film which has been formed can be eliminated. In particular, in the case of the semiconductor film to which an impurity element serving as a donor is added, it is possible to prevent the impurity element serving as a donor from mixing into a buffer layer. Consequently, the concentration of the impurity element in the buffer layer can be decreased, whereby off-current of the thin film transistor can be decreased.

Then, a mode of a plasma CVD apparatus in which a gate insulating film, a semiconductor film to which an impurity element serving as a donor is added, a buffer layer, an impurity semiconductor film to which an impurity element imparting one conductivity type is added are formed successively in one reaction chamber is described with reference to FIG. 29.

The apparatus is provided with the common chamber 423, the load/unload chamber 422, a waiting chamber 401, and the reaction chamber 400a. This apparatus is a single wafer-processing type in which a substrate set in a cassette in the load/unload chamber 422 is transferred to/from each reaction chamber by the transfer mechanism 426 in the common chamber 423. The gate valve 425 is provided between the common chamber 423 and each chamber so that treatments performed in different reaction chambers do not interfere with each other.

The turbo-molecular pump 419 and the dry pump 420 are connected to the reaction chamber 400a as an evacuation means 430. The evacuation means 430 is not limited to a combination of these vacuum pumps and can employ other vacuum pumps as long as they can evacuate the reaction chamber to a pressure of about $10^{-1}$ Pa to $10^{-5}$ Pa. The butterfly valve 417 which can interrupt vacuum evacuation is provided between the evacuation means 430 and the reaction chamber. The conductance valve 418 can control an evacuation speed to adjust the pressure in each reaction chamber. Further, the cryopump 421 may be connected to the reaction chamber 400a.

A gas supply means 408 includes the cylinder 410 filled with a gas used for the process, such as hydrogen or a semiconductor source gas typified by a silane and germane, the stop valves 411 and 412, the mass flow controller 413, and the like. The gas supply means 408g, 408i, 408a, 408n, and 408f are connected to the reaction chamber 400a.

The high-frequency power supply means 403 for generating plasma is connected to the reaction chamber. The high-frequency power supply means 403 includes the high-frequency power source 404 and the matching box 406.

Figure 29:
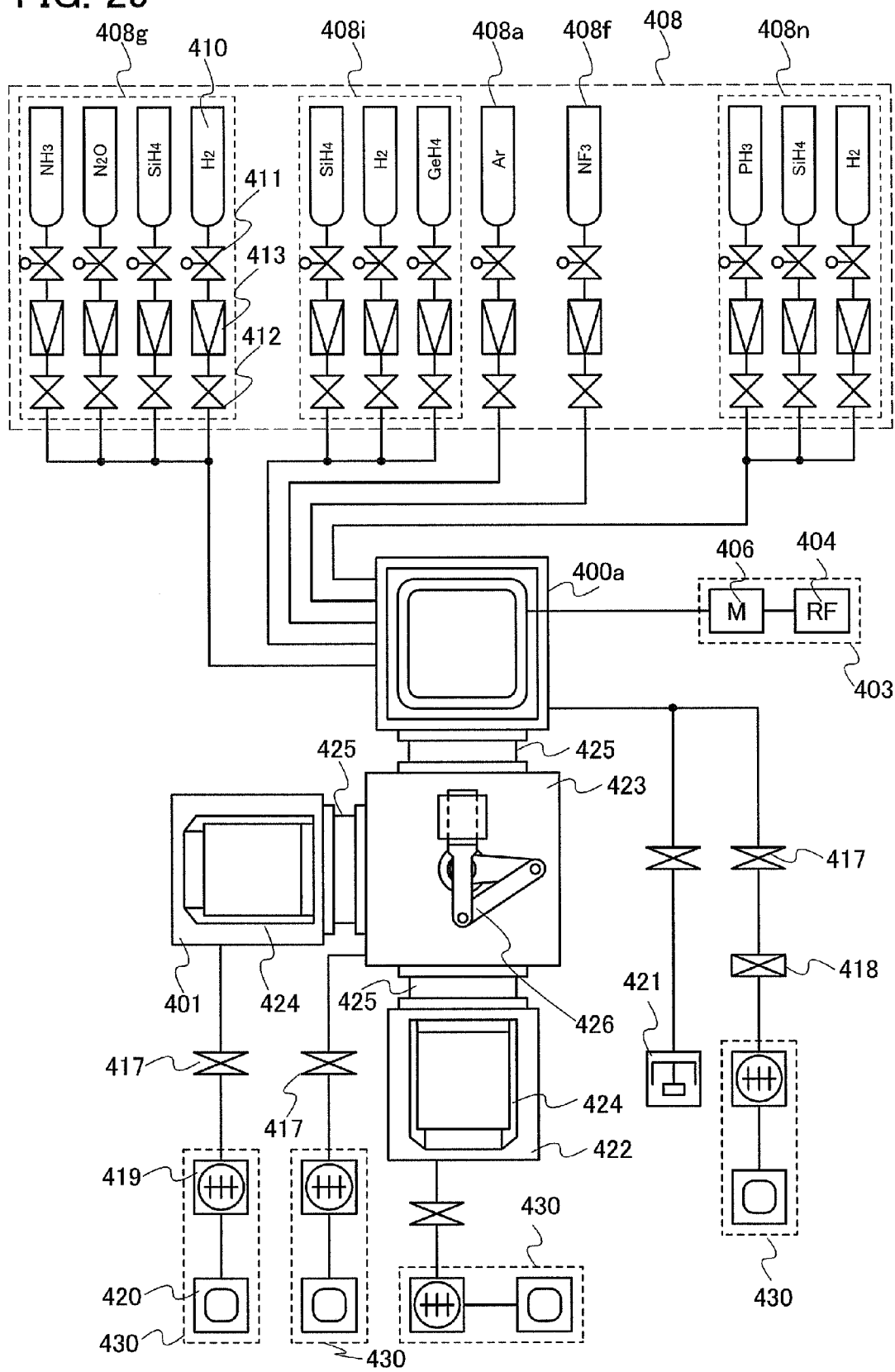
FIG. 29 illustrates a structure of a plasma CVD apparatus applicable to the present invention.

Then, a process for forming a plurality of films successively with the plasma CVD apparatus illustrated in FIG. 29 is described with reference to FIGS. 30A to 30C.

Figure 30A:
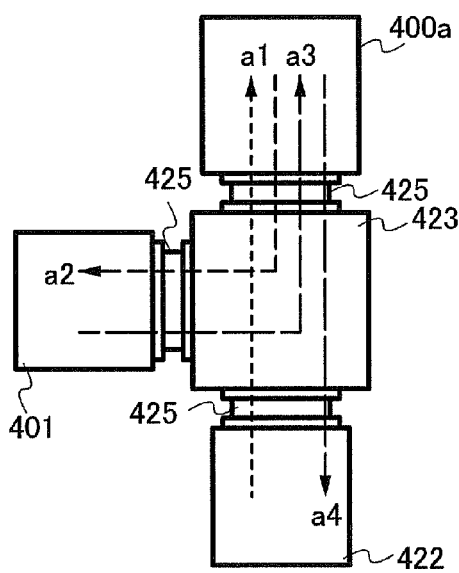
FIGS. 30A to 30C illustrate a structure and a film forming procedure of a plasma CVD apparatus applicable to the present invention.

FIG. 30A illustrates the plasma CVD apparatus of FIG. 29 in a simplified manner. FIG. 30B is a schematic diagram of a process for successively forming a gate insulating film and a semiconductor film to which an impurity element serving as a donor is added (here, referred to as an n⁻μc-Si-film) over a substrate provided with a gate electrode. An arrow of a dotted line indicates flow of the substrate and an arrow of a solid line indicates flow of the film-forming process.

Figure 30B:
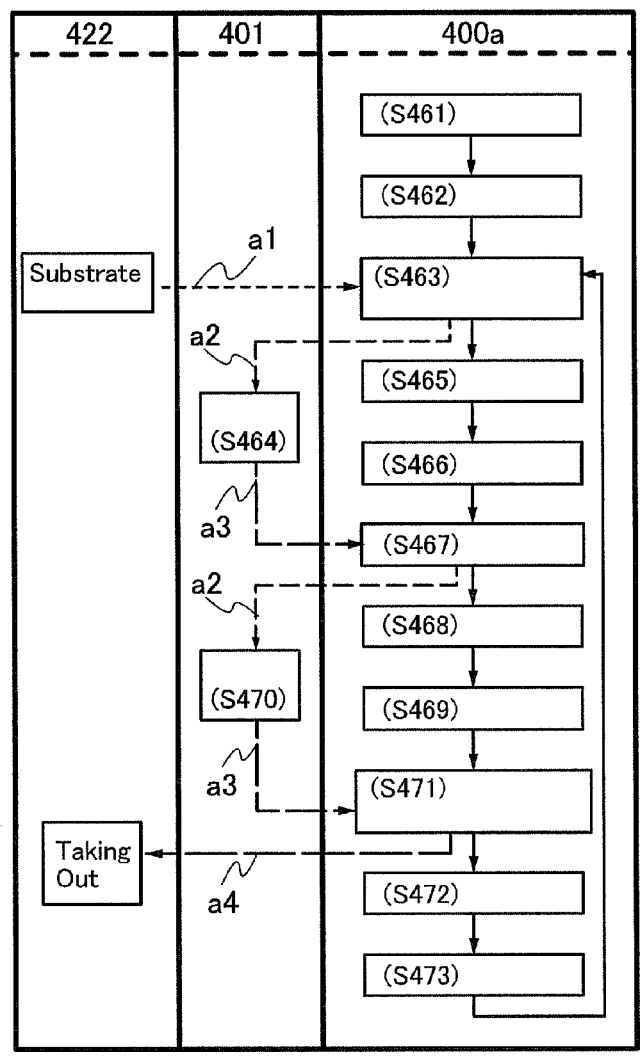

As illustrated in FIG. 30B, an inner wall of the reaction chamber 400a is cleaned with fluorine radicals or the like (S461) to remove residual impurities in the reaction chamber 400a. Then, the inner wall of the reaction chamber 400a is coated with a film which is similar to the gate insulating film (S462). Due to this coating step, metals which form the reaction chamber 400a can be prevented from mixing into the gate insulating film as impurities.

Then, the substrate set in a cassette in the load/unload chamber 422 is transferred to the reaction chamber 400a by the transfer mechanism 426 in the common chamber 423 as indicated by an arrow a1. Then, a gate insulating film, which is a silicon oxynitride film here, is formed over the substrate in the reaction chamber 400a (S463).

Then, the substrate over which the gate insulating film is formed is transferred to the waiting chamber 401 by the transfer mechanism 426 in the common chamber 423 as indicated by an arrow a2, then, the substrate is kept in a waiting state (S464). Then, the inner wall of the reaction chamber 400a is cleaned with fluorine radicals or the like (S465) to remove residual impurities in the reaction chamber 400a. Then, the inner wall of the reaction chamber 400a is coated with an amorphous semiconductor film (S466). Due to this cleaning and coating, components (oxygen, nitrogen, or the like) of the gate insulating film which are deposited on the inner wall of the reaction chamber 400a and metals which form the reaction chamber 400a can be prevented from mixing, as impurities, into the semiconductor film to which an impurity element serving as a donor is added. In addition, in the case where the semiconductor film to which an impurity element serving as a donor is added is a microcrystalline semiconductor film, the crystallinity of the microcrystalline semiconductor film can be improved. Then, the substrate is transferred to the reaction chamber 400a by the transfer mechanism 426 in the common chamber 423, as indicated by an arrow a3, to form the semiconductor film to which an impurity element serving as a donor is added in the reaction chamber 400a (S467). Here, as the semiconductor film to which an impurity element serving as a donor is added, a silane, hydrogen, and phosphine are used as a source gas, and a microcrystalline silicon film to which phosphorus is added is formed.

Then, the substrate over which the semiconductor film to which an impurity element serving as a donor is added is formed is transferred to the waiting chamber 401 by the transfer mechanism 426 in the common chamber 423 as indicated by the arrow a2, then, the substrate is kept in a waiting state (S470). Then, the inner wall of the reaction chamber 400a is cleaned with fluorine radicals or the like (S468) to remove residual impurities in the reaction chamber 400a. Then, the inner wall of the reaction chamber 400a is coated with an amorphous semiconductor film (S469). Due to this cleaning and coating, components (phosphorus) of the semiconductor film to which an impurity element serving as a donor is added which are deposited on the inner wall of the reaction chamber 400a and metals which form the reaction chamber 400a can be prevented from mixing, as impurities, into the amorphous semiconductor film which is formed later. Accordingly, the amorphous semiconductor film can serve as a high resistance region. Then, the substrate is transferred to the reaction chamber 400a by the transfer mechanism 426 in the common chamber 423, as indicated by the arrow a3, to form an amorphous semiconductor film as the first buffer layer in the reaction chamber 400a (S471). Here, as the amorphous semiconductor film, a silane and hydrogen are used as a source gas, and an amorphous semiconductor film is formed.

Then, the substrate over which the first buffer layer is formed is set in the cassette in the load/unload chamber 422 by the transfer mechanism 426 in the common chamber 423, as indicated by an arrow a4. Through the above process, the gate insulating film, the semiconductor film to which an impurity element serving as a donor is added, and the first buffer layer are successively formed over the substrate provided with a gate electrode. Then, the inner wall of the reaction chamber 400a is cleaned with fluorine radicals or the like (S472) to remove residual impurities in the reaction chamber 400a. Then, the inner wall of the reaction chamber 400a is coated with a film which is similar to the gate insulating film (S473). Then, another substrate which is set in the cassette in the load/unload chamber 422 is transferred to the reaction chamber 400a, and the steps similar to the above steps are performed on the substrate, starting with film formation of a gate insulating film (S463), to successively form the gate insulating film, a semiconductor film to which an impurity element serving as a donor is added, and a first buffer layer.

After the gate insulating films, the semiconductor films to which an impurity element serving as a donor is added, and the first buffer layers are formed over all the substrates which are set in the cassette in the load/unload chamber 422, the cassette is transferred from the load/unload chamber 422 to be subjected to a next process.

Note that although the substrate over which the gate insulating film and the $n^-\mu c$-Si-film is formed is kept in a waiting state in the waiting chamber 401, the substrate may be kept in a waiting state in the load/unload chamber 422. Thus, the plasma CVD apparatus can be simplified and cost can be reduced.

Further, as a method for forming the $n^-\mu c$-Si-film, phosphine is used as a source gas in S467 here. However, instead of this, after the coating S466, phosphine may be fed into the reaction chamber so that phosphorus is adsorbed onto the inner wall of the reaction chamber, then, the substrate kept in a waiting state in the waiting chamber 401 is transferred to the reaction chamber 400a and a semiconductor film is formed using a source gas. The film is formed while taking in phosphorus which is adsorbed in the reaction chamber. Thus, a semiconductor film to which an impurity element serving as a donor is added can be formed.

Further, in formation of the gate insulating film in S463, phosphine may be mixed into a source gas. In that case, after the gate insulating film to which phosphorus is added is formed, by depositing a semiconductor film using a source gas in S467, a semiconductor film to which an impurity element serving as a donor is added can be formed.

Next, a process in which a second buffer layer and an impurity semiconductor film to which an impurity element imparting one conductivity type is added (here, referred to as an $n^+$a-Si-film) are successively formed over the semiconductor film to which an impurity element serving as a donor is added and the first buffer layer which are processed into island-shape is described with reference to FIG. 30C. An arrow of a dotted line indicates flow of the substrate and an arrow of a solid line indicates flow of the film-forming process.

Figure 30C:
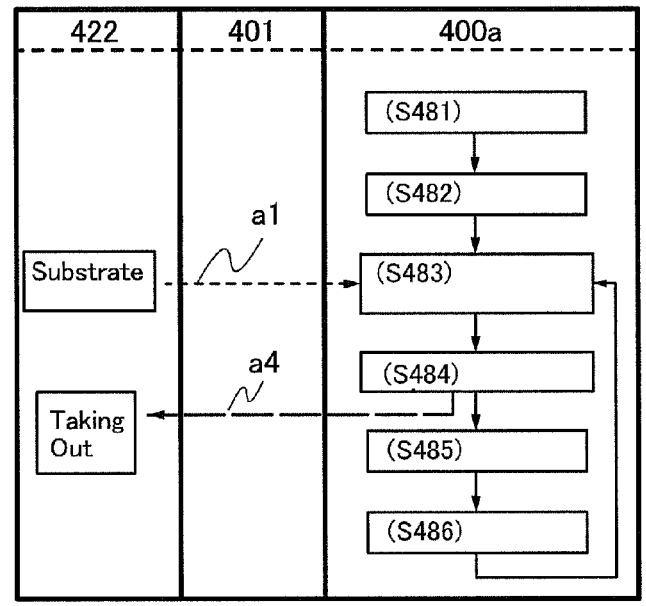

As illustrated in FIG. 30C, the inner wall of the reaction chamber 400a is cleaned with fluorine radicals or the like (S481), to remove residual impurities in the reaction chamber 400a. Then, the inner wall of the reaction chamber 400a is coated with a film which is similar to a second buffer layer (S482). Here, an amorphous silicon film is formed. Due to this coating step, metals which fond the reaction chamber 400a can be prevented from mixing into the gate insulating film as impurities.

Then, the substrate set in the cassette in the load/unload chamber 422 is transferred to the reaction chamber 400a by the transfer mechanism 426 in the common chamber 423 as indicated by the arrow a1. Then, the second buffer layer, which is an amorphous silicon film here, is formed over the substrate in the reaction chamber 400a (S483).

Then, an impurity semiconductor film to which an impurity element imparting one conductivity type is added (here, referred to as an $n^+$a-Si-film) is formed over the substrate over which the second buffer layer is formed (S484). Here, a coating step is not necessarily performed before forming the $n^+$a-Si-film because the main components in the amorphous silicon film and the $n^+$a-Si-film are the same, and moreover, amorphous silicon does not contain any substance which becomes contaminants of the $n^+$a-Si-film film.

Then, the substrate over which the $n^+$a-Si-film is formed is set in the cassette in the load/unload chamber 422 by the transfer mechanism 426 in the common chamber 423 as indicated by the arrow a4. Through the above process, the second buffer layer and the $n^+$a-Si-film can be formed successively over the substrate over which the island-shaped semiconductor film to which an impurity element serving as a donor is added and first buffer layer are formed. Then, the inner wall of the reaction chamber 400a is cleaned with fluorine radicals or the like (S485) to remove residual impurities in the reaction chamber 400a. Then, the inner wall of the reaction chamber 400a is coated with a film which is similar to the second buffer layer (S486). Then, another substrate which is set in the cassette in the load/unload chamber 422 is transferred to the reaction chamber 400a, and the steps similar to the above steps are performed on the substrate, starting with film formation of the second buffer layer (S483), to successively form the second buffer layer and the $n^+$a-Si-film.

After the second buffer layers and the $n^+$a-Si-films are formed over all the substrates which are set in the cassette in the load/unload chamber 422, the cassette is transferred from the load/unload chamber 422 to be subjected to a next process.

Through the above process, a plurality of films can be successively formed without being exposed to the atmosphere. In addition, the films can be formed without contaminants mixing into the films.

(Embodiment Mode 14)

In this embodiment mode, a liquid crystal display device including the thin film transistor described in any of the above embodiment modes is described below as one mode of a display device. Here, a vertical alignment (VA) liquid crystal display device is described with reference to FIG. 32, FIG. 33, and FIG. 34. The VA liquid crystal display device employs one mode for controlling alignment of liquid crystal molecules of a liquid crystal panel. The VA liquid crystal display device employs a mode in which liquid crystal molecules are vertical to a panel surface when voltage is not applied. In particular, in this embodiment mode, a pixel is divided into several regions (sub-pixels) so that molecules are tilted in a different orientation in each different region. This is referred to as multi-domain or multi-domain design. In the following description, a liquid crystal display device with multi-domain design is described.

Figure 32:
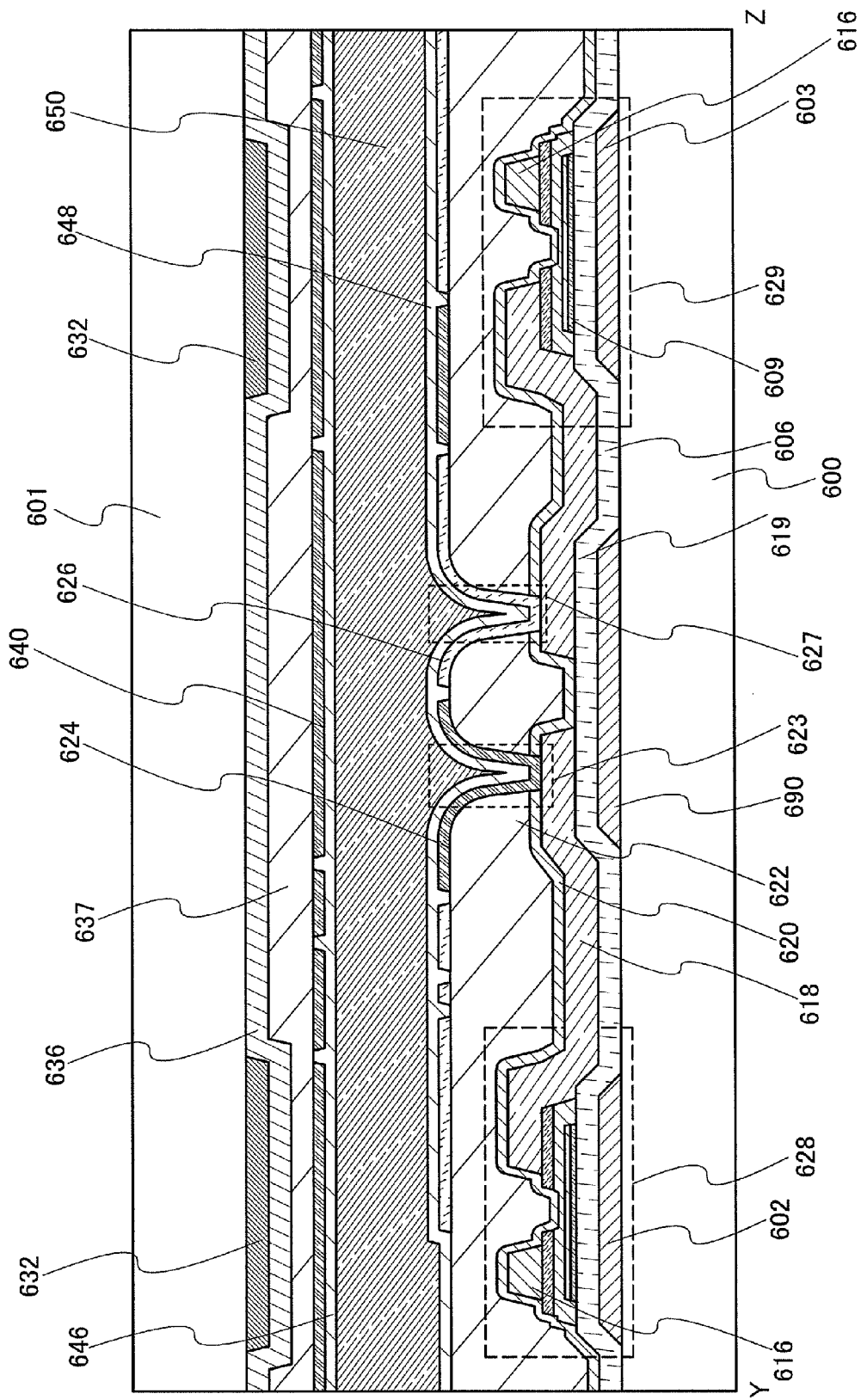
FIG. 32 is a cross-sectional view illustrating a method for manufacturing a display device according to one aspect of the present invention.
Figure 33:
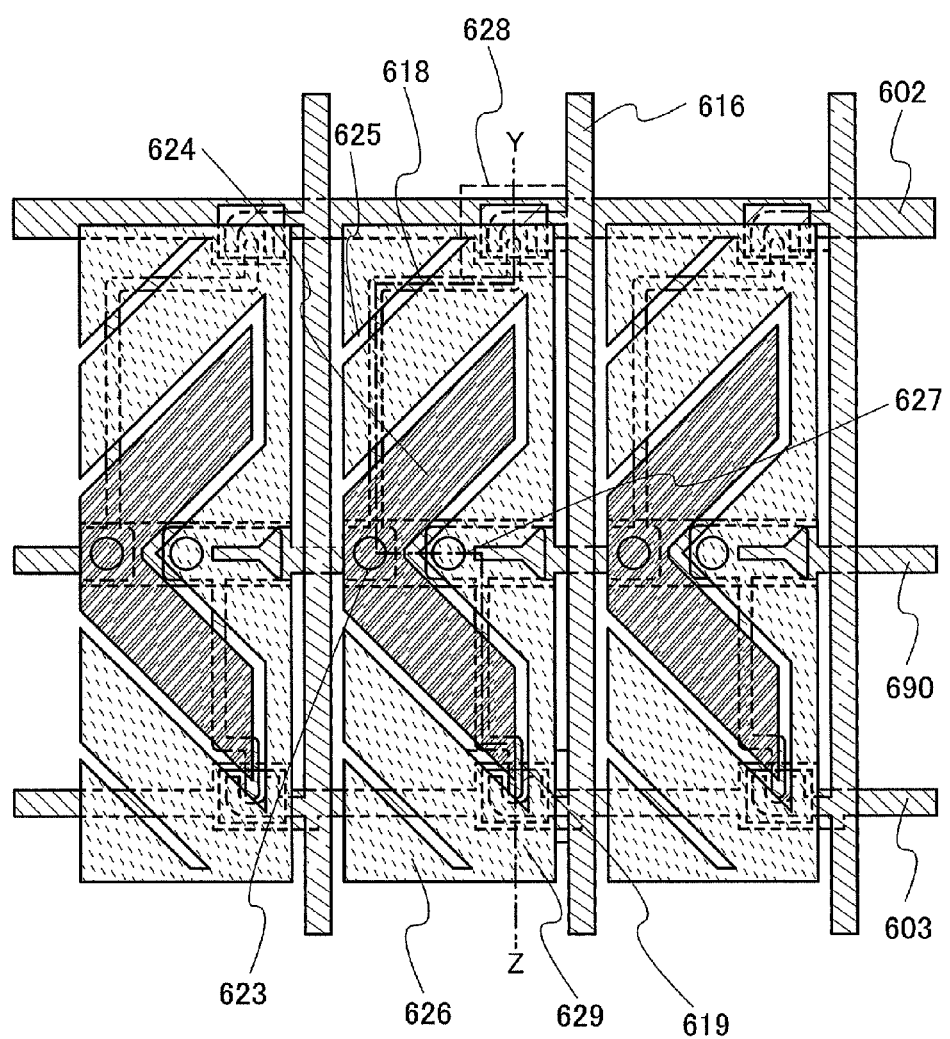
FIG. 33 is a top view illustrating a method for manufacturing a display device according to one aspect of the present invention.

FIG. 32 and FIG. 33 illustrate a pixel structure in a VA liquid crystal panel. FIG. 33 is a plan view of a substrate 600. FIG. 32 illustrates a cross-sectional structure along line Y-Z in FIG. 33. The following description will be made with reference to both the drawings.

In this pixel structure, a plurality of pixel electrodes 624 and 626 are included in one pixel, and thin film transistors 628 and 629 are connected to the pixel electrodes 624 and 626, respectively, through a planarization film 622. The thin film transistors 628 and 629 are driven by different gate signals. That is, a pixel of multi-domain design has a structure in which a signal applied to each of the pixel electrodes 624 and 626 is independently controlled.

The pixel electrode 624 is connected to the thin film transistor 628 through a wiring 618 in a contact hole 623. In a contact hole 627, the pixel electrode 626 is connected to the thin film transistor 629 through a wiring 619. A gate wiring 602 of the thin film transistor 628 and a gate wiring 603 of the thin film transistor 629 are separated so that different gate signals can be given thereto. In contrast, a wiring 616 serving as a data line is used in common by the thin film transistors 628 and 629. The thin film transistors 628 and 629 can be manufactured by the methods described in above embodiment modes.

The pixel electrodes 624 and 626 have different shapes and are separated by a slit 625. The pixel electrode 626 surrounds the pixel electrode 624 which has a V-shape. Timings of voltage application are different between the pixel electrode 624 and the pixel electrode 626 by the thin film transistor 628 and the thin film transistor 629, so that alignment of liquid crystal is controlled. When different gate signals are supplied to the gate wiring 602 and the gate wiring 603, operation timings of the thin film transistor 628 and the thin film transistor 629 can be different. An alignment film 648 is formed over the pixel electrodes 624 and 626.

Figure 34:
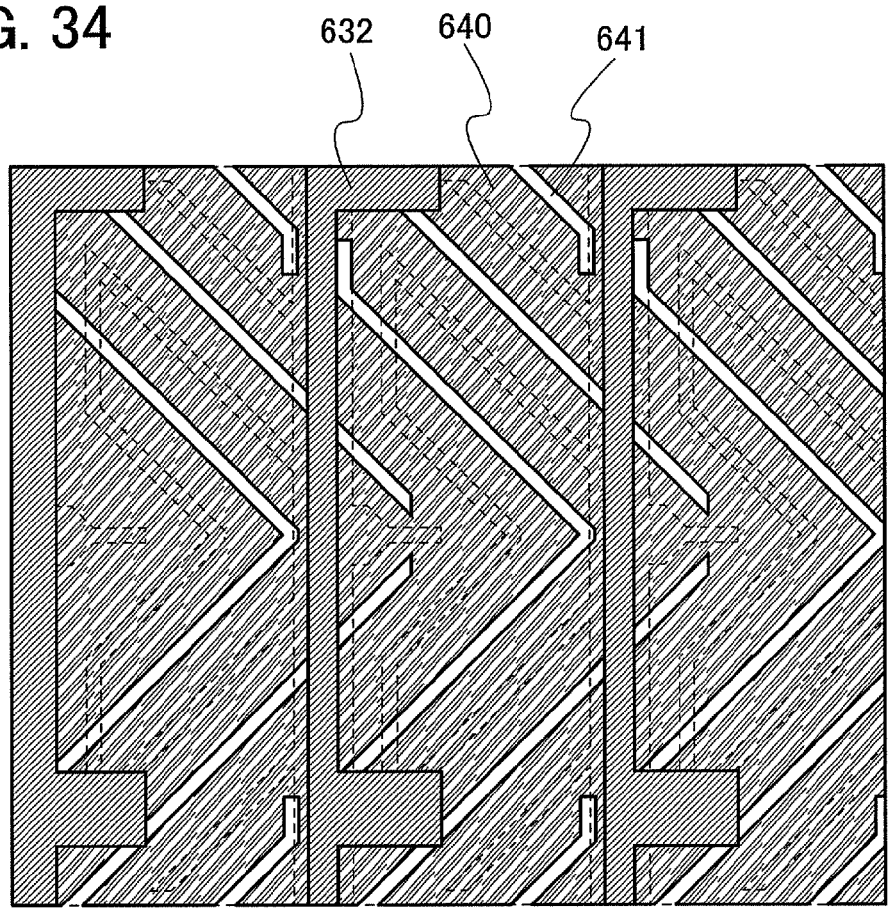
FIG. 34 is a top view illustrating a method for manufacturing a display device according to one aspect of the present invention.

A counter substrate 601 is provided with a light-blocking film 632, a coloring film 636, and a counter electrode 640. In addition, a planarization film 637 is formed between the coloring film 636 and the counter electrode 640 so that alignment disorder of liquid crystal is prevented. Further, an alignment film 646 is formed on the counter electrode 640. FIG. 34 illustrates a structure of a counter substrate side. A slit 641 is formed in the counter electrode 640 which is used in common between different pixels. The slit 641 and the slit 625 of the pixel electrodes 624 and 626 are alternately arranged so as not to overlap; thus, an oblique electric field is effectively generated, and the alignment of liquid crystal can be controlled. Accordingly, an orientation of alignment of the liquid crystals can be made different depending on location and the viewing angle is widened.

In this specification, a substrate, a coloring film, a light-blocking film, and a planarization film form a color filter. Note that either the light-blocking film or the planarization film, or neither of them is not necessarily formed over the substrate.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for the color filter. However, the combination of the coloring films is not limited to the above combination.

The pixel electrode 624, a liquid crystal layer 650, and the counter electrode 640 overlap with each other to form a first liquid crystal element. Further, a second liquid crystal element is formed by overlapping of the pixel electrode 626, the liquid crystal layer 650, and the counter electrode 640. Furthermore, the multi-domain structure is employed in which the first liquid crystal element and the second liquid crystal element are provided for one pixel.

Although a vertical alignment (VA) liquid crystal display device is described here as a liquid crystal display device, the element substrate formed in accordance with any of the above embodiment modes can also be applied to an FFS mode liquid crystal display device, an IPS mode liquid crystal display device, a TN mode liquid crystal display device, and the like.

The liquid crystal display device can be manufactured through the above process. Since inverted staggered thin film transistors with small off-current and high electric characteristics are used for the liquid crystal display device of this embodiment mode, the liquid crystal display device having high contrast and high visibility can be manufactured.

(Embodiment Mode 15)

Figure 35A:
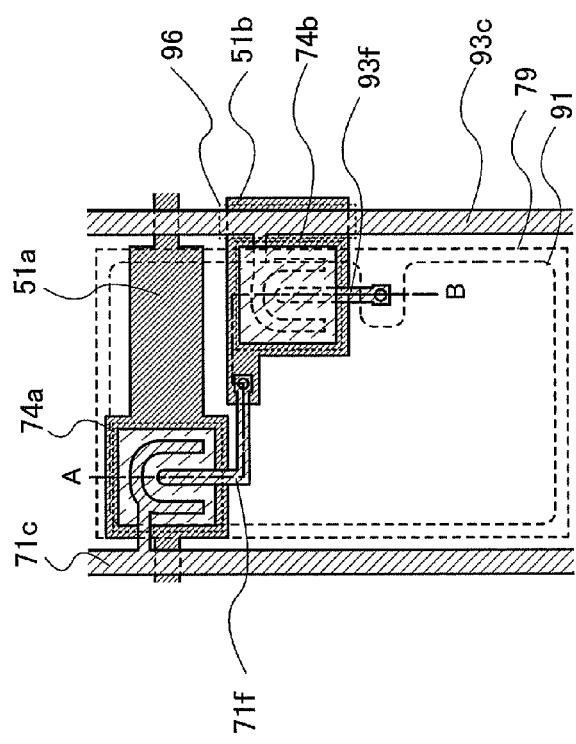
FIG. 35A is a top view and FIG. 35B is a cross-sectional view illustrating a method for manufacturing a display device according to one aspect of the present invention.
Figure 35B:
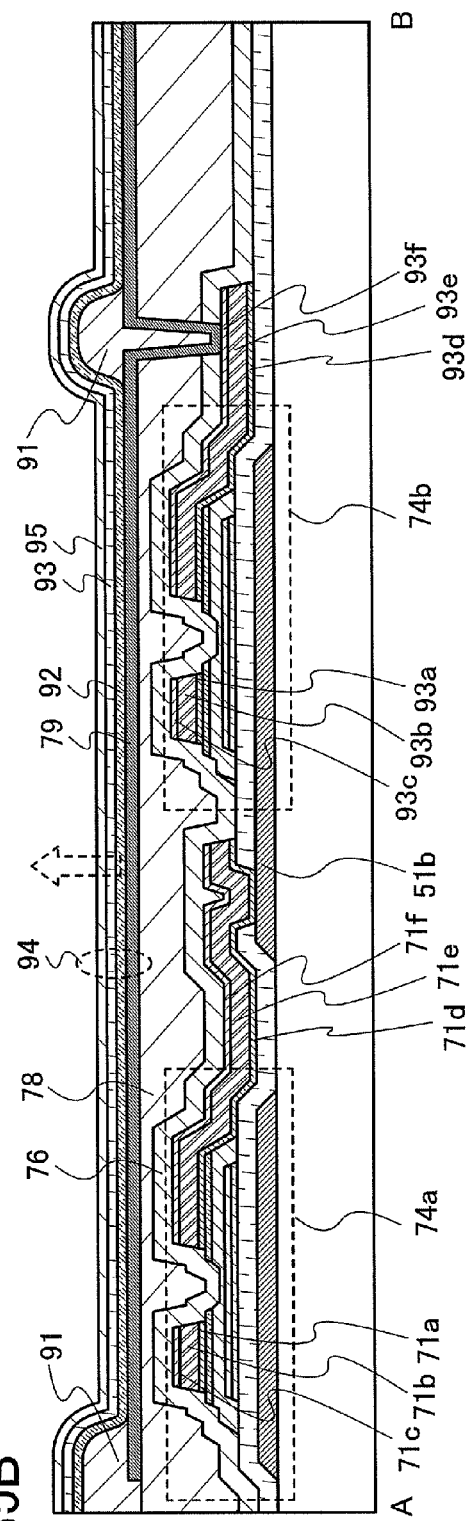

In this embodiment mode, a light-emitting device including the thin film transistor described in any of the above embodiment modes is described below as one mode of a display device, and a structure of a pixel included in the light-emitting device is described. FIG. 35A illustrates one mode of a top view of a pixel. FIG. 35B illustrates one mode of a cross-sectional structure of the pixel along line A-B in FIG. 35A.

A display device including a light-emitting element utilizing electroluminescence is described here as a light-emitting device. Light-emitting elements utilizing electroluminescence are classified according to whether a light-emitting material is an organic compound or an inorganic compound. In general, the former is referred to as an organic EL element, and the latter is referred to as an inorganic EL element. Here, the manufacturing process described in any of the above embodiment modes of the thin film transistor can be used.

In the case of an organic EL element, by applying voltage to a light-emitting element, electrons and holes are injected from a pair of electrodes into a layer including an organic compound with a light-emitting property to cause a current flow. Then, by recombination of these carriers (electrons and holes), the organic compound with a light-emitting property forms an excited state, and light is emitted when the excited state returns to a ground state. Due to such a mechanism, such a light-emitting element is called a current excitation type light-emitting element.

Inorganic EL elements are classified, according to their element structures, into a dispersion type inorganic EL element and a thin-film type inorganic EL element. The dispersion type inorganic EL element has a light-emitting layer in which particles of a light-emitting material are dispersed in a binder. The mechanism of light emission of the dispersion type inorganic EL element is donor acceptor recombination light emission, which utilizes a donor level and an acceptor level. The thin-film type inorganic EL element has a structure in which a light-emitting layer is interposed between dielectric layers and the light-emitting layer interposed between the dielectric layers is further interposed between electrodes and adopts local emission in which inner shell electron transition of a metal ion is utilized. Note that the description is made here using an organic EL element as a light-emitting element. In addition, the description is made using channel-etched thin film transistors as a switching thin film transistor for controlling input of a signal to a first electrode and a driving thin film transistor which controls driving of a light-emitting element, but a channel protective thin film transistor can also be used as appropriate.

In FIGS. 35A and 35B, a first thin film transistor 74a is a switching thin film transistor for controlling input of a signal to a first electrode, and a second thin film transistor 74b is a driving thin film transistor for controlling current or voltage supply to a light-emitting element 94.

A gate electrode 51a of the first thin film transistor 74a is connected to a scanning line, one of a source and a drain is connected to wirings 71a to 71c which serve as signal lines, and the other of the source and the drain is connected to the gate electrode 51b of the second thin film transistor 74b. One of a source and a drain of the second thin film transistor 74b is connected to power source lines 93a to 93c, and the other of the source and the drain is connected to a first electrode 79 of a display device. A gate electrode, a gate insulating film, and the power source line 93a of the second thin film transistor 74b form a capacitor 96, and the other of the source and the drain of the first thin film transistor 74a is connected to the capacitor 96.

The capacitor 96 corresponds to a capacitor for holding voltage between the gate and the source or between the gate and the drain (hereinafter referred to as a gate voltage) of the second thin film transistor 74b when the first thin film transistor 74a is turned off, and is not necessarily provided.

In this embodiment mode, the first thin film transistor 74a and the second thin film transistor 74b can be each formed using the thin film transistor described in any of the above embodiment modes. In addition, although both the first thin film transistor 74a and the second thin film transistor 74b are n-channel thin film transistors here, the first thin film transistor 74a and the second thin film transistor 74b may also be formed using an n-channel thin film transistor and a p-channel thin film transistor, respectively. Further, both the first thin film transistor 74a and the second thin film transistor 74b may be formed using p-channel thin film transistors.

A protective insulating film 76 is formed over the first thin film transistor 74a and the second thin film transistor 74b, and a planarization film 78 is formed over the protective insulating film 76, and then the first electrode 79 is formed to be connected to a wiring 93f in a contact hole formed in the planarization film 78 and the protective insulating film 76. The planarization film 78 is preferably formed using an organic resin such as acrylic, polyimide, or polyamide, or a siloxane polymer. Since the first electrode 79 has a recessed portion in the contact hole, a partition wall 91 having an opening is provided to cover the recessed portion of the first electrode 79. In the opening of the partition wall 91, an EL layer 92 is formed so as to be in contact with the first electrode 79, and a second electrode 93 is formed so as to cover the EL layer 92. A protective insulating film 95 is formed so as to cover the second electrode 93 and the partition wall 91.

Here, a light-emitting element 94 having a top emission structure is described as a light-emitting element. Note that the light-emitting element 94 with a top emission structure can emit light even in the case where it is over the first thin film transistor 74a or the second thin film transistor 74b; thus, a light emission area can be increased. However, if a film under the EL layer 92 is uneven, the thickness is nonuniform due to unevenness, and the second electrode 93 and the first electrode 79 are short-circuited, and a display defect is caused. Therefore, it is preferable to provide the planarization film 78.

The light-emitting element 94 corresponds to a region where the first electrode 79 and the second electrode 93 sandwich the EL layer 92. In the case of the pixel illustrated in FIG. 35B, light from the light-emitting element 94 is emitted to the second electrode 93 side as indicated by an outline arrow.

As the first electrode 79 serving as a cathode, a known conductive film can be used as long as it has a low work function and reflects light. For example, Ca, Al, MgAg, AlLi, or the like is preferably used. The EL layer 92 may be formed using a single layer or by stacking a plurality of layers. When the EL layer 92 is formed using a plurality of layers, an electron-injection layer, an electron-transporting layer, a light-emitting layer, a hole-transporting layer, and a hole-injecting layer are stacked in that order over the first electrode 79 which serves as a cathode. Note that it is not necessary to form all of these layers. The second electrode 93 serving as an anode is formed using a light-transmitting conductive material. For example, a light-transmitting conductive film of indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added may be used.

A light-emitting element having a top emission structure, in which light is extracted from a side opposite to a substrate, is described here; however, a light-emitting element having a bottom emission structure, in which light is extracted from the substrate side, or a light-emitting element having a dual emission structure, in which light is extracted from both the substrate side and the side opposite to the substrate, can also be employed as appropriate.

Although an organic EL element is described here as a light-emitting element, an inorganic EL element can also be provided as a light-emitting element.

Note that in this embodiment mode, an example in which a thin film transistor for controlling the driving of a light-emitting element (a driving thin film transistor) is electrically connected to the light-emitting element is described; however, a thin film transistor for controlling current may be connected between the driving thin film transistor and the light-emitting element.

Through the above process, a light-emitting device can be manufactured. The light-emitting device of this embodiment mode uses inverted staggered thin film transistors with small off-current and excellent electric characteristics, and therefore can have high contrast and high visibility.

(Embodiment Mode 16)

This embodiment mode describes a structure of a display panel, which is one mode of a display device of the present invention.

Figure 36A:
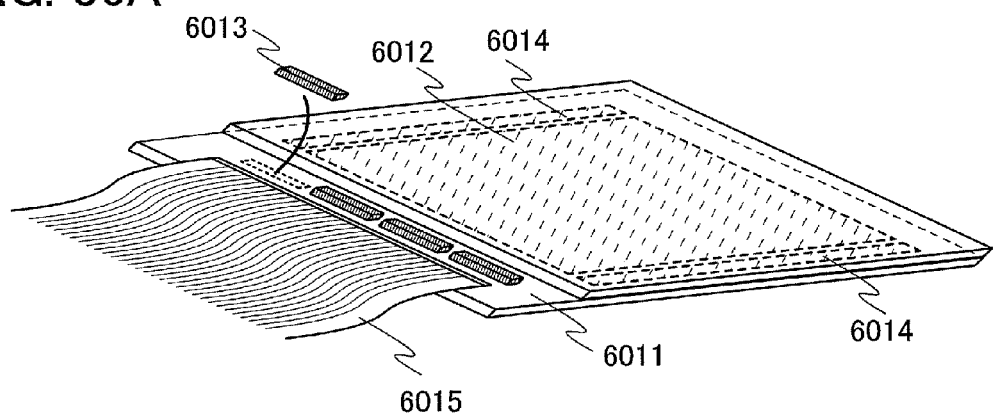
FIGS. 36A to 36C are perspective views illustrating methods for manufacturing a display device according to one aspect of the present invention.

FIG. 36A illustrates a mode of a display panel in which a pixel portion 6012 formed over a substrate 6011 is connected to a signal line driver circuit 6013 that is formed separately. The pixel portion 6012 and a scanning line driver circuit 6014 are each formed using a thin film transistor in which a microcrystalline semiconductor film is used for a channel formation region. By forming the signal line driver circuit using a transistor which has higher field effect mobility than the thin film transistor in which the microcrystalline semiconductor film is used for a channel formation region, an operation of the signal line driver circuit which demands higher driving frequency than the scanning line driver circuit can be stabilized. Note that the signal line driver circuit 6013 may be formed using a transistor in which a single crystal semiconductor is used for a channel formation region, a thin film transistor in which a polycrystalline semiconductor is used for a channel formation region, or a transistor in which SOI is used for a channel formation region. The pixel portion 6012, the signal line driver circuit 6013, and the scanning line driver circuit 6014 are each supplied with potential of a power source, a variety of signals, and the like through an FPC 6015. Further, a protection circuit may be provided between the signal line driver circuit 6013 and the FPC 6015 or between the signal line driver circuit 6013 and the pixel portion 6012. The protection circuit includes one or more elements selected from a thin film transistor, a diode, a resistor, a capacitor, and the like.

Note that both the signal line driver circuit and the scanning line driver circuit may be formed over the same substrate as the pixel portion.

Figure 36B:
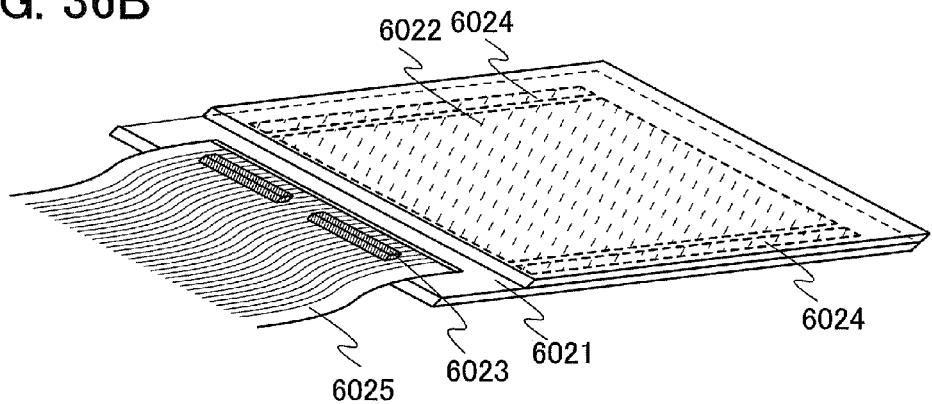

Also, when a driver circuit is separately formed, a substrate provided with the driver circuit is not always required to be attached to a substrate provided with a pixel portion, and may be attached to, for example, an FPC. FIG. 36B illustrates a mode of a display panel in which a signal line driver circuit 6023 is formed separately and is connected to a pixel portion 6022 and a scanning line driver circuit 6024 that are faulted over a substrate 6021. The pixel portion 6022 and the scanning line driver circuit 6024 are each formed using a thin film transistor in which a microcrystalline semiconductor film is used for a channel formation region. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025. Further, a protection circuit may be provided between the signal line driver circuit 6023 and the FPC 6025 or between the signal line driver circuit 6023 and the pixel portion 6022.

Figure 36C:
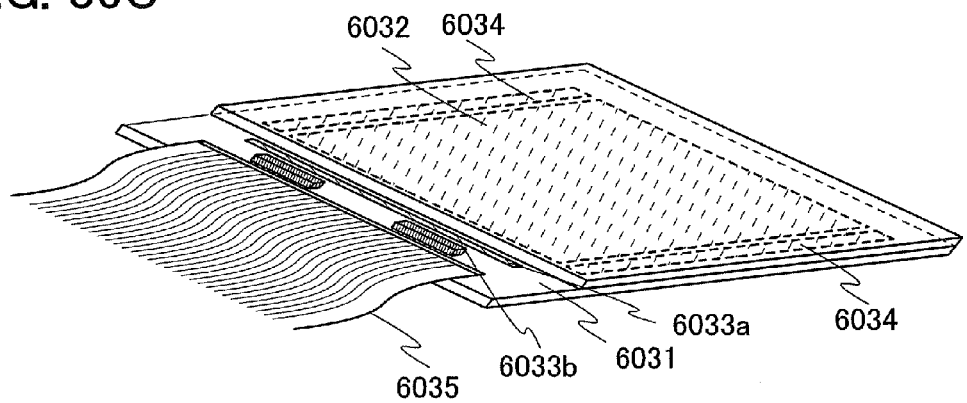

Furthermore, only a part of the signal line driver circuit or only a part of the scanning line driver circuit may be formed over the same substrate as the pixel portion with use of a thin film transistor in which a microcrystalline semiconductor film is used for a channel formation region, and the rest may be formed separately and electrically connected to the pixel portion. FIG. 36C illustrates a mode of a display panel in which an analog switch 6033a included in the signal driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are each formed using a thin film transistor in which a microcrystalline semiconductor film is used for a channel formation region. The shift register 6033b included in the signal line driver circuit is connected to the pixel portion 6032 through an FPC 6035. The pixel portion 6032, the signal line driver circuit, and the scanning line driver circuit 6034 are each supplied with a potential of a power source, a variety of signals, and the like through the FPC 6035. Further, a protection circuit may be provided between the signal line driver circuit 6033 and the FPC 6035 or between the signal line driver circuit 6033 and the pixel portion 6032.

As illustrated in FIGS. 36A to 36C, in the display device of this embodiment mode, an entire driver circuit or a part thereof can be formed over the same substrate as a pixel portion, using a thin film transistor in which a microcrystalline semiconductor films is used for a channel formation region.

Note that there is no particular limitation on a connection method of the substrate which is formed separately, and a known method such as a COG method, a wire bonding method, or a TAB method can be used. Further, a connection position is not limited to the position illustrated in FIGS. 36A to 36C, as long as electrical connection is possible. Alternatively, a controller, a CPU, a memory, and/or the like may be formed separately and connected.

Note that the signal line driver circuit used in the present invention includes a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

(Embodiment Mode 17)

The display device and the like obtained by the present invention can be used for an active matrix display panel. That is, the present invention can be applied to all electronic devices in which the display panel is incorporated into a display portion.

Examples of such electronic devices include cameras such as video cameras and digital cameras, head-mounted displays (goggle-type displays), car navigation systems, projectors, car stereo sets, personal computers, and portable information terminals (e.g., mobile computers, cellular phones, and e-book readers). Examples of these devices are illustrated in FIGS. 37A to 37D.

Figure 37A:
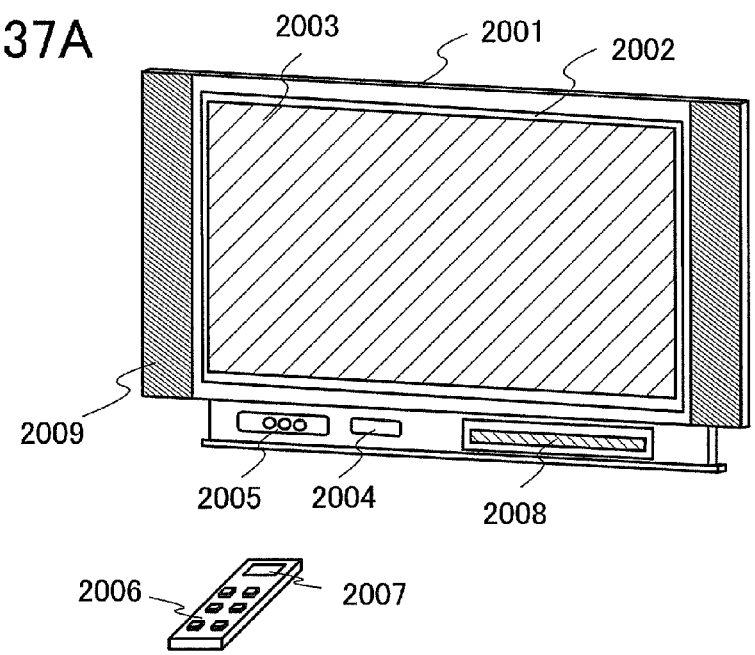
FIGS. 37A to 37D are perspective views each illustrating an electronic device using a display device according to one aspect of the present invention.

FIG. 37A illustrates a television device. A television device can be completed by incorporation of a display panel into a chassis as illustrated in FIG. 37A. A main screen 2003 is formed using the display panel, and a speaker portion 2009, operation switches, and the like are provided as other additional accessories. In such a manner, a television device can be completed.

As illustrated in FIG. 37A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. The television device can be operated with switches that are incorporated into the chassis or by a remote control device 2006 provided separately. The remote control device 2006 may be provided with a display portion 2007 that displays information to be output.

Further, the television device may include a sub-screen 2008 formed using a second display panel for displaying channels, sound volume, or the like, in addition to the main screen 2003. In this structure, the main screen 2003 may be formed with a liquid crystal display panel, and the sub-screen 2008 may be formed with a light-emitting display panel. In addition, the main screen 2003 and the sub-screen 2008 may be each formed with a light-emitting display panel and the sub-screen may blink.

Figure 38:
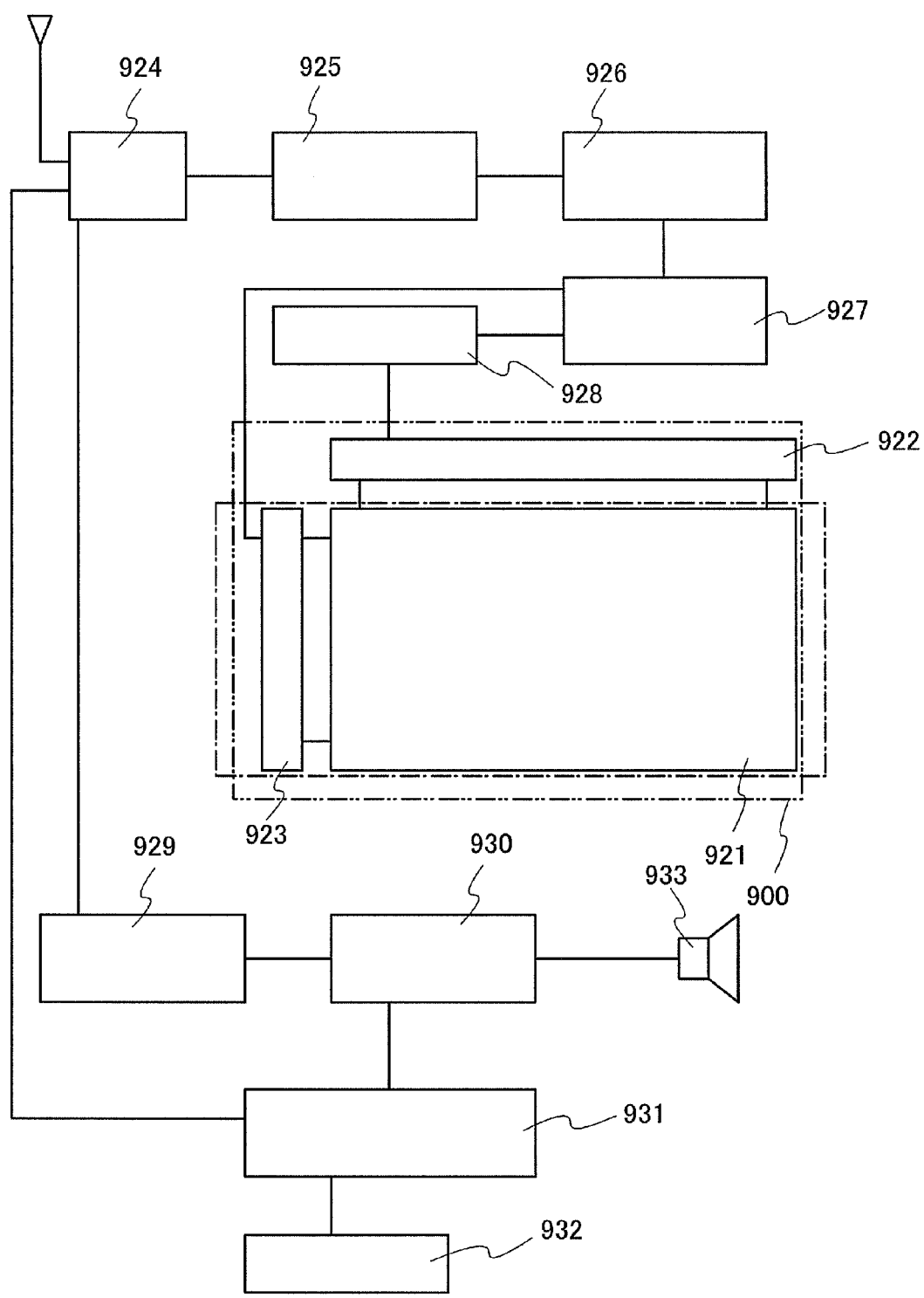
FIG. 38 is a block diagram illustrating an electronic device using a display device according to one aspect of the present invention.

FIG. 38 illustrates a block diagram illustrating the main structure of a television device. A display panel 900 is provided with a pixel portion 921. A signal line driver circuit 922 and a scanning line driver circuit 923 may be mounted on the display panel 900 by a COG method.

As structures of other external circuits; a video signal amplifier circuit 925 amplifying a video signal among signals received by a tuner 924; a video signal processing circuit 926 converting signals output from the video signal amplifier circuit 925 into chrominance signals corresponding to red, green, and blue; a control circuit 927 for converting the video signal into a signal which meets input specifications of a driver IC; and the like are provided on an input side of the video signal. The control circuit 927 outputs signals to the scanning line side and the signal line side. When digital driving is performed, a structure may be adopted in which a signal dividing circuit 928 is provided on the signal line side and an input digital signal is divided into in signals to be supplied.

An audio signal among signals received by the tuner 924 is transmitted to an audio signal amplifier circuit 929, and output from the audio signal amplifier circuit 929 is supplied to a speaker 933 through an audio signal processing circuit 930. A control circuit 931 receives control information on receiving station (receiving frequency) and sound volume from an input portion 932 and transmits a signal to the tuner 924 and the audio signal processing circuit 930.

Needless to say, the present invention is not limited to a television device and can be applied to a variety of uses, such as a monitor of a personal computer, a large display medium such as an information display board at the train station, the airport, or the like, or an advertisement display board on the street.

The display device described in any of the above embodiment modes is applied to the main screen 2003 and the sub-screen 2008, so that mass productivity of the television device with improved image quality such as contrast can be improved.

Figure 37B:
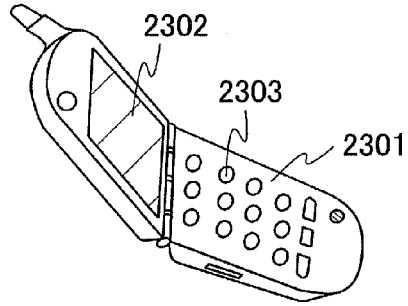

FIG. 37B illustrates one mode of a cellular phone 2301. The cellular phone 2301 includes a display portion 2302, an operation portion 2303, and the like. The display device described in any of the above embodiment modes is applied to the display portion 2302, so that mass productivity of the cellular phone with improved image quality such as contrast can be improved.

Figure 37C:
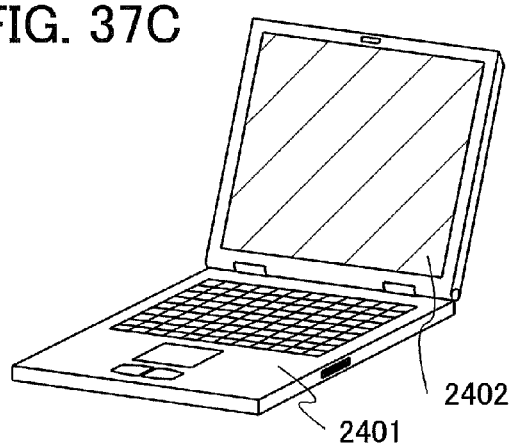

A portable computer illustrated in FIG. 37C includes a main body 2401, a display portion 2402, and the like. The display device described in any of the above embodiment modes is applied to the display portion 2402, so that mass productivity of the computer with improved image quality such as contrast can be improved.

Figure 37D:
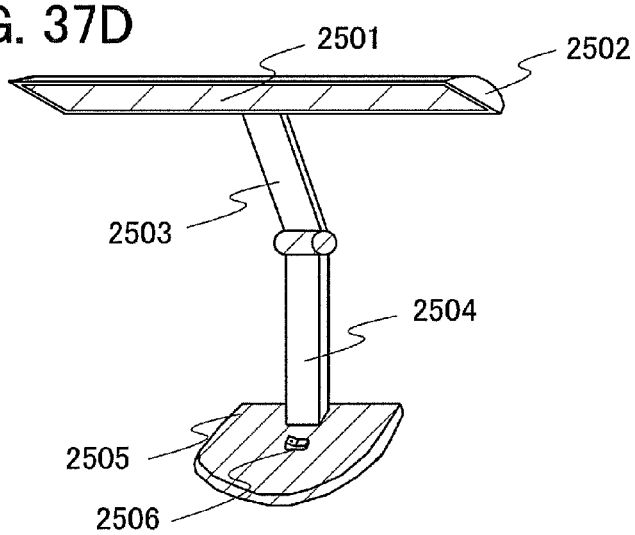

FIG. 37D illustrates a desk lamp including a lighting portion 2501, a shade 2502, an adjustable arm 2503, a support 2504, a base 2505, and a power source switch 2506. The desk lamp is manufactured with use of the light-emitting device of the present invention for the lighting portion 2501. Note that the lighting equipment includes a ceiling light, a wall light, and the like. When the display device described in any of the above embodiment modes is employed, mass productivity can be improved and an inexpensive desk lighting appliance can be provided.

Figure 39A:
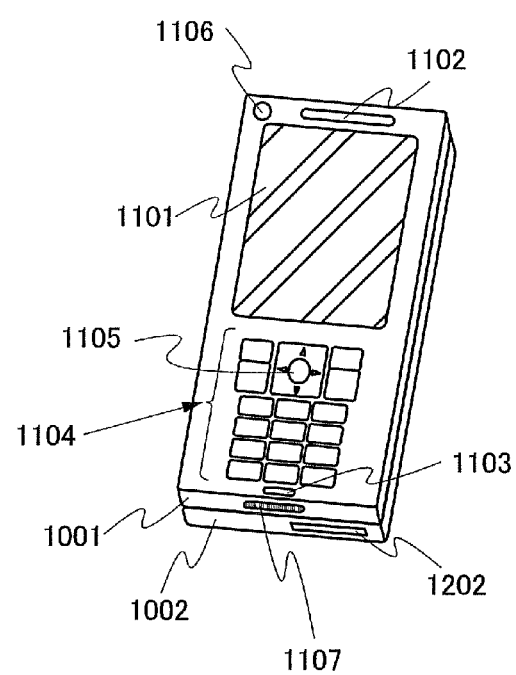
FIGS. 39A to 39C are perspective views illustrating an electronic device using a display device according to one aspect of the present invention.
Figure 39B:
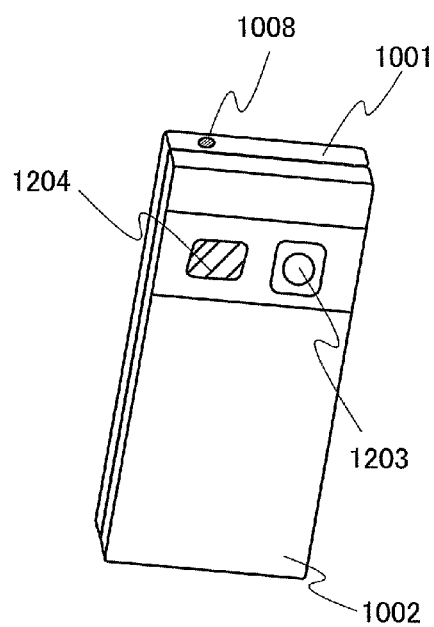
Figure 39C:
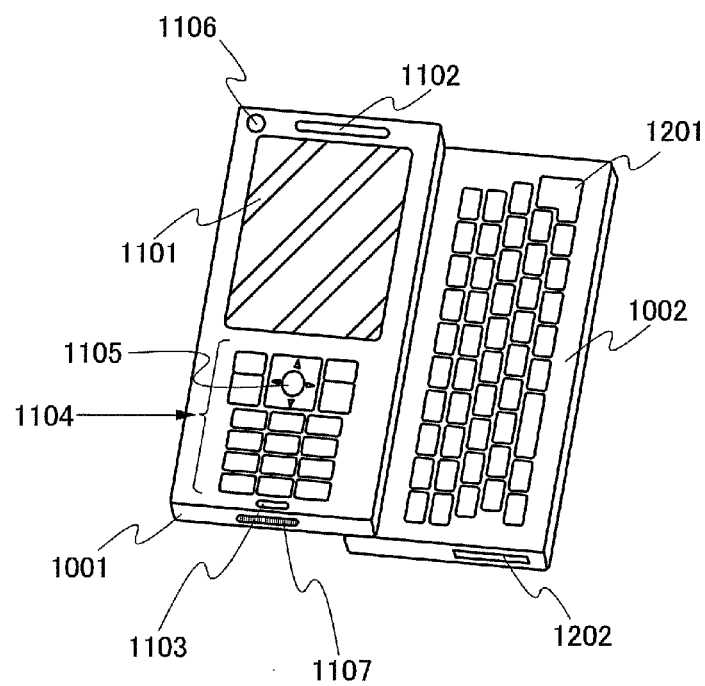

FIGS. 39A to 39C illustrate an example of a structure of a smartphone to which the present invention is applied. FIG. 39A is a front view, FIG. 39B is a rear view, and FIG. 39C is a development view. The smartphone has two chassis 1001 and 1002. The smartphone is a so-called smartphone which has both functions of a cellular phone and a portable information terminal, and incorporates a computer and can process a variety of data processing in addition to voice calls.

The smartphone has the two chassis 1001 and 1002. The chassis 1001 includes a display portion 1101, a speaker 1102, a microphone 1103, operation keys 1104, a pointing device 1105, a front camera lens 1106, an external connection terminal jack 1107, an earphone terminal 1008, and the like, while the chassis 1002 includes a keyboard 1201, an external memory slot 1202, a rear camera 1203, a light 1204, and the like. In addition, an antenna is incorporated in the chassis 1001.

Further, in addition to the above structure, the smartphone may incorporate a non-contact IC chip, a small size memory device, or the like.

The chassis 1001 and the chassis 1002 which are put together to be lapped with each other (see FIG. 39A) are slid to expose the chassis 1002 as illustrated in FIG. 39C. In the display portion 1101, the display device described in any of the above embodiment modes can be incorporated, and a display orientation can be changed as appropriate according to a usage pattern. Because the front camera lens 1106 is provided in the same plane as the display portion 1101, the smartphone can be used as a videophone. Further, a still image and a moving image can be taken with the rear camera 1203 and the light 1204 using the display portion 1101 as a viewfinder.

The speaker 1102 and the microphone 1103 can be used for video calls, recording and playing sound, and the like without being limited to voice calls. With the operation keys 1104, making and receiving calls, inputting simple information such as e-mails or the like, scrolling the screen, moving the cursor, and the like are possible.

If much information is needed to be treated, such as the case in which the smartphone is used for documentation or used as a portable information terminal, the use of the keyboard 1201 is convenient. When the chassis 1001 and the chassis 1002 which are put together to be lapped with each other (FIG. 39A) are slid as illustrated in FIG. 39C so that the smartphone is used as a portable information terminal, smooth operation can be conducted by using the keyboard 1201 and the pointing device 1105. To the external connection terminal jack 1107, an AC adaptor and various types of cables such as a USB cable can be connected, and charging and data communication with a personal computer or the like are possible. Moreover, by inserting a storage medium into the external memory slot 1202, a large amount of data can be stored and moved.

In the rear surface of the chassis 1002 (FIG. 39B), the rear camera 1203 and the light 1204 are provided, and a still image and a moving image can be taken using the display portion 1101 as a viewfinder.

Further, the smartphone may have an infrared communication function, a USB port, a function of receiving one segment television broadcast, a non-contact IC chip, an earphone jack, or the like, in addition to the above-described functions and structures.

By employing the display device described in above embodiment modes, mass productivity of the smartphone can be increased.

This application is based on Japanese Patent Application serial no. 2007-312933 filed with Japan Patent Office on Dec. 3, 2007, and on Japanese Patent Application serial no. 2007-339412 filed with Japan Patent Office on Dec. 28, 2007, the entire contents of which are hereby incorporated by reference.

What is claimed is:

1. A semiconductor device having a thin film transistor comprising:
   a gate electrode over a substrate;
   a gate insulating film over the gate electrode;
   a semiconductor film over the gate insulating film;
   a buffer layer formed over the semiconductor film;
   an insulating film formed so as to cover side surfaces of the semiconductor film and the buffer layer;
   a channel protection film over the buffer layer;
   source and drain regions on the insulating film and the channel protection film, the source and drain regions connected to the buffer layer; and
   source and drain wirings over the source and drain regions, respectively,
   wherein the buffer layer is an amorphous semiconductor film, and
   wherein the source region extends beyond an end portion of the source wiring, and the drain region extends beyond an end portion of the drain wiring.

2. The semiconductor device according to claim 1, wherein the semiconductor film comprises an impurity element serving as a donor.

3. The semiconductor device according to claim 1, wherein the semiconductor film is one selected from the group consisting of an amorphous silicon film, an amorphous silicon germanium film, an amorphous germanium film, a microcrystalline silicon film, a microcrystalline silicon germanium film, a microcrystalline germanium film, a polycrystalline silicon film, a polycrystalline silicon germanium film, and a polycrystalline germanium film.

4. The semiconductor device according to claim 2, wherein the impurity element is any one of phosphorus, arsenic, and antimony.

5. The semiconductor device according to claim 1, wherein a length of the gate electrode is larger than that of the semiconductor film.

6. The semiconductor device according to claim 1, wherein the source and drain regions are connected to the buffer layer through first and second contact holes between the insulating film and the channel protection film.

7. The semiconductor device according to claim 1, wherein each of the side surfaces of the semiconductor film faces to each of the source and drain wirings with the insulating film interposed therebetween.

8. The semiconductor device according to claim 1, wherein the semiconductor device is a display device.

9. A semiconductor device having a thin film transistor comprising:
   a gate electrode over a substrate;
   a gate insulating film over the gate electrode;
   a semiconductor film over the gate insulating film;
   a buffer layer formed over the semiconductor film;
   a first insulating film formed so as to cover side surfaces of the semiconductor film and the buffer layer;
   a channel protection film over the buffer layer;
   source and drain regions on the first insulating film and the channel protection film, the source and drain regions connected to the buffer layer;
   source and drain wirings over the source and drain regions, respectively;
   a second insulating, film over the source and drain wirings; and
   an electrode connected to one of the source and drain wirings through a contact hole in the second insulating film,
   wherein the buffer layer is an amorphous semiconductor film, and
   wherein the source region extends beyond an end portion of the source wiring, and the drain region extends beyond an end portion of the drain wiring.

10. The semiconductor device according to claim 9, wherein the semiconductor film comprises an impurity element serving as a donor.

11. The semiconductor device according to claim 9, wherein the semiconductor film is one selected from the group consisting of an amorphous silicon film, an amorphous silicon germanium film, an amorphous germanium film, a microcrystalline silicon film, a microcrystalline silicon germanium film, a microcrystalline germanium film, a polycrystalline silicon film, a polycrystalline silicon germanium film, and a polycrystalline germanium film.

12. The semiconductor device according to claim 10, wherein the impurity element is any one of phosphorus, arsenic, and antimony.

13. The semiconductor device according to claim 9, wherein a length of the gate electrode is larger than that of the semiconductor film.

14. The semiconductor device according to claim 9, wherein the source and drain regions are connected to the buffer layer through first and second contact holes between the first insulating film and the channel protection film.

15. The semiconductor device according to claim 9, wherein each of the side surfaces of the semiconductor film faces to one of the source and drain wirings with the first insulating film interposed therebetween.

16. The semiconductor device according to claim 9, wherein the semiconductor device is a display device.

17. A semiconductor device having a thin film transistor comprising:
   a gate electrode over a substrate;
   a gate insulating film over the gate electrode;
   a semiconductor film over the gate insulating film;
   a buffer layer formed over the semiconductor film;
   an insulating film formed so as to cover side surfaces of the semiconductor film and the buffer layer;
   source and drain regions on the insulating film, the source and drain regions connected to the buffer layer through contact holes of the insulating film, respectively; and
   source and drain wirings over the source and drain regions, respectively,
   wherein the buffer layer is an amorphous semiconductor film, and
   wherein the source region extends beyond an end portion of the source wiring, and the drain region extends beyond an end portion of the drain wiring.

18. The semiconductor device according to claim 17, wherein the semiconductor film comprises an impurity element serving as a donor.

19. The semiconductor device according to claim 17, wherein the semiconductor film is one selected from the group consisting of an amorphous silicon film, an amorphous silicon germanium film, an amorphous germanium film, a microcrystalline silicon film, a microcrystalline silicon germanium film, a microcrystalline germanium film, a polycrystalline silicon film, a polycrystalline silicon germanium film, and a polycrystalline germanium film.

20. The semiconductor device according to claim 18, wherein the impurity element is any one of phosphorus, arsenic, and antimony.

21. The semiconductor device according to claim 17, wherein a length of the gate electrode is larger than that of the semiconductor film.

22. The semiconductor device according to claim 17, wherein each of the side surfaces of the semiconductor film faces to each of the source and drain wirings with the insulating film interposed therebetween.

23. The semiconductor device according to claim 17, wherein the semiconductor device is a display device.

24. A semiconductor device having a thin film transistor comprising:
- a gate electrode over a substrate;
- a gate insulating film over the gate electrode;
- a semiconductor film over the gate insulating film;
- a buffer layer formed over the semiconductor film;
- a first insulating film formed so as to cover side surfaces of the semiconductor film and the buffer layer;
- source and drain regions on the first insulating film, the source and drain regions connected to the buffer layer through first contact holes of the first insulating film, respectively;
- source and drain wirings over the source and drain regions, respectively;
- a second insulating film over the source and drain wirings; and
- an electrode connected to one of the source and drain wirings through a second contact hole in the second insulating film,
- wherein the buffer layer is an amorphous semiconductor film, and
- wherein the source region extends beyond an end portion of the source wiring, and the drain region extends beyond an end portion of the drain wiring.

25. The semiconductor device according to claim 24, wherein the semiconductor film comprises an impurity element serving as a donor.

26. The semiconductor device according to claim 24, wherein the semiconductor film is one selected from the group consisting of an amorphous silicon film, an amorphous silicon germanium film, an amorphous germanium film, a microcrystalline silicon film, a microcrystalline silicon germanium film, a microcrystalline germanium film, a polycrystalline silicon film, a polycrystalline silicon germanium film, and a polycrystalline germanium film.

27. The semiconductor device according to claim 25, wherein the impurity element is any one of phosphorus, arsenic, and antimony.

28. The semiconductor device according to claim 24, wherein a length of the gate electrode is larger than that of the semiconductor film.

29. The semiconductor device according to claim 24, wherein each of the side surfaces of the semiconductor film faces to one of the source and drain wirings with the first insulating film interposed therebetween.

30. The semiconductor device according to claim 24, wherein the semiconductor device is a display device.

* * * * *

UNITED STATES PATENT AND TRADEMARK OFFICE
CERTIFICATE OF CORRECTION

PATENT NO.        : 8,558,236 B2                                  Page 1 of 1
APPLICATION NO.   : 13/196926
DATED             : October 15, 2013
INVENTOR(S)       : Shunpei Yamazaki et al.

It is certified that error appears in the above-identified patent and that said Letters Patent is hereby corrected as shown below:

In the Specifications

At column 3, line 59, "foamed" should be --formed--;

At column 9, line 46, "2950 min" should be --2950 mm--;

At column 10, line 54, "fanned" should be --formed--;

At column 11, line 22, "fanned" should be --formed--;

At column 13, line 63, "Fig. 9A," should be --Fig. 9A.--;

At column 23, line 38, "faun" should be --form--;

At column 23, line 62, "rt-electron" should be --π-electron--;

At column 27, line 18, "in. Embodiment" should be --in Embodiment--;

At column 34, line 15, "fond" should be --form--;

At column 39, line 32, "By fanning" should be --By forming--;

At column 42, line 23, "fond" should be --form--;

At column 47, line 31, "faulted" should be --formed--; and

At column 49, line 18, "into in signals" should be --into m signals--.

Signed and Sealed this
Eleventh Day of March, 2014

Michelle K. Lee
*Deputy Director of the United States Patent and Trademark Office*